US007968276B2

(12) United States Patent
Takeshita

(10) Patent No.: US 7,968,276 B2
(45) Date of Patent: Jun. 28, 2011

(54) POSITIVE RESIST COMPOSITION AND METHOD OF FORMING RESIST PATTERN

(75) Inventor: Masaru Takeshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 178 days.

(21) Appl. No.: 12/351,759

(22) Filed: Jan. 9, 2009

(65) Prior Publication Data

US 2009/0181325 A1 Jul. 16, 2009

(30) Foreign Application Priority Data

Jan. 15, 2008 (JP) .............................. P2008-006293
Apr. 3, 2008 (JP) .............................. P2008-097432

(51) Int. Cl.
*G03F 7/20* (2006.01)
*G03F 7/30* (2006.01)
*G03F 7/039* (2006.01)

(52) U.S. Cl. .................... 430/326; 430/311; 430/312
(58) Field of Classification Search .................. None
See application file for complete search history.

(56) References Cited

U.S. PATENT DOCUMENTS

| | | | |
|---|---|---|---|
| 5,945,517 | A | 8/1999 | Nitta et al. |
| 6,153,733 | A | 11/2000 | Yukawa et al. |
| 6,319,853 | B1 | 11/2001 | Ishibashi et al. |
| 7,323,287 | B2 | 1/2008 | Iwai et al. |
| 2005/0089796 | A1* | 4/2005 | Funatsu et al. ............. 430/270.1 |
| 2009/0075204 | A1 | 3/2009 | Takeshita et al. |
| 2009/0263741 | A1 | 10/2009 | Hayashi |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2001-215708 * | 8/2001 |
| JP | 2003-241385 | 8/2003 |
| JP | A-2006-106497 | 4/2006 |
| JP | A-2008-003540 | 1/2008 |
| KR | 10-1999-0066776 A | 8/1999 |
| KR | 10-0343697 | 6/2002 |
| WO | WO 2004-074242 | 9/2004 |

OTHER PUBLICATIONS

Machine-assisted English translation of JP2001-215708 as provided by JPO.*
Borodovsky, Yan, Marching to the beat of Moore's Law, Proceedings of SPIE vol. 6153 615301-1 to 615301-19 (2006).
D. Gil et al., "First Microprocessors with Immersion Lithograhy," Optical Microlithography XVIII, Proceedings of SPIE vol. 5754, pp. 119-128 (2005).
Ebihara, Takeaki, Beyond k1=0.25 lithography: 70nm L/S patterning using KrF scanners, Proceedings of SPIE vol. 5256 $23^{rd}$ Annual BACUS Symposium on Photomask Technology, pp. 985 to 994 (2003).

Office Action issued in counterpart Korean Patent Application No. 10-2009-0002183, dated Nov. 4, 2010.
Office Action (Notice of Allowance) issued in counterpart Korean Patent Application No. 10-2010-0137627, dated Feb. 1, 2011.
Office Action (Notice of Allowance) issued in counterpart Korean Patent Application No. 10-2009-0002183, dated Feb. 1, 2011.

* cited by examiner

*Primary Examiner* — Sin J. Lee
(74) *Attorney, Agent, or Firm* — Knobbe, Martens, Olson & Bear, LLP

(57) ABSTRACT

A positive resist composition used to form a second resist film in a method of forming a positive resist pattern, including: applying a positive resist composition on the substrate on which a first resist pattern formed of a first resist film is formed to form a second resist film; and selectively exposing the second resist film and alkali-developing the second resist film to form a resist pattern; wherein
the positive resist composition includes a resin component (A) having a structural unit (a0-1) represented by general formula (a0-1) and a structural unit (a0-2) represented by general formula (a0-2), which exhibits increased solubility in an alkali developing solution under action of acid, an acid-generator component (B) which generates acid upon exposure, and an organic solvent (S) which does not dissolve the first resist film, and the resin component (A) and the acid-generator component (B) are dissolved in the organic solvent (S).

(a0-1)

$$\{CH_2-CR\}$$
$$|$$
$$C(=O)-O-(CH_2)_c-Y^1-[(CH_2)_e-OZ]_a$$
$$|$$
$$(CH_2)_d-OH$$
$$_b$$

(a0-2)

$$\{CH_2-CR\}$$
$$|$$
$$C(=O)-O-(CH_2)_g-Y^3-(CH_2)_h-OH$$
$$_i$$

5 Claims, No Drawings

POSITIVE RESIST COMPOSITION AND METHOD OF FORMING RESIST PATTERN

BACKGROUND OF THE INVENTION

1. Field of the Invention

The present invention relates to a positive resist composition suited for use as a second resist composition in a double patterning process in which a first patterning is performed using a first resist composition and a second patterning is performed using a second resist composition, and a method of forming a resist pattern.

Priority is claimed on Japanese Patent Application No. 2008-006293, filed Jan. 15, 2008, and Japanese Patent Application No. 2008-097432, filed Apr. 3, 2008, the contents of which are incorporated herein by reference.

2. Description of Related Art

A technique of forming a fine pattern on a substrate and processing a lower layer of the fine pattern by performing etching using it as a mask (pattern forming technique) is widely used in the production of ICs of the semiconductor industry and attracts special interest.

The fine pattern is usually composed of an organic material and is formed by techniques, for example, lithography and nanoinprinting techniques. In lithography techniques, for example, a resist film composed of a resist composition containing a base material component such as a resin is formed on a support such as a substrate, and the resist film is subjected to selective exposure of radial rays such as light or an electron beam through a mask having a predetermined pattern (mask pattern), followed by development thereby forming a resist pattern having a predetermined shape on the resist film. Then, a semiconductor element is produced by processing the substrate through etching using the resist pattern as the mask.

A resist composition in which the exposed portions become soluble in a developing solution is called a positive-type, and a resist material in which the exposed portions become insoluble in a developing solution is called a negative-type.

In recent years, advances in lithography techniques have lead to rapid progress in the field of pattern miniaturization. Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. For example, it becomes possible to form patterns at a resolution of 45 nm by lithography techniques using ArF excimer lasers. Furthermore, research is also being conducted into lithography techniques that use an exposure light source having a wavelength shorter than these excimer lasers, such as $F_2$ excimer lasers, electron beams, extreme ultraviolet radiation (EUV), and X rays so as to further improve resolution.

Resist compositions for use with these types of exposure light sources require lithography properties such as a high level of sensitivity to these types of exposure light sources and a high resolution capable of reproducing patterns of minute dimensions. As a resist composition which satisfies these conditions, a chemically amplified resist composition is used, which includes a base material component that exhibits a changed solubility in an alkali developing solution under action of an acid and an acid generator that generates an acid upon exposure (see, for example, Patent Document 1). For example, a chemically amplified positive resist contains, as a base material component, a resin which exhibits increased solubility in an alkali developing solution under action of acid. In the formation of a resist pattern, when an acid is generated from the acid generator upon exposure, the exposed portions become soluble in an alkali developing solution.

Polyhydroxystyrene (PHS) or derivative resins thereof in which the hydroxyl groups are protected with acid-dissociable, dissolution-inhibiting groups (PHS-based resins), which exhibit high transparency to a KrF excimer laser (248 nm) are mainly used as the base resin component of chemically amplified resists. Resins that contain structural units derived from (meth)acrylate esters within the main chain (acrylic resins) are now widely used as base resins for resists (ArFs that use ArF excimer laser lithography, as they exhibit excellent transparency in the vicinity of 193 nm.

As one of techniques for further improvement of resolution, for example, there is known a lithography technique, so-called liquid immersion lithography (hereinafter may be referred to as liquid immersion exposure) in which exposure (immersion exposure) is performed in the presence of a liquid having a higher refractive index than that of air (liquid immersion medium) interposed between an objective lens of a stepper and a sample (see, for example, Non-Patent Document 1).

It is said that the liquid immersion exposure can attain high resolution similar to that attained by using a light source having a shorter wavelength or a high NA lens even when a light source having the same exposure wavelength is used, and also does not cause a decrease in the depth of focus. The liquid immersion exposure can be performed by application of an existing stepper. Therefore, it is expected that the liquid immersion exposure can realize formation of a resist pattern having high resolution and excellent depth of focus at low cost. Also, the liquid immersion exposure has attracted special interest recently as those capable of exerting a great effect on the semiconductor industry in view of cost and lithography characteristics such as resolution in the production of semiconductor elements that requires large equipment investments.

It is considered that the liquid immersion exposure is effective for formation of any pattern shape and also can be used in combination with super-resolution techniques such as phase-shift and modified illumination techniques that are now studied. As the liquid immersion exposure technique, a technique using an ArF excimer laser as a light source is now mainly studied. As the liquid immersion medium, water is mainly studied.

As one of lithography techniques, there is newly proposed a double patterning process in which a resist pattern is formed by performing patterning two or more times (see, for example, Non-Patent Documents 2 and 3).

It is considered that this double patterning process enables formation of a resist pattern having higher resolution than that of a resist pattern formed by single patterning by forming a first resist pattern on a substrate using a first resist composition, and forming a pattern on the substrate, on which the first resist pattern is formed, using a second resist composition.

Patent Document 1: Japanese Unexamined Patent Application, First Publication No. 2003-241385

Non-Patent Document 1: Proceedings of SPIE, Vol. 5754, pp.119-128 (2005)

Non-Patent Document 2: Proceedings of SPIE, Vol. 5256, pp. 985-994 (2003)

Non-Patent Document 3: Proceedings of SPIE, Vol. 6153, pp. 615301-1-19 (2006)

In the double patterning process described above, when the second resist composition is applied, the first resist pattern is likely to be adversely influenced. Therefore, for example, there arise problems that the first resist pattern is partially or entirely dissolved in the solvent of the second resist composition to cause thickness, leading to shape deterioration, and that the first resist pattern and the second resist composition are dissolved in each other to cause so-called mixing, leading to unsatisfactory formation of a resist pattern.

It is considered that these problems can be avoided by using, as the second resist composition, a resist composition dissolved in a solvent in which the first resist pattern is hardly soluble. Therefore, when a positive resist composition is used as the first resist composition, a negative resist composition having high solubility in an organic solvent with low compatibility with the positive resist composition has conventionally been used as the second resist composition. As the organic solvent with low compatibility with the positive resist composition, for example, alcohol-based solvents and ether-based organic solvent having no hydroxyl group have been used.

When the positive resist composition is used as the second resist composition similar to the first resist composition, it is necessary to preliminarily protect the first resist pattern using a freezing agent and thus there is a problem such as poor workability since the number of steps is larger than that in the case of using the negative resist composition. An acrylic resin to be used as a base resin of an ArF positive resist is now often used in the form of a positive resist composition prepared by dissolving it in organic solvents such as propylene glycol monomethyl ether acetate (PGMEA), propylene glycol monomethyl ether (PGME), cyclohexanone, 2-heptanone and lactic acid ethyl lactate (EL) for the following reason. That is, when the positive resist composition is directly applied on the first resist pattern, it dissolves the first resist pattern.

The present invention takes the above circumstances into consideration, with an object of providing a positive resist composition which can be used as a second resist composition in the formation of a resist pattern through double patterning using a positive resist composition as a first resist composition, and a method of forming a resist pattern.

SUMMARY OF THE INVENTION

For solving the above-mentioned problems, the present invention employs the following aspects.

Specifically, a first aspect of the present invention is a positive resist composition including a resin component (A) which exhibits increased solubility in an alkali developing solution under action of acid, an acid-generator component (B) which generates acid upon exposure, and an organic solvent (S), the resin component (A) and the acid-generator component (B) being dissolved in the organic solvent (S), wherein the positive resist composition is a positive resist composition used to form a second resist film in a method of forming a positive resist pattern, including: applying a positive resist composition on a substrate to form a first resist film on the substrate; selectively exposing the first resist film and alkali-developing the first resist film to form a first resist pattern; applying the positive resist composition on the substrate on which the first resist pattern is formed to form a second resist film; and selectively exposing the second resist film and alkali-developing the second resist film to form a resist pattern; and the organic solvent (S) is an organic solvent which does not dissolve the first resist film; and the resin component (A) has a structural unit (a0-1) represented by general formula (a0-1) shown below and a structural unit (a0-2) represented by general formula (a0-2) shown below.

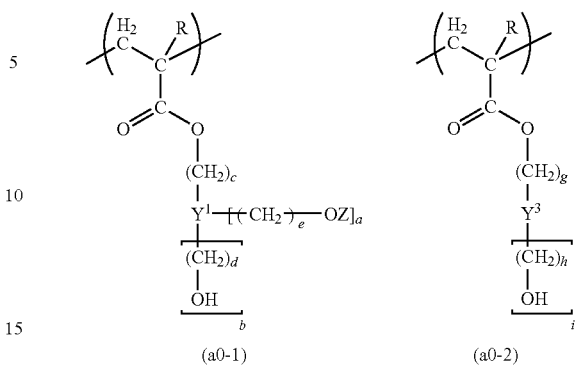

[Chemical Formula 1]

In formula (a0-1), R represents a hydrogen atom, a lower alkyl group or a halogenated lower alkyl group; $Y^1$ represents an aliphatic cyclic group; Z represents a tertiary alkyl group-containing group or an alkoxyalkyl group; a represents an integer of 1 to 3; b represents an integer of 0 to 2 and a+b=1 to 3; c, d and e each independently represents an integer of 0 to 3; and, in formula (a0-2), R represents a hydrogen atom, a lower alkyl group or a halogenated lower alkyl group; $Y^3$ represents an alkylene group or an aliphatic cyclic group; g and h each independently represents an integer of 0 to 3; and i represents an integer of 1 to 3.

A second aspect of the present invention is a method of forming a resist pattern, including: applying a positive resist composition on a substrate to form a first resist film on the substrate; selectively exposing the first resist film and alkali-developing the first resist film to form a first resist pattern; applying the positive resist composition on the substrate on which the first resist pattern is formed to form a second resist film; and selectively exposing the second resist film and alkali-developing the second resist film to form a resist pattern.

In the present description and the claims, "structural unit" refers to a monomer unit that constitutes a resin component (polymer, copolymer).

The term "alkyl group" includes a linear, branched or cyclic monovalent saturated hydrocarbon group unless otherwise specified.

The term "aliphatic" is a relative concept used in relation to the term "aromatic", and defines a group or compound that has no aromaticity The term "exposure" is used as a general concept that includes irradiation with any form of radiation.

The term "(meth)acrylic acid" includes either or both of an acrylic acid having a hydrogen atom bonded to the α-position and a methacrylic acid having a methyl group bonded to the α-position.

The term "(meth)acrylate ester" includes either or both of an acrylate ester having a hydrogen atom bonded to the α-position and a (meth)acrylate ester having a methyl group bonded to the α-position.

The term "(meth)acrylate" includes either or both of an acrylate having a hydrogen atom bonded to the α-position and a (meth)acrylate having a methyl group bonded to the α-position.

According to the present invention, there is provided a positive resist composition, which can form a resist pattern through double patterning without dissolving a first resist pattern formed using a first resist composition in a double patterning process in which first patterning is performed using a first resist composition and second patterning is performed using a second resist composition, and a method of forming a resist pattern.

DETAILED DESCRIPTION OF THE INVENTION

<<Positive Resist Composition>>

The positive resist composition of the present invention is used to form a second resist film in a method of forming a resist pattern, including: applying a positive resist composition on a substrate to form a first resist film on the substrate; selectively exposing the first resist film and alkali-developing the first resist film to form a first resist pattern; applying the positive resist composition on the substrate on which the first resist pattern is formed to form a second resist film; and selectively exposing the second resist film and alkali-developing the second resist film to form a resist pattern.

The explanation of each step in this method of forming a resist pattern is the same as that of each step in a method of forming a resist pattern described hereinafter of the present invention.

The positive resist composition of the present invention includes a resin component (A) which exhibits increased solubility in an alkali developing solution under action of an acid (hereinafter referred to as the component (A)), an acid-generator component (B) which generates an acid upon exposure (hereinafter referred to as the component (B)), and an organic solvent (S), the resin component (A) and the acid generator component (B) being dissolved in the organic solvent (S), the organic solvent (S) being an organic solvent which does not dissolve the first resist film, the resin component (A) having a structural unit (a0-1) represented by general formula (a0-1) shown above and a structural unit (a0-2) represented by general formula (a0-2) shown above.

In the positive resist composition of the present invention, the component (A) is insoluble in an alkali developing solution prior to exposure. When acid generated from the component (B) upon exposure is reacted with the component (A), an acid dissociable, dissolution inhibiting group is dissociated thereby increasing the solubility of the entire component (A) in an alkali developing solution, and thus the component (A) changes from an insoluble state to a soluble state in the alkali developing solution. Therefore, in the formation of a resist pattern, by conducting selective exposure of a resist film formed using the negative resist composition, the exposed portions become insoluble in an alkali developing solution, whereas the unexposed portions remain soluble in an alkali developing solution, and hence, a resist pattern can be formed by alkali developing.

<Component (A)>

In the present invention, the component (A) has a structural unit (a0-1) represented by general formula (a0-1) and a structural unit (a0-2) represented by general formula (a0-2).

Both of the structural unit (a0-1) and the structural unit (a0-2) are structural units derived from an acrylate ester.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a lower alkyl group or a halogenated lower alkyl group can be mentioned.

With respect to the "structural unit derived from an acrylate ester", the "α-position (the carbon atom on the α-position)" refers to the carbon atom having the carbonyl group bonded thereto, unless specified otherwise.

The "alkyl group" includes linear, branched and cyclic monovalent saturated hydrocarbon groups unless specified otherwise.

The "lower alkyl group" is an alkyl group of 1 to 5 carbon atoms.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

The halogenated lower alkyl group for the substituent at the α-position is a group in which hydrogen atoms of the lower alkyl group are partially or completely substituted with halogen atoms. Examples of the halogen atom include a fluorine atom, a chlorine atom, a bromine atom and an iodine atom. Of these, a fluorine atom is particularly preferred.

In the present invention, it is preferable that a hydrogen atom, a lower alkyl group or a halogenated lower alkyl group is bonded to the α-position of the acrylate ester, more preferably a hydrogen atom, a lower alkyl group or a fluorinated lower alkyl group. In terms of industrial availability, a hydrogen atom or a methyl group is particularly desirable.

Structural Unit (a0-1)

In general formula (a0-1), R is a hydrogen atom, a lower alkyl group or a halogenated lower alkyl group.

The lower alkyl group or halogenated lower alkyl group for R is the same as the lower alkyl group or halogenated lower alkyl group which may be bonded to the α-position of the acrylate ester. R is preferably a hydrogen atom or a methyl group.

In general formula (a0-1), $Y^1$ is an aliphatic cyclic group.

In the present description and the claims, the term "aliphatic cyclic group" refers to a monocyclic or polycyclic group having no aromaticity.

The "aliphatic cyclic group" in the structural unit (a0-1) may or may not have a substituent. Examples of the substituent include a lower alkyl group of 1 to 5 carbon atoms, a fluorine atom, a fluorinated lower alkyl group of 1 to 5 carbon atoms which is substituted with a fluorine atom, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either a saturated or an unsaturated group, but is preferably a saturated group.

The aliphatic cyclic group may be either a polycyclic group or a monocyclic group. Examples of the aliphatic cyclic group include groups in which two or more hydrogen atoms have been removed from a monocycloalkane or a polycycloalkane such as a bicycloalkane, tricycloalkane or tetracycloalkane, and which may or may not be substituted with lower alkyl groups, fluorine atoms or fluorinated alkyl groups. Specific examples thereof include groups in which two or more hydrogen atoms have been removed from a monocycloalkane such as a cyclopentane or cyclohexane or a polycycloalkane such as an adamantane, norbornane, isobornane, tricyclodecane or tetracyclododecane.

The aliphatic cyclic group in the structural unit (a0-1) is preferably a polycyclic group, and is particularly preferably a group in which two or more hydrogen atoms have been removed from an adamantane.

In general formula (a0-1), Z is a tertiary alkyl group-containing group or an alkoxyalkyl group.

In the present description and the claims, the term "tertiary alkyl group" refers to an alkyl group containing a tertiary carbon atom. As, described above, the term "alkyl group" refers to a monovalent saturated hydrocarbon group and includes a chain (linear or branched) alkyl group and an alkyl group having a cyclic structure.

The term "tertiary alkyl group-containing group" refers to a group having a structure containing a tertiary alkyl group. The tertiary alkyl group-containing group may be constituted of only tertiary alkyl groups, or may be constituted of tertiary alkyl groups and atoms or groups other than tertiary alkyl groups.

Examples of the "atoms or groups other than tertiary alkyl groups" constituting the tertiary alkyl group-containing group together with the tertiary alkyl group include a carbonyloxy group, a carbonyl group, an alkylene group and an oxygen atom.

Examples of the tertiary alkyl group-containing group for Z include a tertiary alkyl group-containing group containing no cyclic structure and a tertiary alkyl group-containing group containing a cyclic structure.

The tertiary alkyl group-containing group containing no cyclic structure is a group which contains a branched tertiary alkyl group as the tertiary alkyl group, and also has no cyclic structure in the structure.

The branched tertiary alkyl group includes, for example, a group represented by general formula (I) shown below.

[Chemical Formula 2]

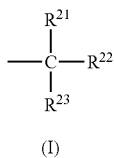

(I)

In general formula (I), $R^{21}$ to $R^{23}$ each independently represents a linear or branched alkyl group. The alkyl group preferably has 1 to 5 carbon atoms, and more preferably 1 to 3 carbon atoms.

The group represented by general formula (I) has preferably 4 to 7 carbon atoms in total, more preferably 4 to 6 carbon atoms in total, and most preferably 4 to 5 carbon atoms in total.

The group represented by general formula (I) is preferably a tert-butyl group or a tert-pentyl group, and more preferably a tert-butyl group.

Examples of the tertiary alkyl group-containing group having no cyclic structure include the above-mentioned branched tertiary alkyl group; a tertiary alkyl group-containing chain alkyl group in which the above-mentioned branched tertiary alkyl group is bonded to a linear or branched alkylene group; a tertiary alkyloxycarbonyl group containing a branched tertiary alkyl group as the tertiary alkyl group; and a tertiary alkyloxycarbonylalkyl group containing the above-mentioned branched tertiary alkyl group as the tertiary alkyl group.

The alkylene group in the tertiary alkyl group-containing chain alkyl group is preferably an alkylene group of 1 to 5 carbon atoms, more preferably an alkylene group of 1 to 4 carbon atoms, and still more preferably an alkylene group of 1 to 2 carbon atoms.

The chain tertiary alkyloxycarbonyl group includes, for example, a group represented by general formula (II) shown below. $R^{21}$ to $R^{23}$ in general formula (II) are the same as $R^{21}$ to $R^{23}$ in formula (I). The chain tertiary alkyloxycarbonyl group is preferably a tert-butyloxycarbonyl group (t-boc) or a tert-pentyloxycarbonyl group.

[Chemical Formula 3]

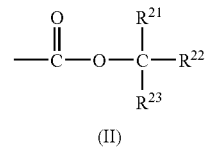

(II)

The chain tertiary alkyloxycarbonylalkyl group includes, for example, a group represented by general formula (III) shown below. $R^{21}$ to $R^{23}$ in general formula (III) are the same as $R^{21}$ to $R^{23}$ in formula (I). f in general formula (III) is an integer of 1 to 3, and preferably 1 or 2. The chain tertiary alkyloxycarbonylalkyl group is preferably a tert-butyloxycarbonylmethyl group or a tert-butyloxycarbonylethyl group.

Of these, the tertiary alkyl group-containing group having no cyclic structure is preferably a tertiary alkyloxycarbonyl group or a tertiary alkyloxycarbonylalkyl group, more preferably a tertiary alkyloxycarbonyl group, and most preferably a tert-butyloxycarbonyl group.

[Chemical Formula 4]

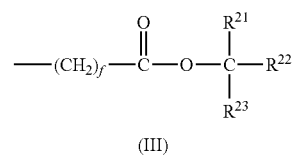

(III)

The tertiary alkyl group-containing group having a cyclic structure is a group containing a tertiary carbon atom and a cyclic structure in the structure.

In the tertiary alkyl group-containing group having a cyclic structure, the number of carbon atoms constituting the ring of the cyclic structure is preferably 4 to 12, more preferably 5 to 10, and most preferably 6 to 10. Examples of the cyclic structure include groups in which one or more hydrogen atoms have been removed from a monocycloalkane or a polycycloalkane such as a bicycloalkane, tricycloalkane or tetracycloalkane. Groups are preferably groups in which one or more hydrogen atoms have been removed from a monocycloalkane such as a cyclopentane or cyclohexane or a polycycloalkane such as an adamantane, norbornane, isobornane, tricyclodecane or tetracyclododecane.

Examples of the tertiary alkyl group-containing group having a cyclic structure include groups containing, as the tertiary alkyl group, a group of (1) or (2) described below:

(1) a group in which a linear or branched alkyl group is bonded to carbon atoms constituting the ring of a cyclic alkyl group (cycloalkyl group) and the carbon atoms are converted into tertiary carbon atoms, or
(2) a group in which an alkylene group (branched alkylene group) having tertiary carbon atoms is bonded to carbon atoms constituting the ring of a cycloalkyl group.

The linear or branched alkyl group in the group of (1) preferably has 1 to 5 carbon atoms, more preferably 1 to 4 carbon atoms, and most preferably 1 to 3 carbon atoms.

Examples of the group of (1) include a 2-methyl-2-adamantyl group, a 2-ethyl-2-adamantyl group, a 1-methyl-1-cycloalkyl group and a 1-ethyl-1-cycloalkyl group.

In (2), the cycloalkyl group, to which a branched alkylene group is bonded, may have a substituent. The substituent includes, for example, a fluorinated lower alkyl group of 1 to 5 carbon atoms, which is substituted with a fluorine atom or a fluorine atom, and an oxygen atom (=O).

The group of (2) includes, for example, a group represented by general formula (IV) shown below.

[Chemical Formula 5]

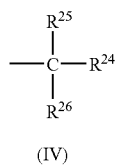

(IV)

In general formula (IV), $R^{24}$ is a cycloalkyl group which may have a substituent or not. Examples of the substituent the cycloalkyl group may have include a fluorine atom, a fluorinated lower alkyl group of 1 to 5 carbon atoms, which may be substituted with a fluorine atom, and an oxygen atom (=O).

$R^{25}$ and $R^{26}$ each independently represents a linear or branched alkyl group and, as the alkyl group, the same as the linear or branched alkyl group for $R^{21}$ to $R^{23}$ in formula (I) is exemplified.

The alkoxyalkyl group for Z includes, for example, a group represented by general formula (V) shown below.

[Chemical Formula 6]

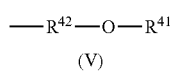

(V)

$R^{41}$ is a linear, branched or cyclic alkyl group.

$R^{41}$ is preferably a linear or branched group of 1 to 5 carbon atoms, more preferably an ethyl group or a methyl group, and most preferably an ethyl group.

$R^{41}$ is preferably a cyclic group having 4 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as bicycloalkane, tricycloalkane or tetracycloalkane, which may or may not be substituted with a fluorine atom or a fluorinated alkyl group. Specific examples thereof include groups in which one or more hydrogen atoms have been removed from a monocycloalkane such as a cyclopentane or cyclohexane, or a polycycloalkane such as an adamantane, norbornane, isobornane, tricyclodecane or tetracyclododecane. Of these, a group in which one or more hydrogen atoms have been removed from an adamantane is preferred.

$R^{42}$ is a linear or branched alkylene group. The alkylene group preferably has 1 to 5 carbon atoms, more preferably 1 to 3 carbon atoms, and still more preferably 1 to 2 carbon atoms.

The alkoxyalkyl group for Z is preferably a group represented by general formula (VI) shown below.

[Chemical Formula 7]

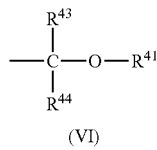

(VI)

In formula (VI), $R^{41}$ is the same as $R^{41}$ in general formula (V), and $R^{43}$ and $R^{44}$ each independently represents a linear or branched alkyl group, or a hydrogen atom.

In $R^{43}$ and $R^{44}$, the alkyl group preferably has 1 to 15 carbon atoms and may be linear or branched, more preferably an ethyl group or a methyl group, and most preferably a methyl group.

It is particularly preferred that one of $R^{43}$ and $R^{44}$ is a hydrogen atom and the other one is a methyl group.

Of these, Z is preferably a tertiary alkyl group-containing group, more preferably a group represented by general formula (II), and most preferably a tert-butyloxycarbonyl group (t-boc).

In general formula (a0-1), a is an integer of 1 to 3, b is an integer of 0 to 2 and also a+b=1 to 3.

a is preferably 1.
b is preferably 0.
a+b is preferably 1.
c is an integer of 0 to 3, preferably 0 or 1, and more preferably 0.
d is an integer of 0 to 3, preferably 0 or 1, and more preferably 0.
e is an integer of 0 to 3, preferably 0 or 1, and more preferably 0.

The structural unit (a0-1) is particularly preferably a structural unit represented by general formula (a0-1-1) shown below.

[Chemical Formula 8]

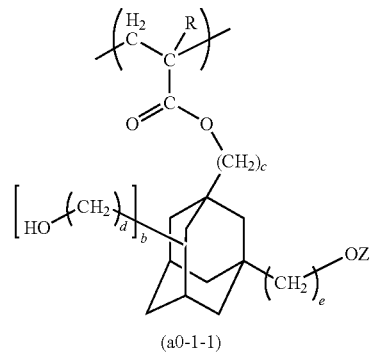

(a0-1-1)

wherein R, Z, b, c, d and e are the same as R, Z, b, c, d and e in general formula (a0-1) shown above.

The monomer, from which the structural unit (a0-1) is derived, can be synthesized by partially or completely protecting hydroxyl groups of a compound (an acrylate ester containing an aliphatic cyclic group having one to three alcoholic hydroxyl groups) represented by general formula (a0-1') shown below with a tertiary alkyl group-containing group or an alkoxyalkyl group using a known technique.

[Chemical Formula 9]

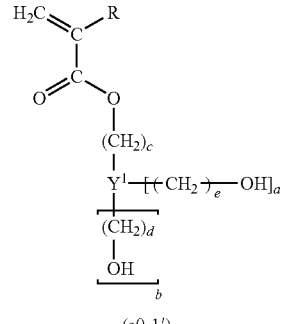

(a0-1')

wherein R, $Y^1$, a, b, c, d and e are the same as R, $Y^1$, a, b, c, d and e in general formula (a0-1) shown above.

As the structural unit (a0-1), one type may be used alone, or two or more types may be used in combination.

The amount of the structural unit (a0-1) in the component (A) is preferably 1 to 40 mol %, more preferably 5 to 40 mol %, still more preferably 15 to 40 mol %, and most preferably 20 to 40 mol %, based on the combined total of all structural units constituting the component (A). By making the amount of the structural unit (a0-1) no less than 1 mol %, the solubility in an organic solvent is improved. On the other hand, by making the amount of the structural unit (a0-1) no more than 40 mol %, a good balance can be achieved with the other structural units.

Structural Unit (a0-2)

In general formula (a0-2), R is a hydrogen atom, a lower alkyl group or a halogenated lower alkyl group. As the lower alkyl group or halogenated lower alkyl group for R in general formula (a0-2), the same as the lower alkyl group or halogenated lower alkyl group for R in formula (a0-1) is exemplified.

As the alkylene group for $Y^3$, an alkylene group of 1 to 10 carbon atoms is exemplified.

As the aliphatic cyclic group for $Y^3$, the same as $Y^1$ in formula (a0-1) shown above is exemplified. The basic ring (aliphatic ring) structure of $Y^3$ is preferably the same as that for $Y^1$.

g is an integer of 0 to 3, preferably 0 or 1, and more preferably 0.

h is an integer of 0 to 3, preferably 0 or 1, and more preferably 0.

i is an integer of 1 to 3, and preferably 1.

The structural unit (a0-2) is preferably a structural unit represented by general formula (a0-2-1) shown below. It is particularly preferred that one of the i $(CH_2)_h$—OH is bonded to the 3rd position of the 1-adamantyl group.

[Chemical Formula 10]

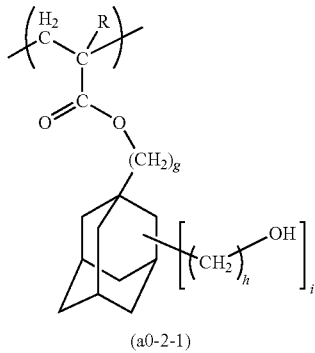

(a0-2-1)

wherein R, g, h and i are the same as R, g, h and i in general formula (a0-2).

As the structural unit (a0-2), one type may be used alone, or two or more types may be used in combination.

The amount of the structural unit (a0-2) in the component (A) is preferably 1 to 35 mol %, more preferably 5 to 30 mol %, still more preferably 10 to 30 mol %, and most preferably 20 to 30 mol %, based on the combined total of all structural units constituting the component (A). By making the amount of the structural unit (a0-2) no less than 1 mol %, a resist pattern having high rectangularity of the cross-sectional shape and good shape can be formed. On the other hand, by making the amount of the structural unit (a0-2) no more than 35 mol %, a good balance can be achieved with the other structural units.

Structural Unit (a1)

It is preferred that the component (A) has, in addition to the structural unit (a0-1) and the structural unit (a0-2), a structural unit (a1) derived from an acrylate ester containing an acid dissociable, dissolution inhibiting group.

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A) insoluble in an alkali developing solution prior to dissociation, and then following dissociation by action of an acid, increases the solubility of the entire component (A) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. The term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of an acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" within the structural unit (a1) may or may not have a substituent. Examples of substituents include lower alkyl groups of 1 to 5 carbon atoms, fluorine atom, fluorinated lower alkyl groups of 1 to 5 carbon atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include a 2-methyl-2-adamantyl group and a 2-ethyl-2-adamantyl group. Further, groups having an aliphatic cyclic group such as an adamantyl group, cyclohexyl group, cyclopentyl group, norbornyl group, tricyclodecanyl group or tetracyclododecanyl group, and a branched alkylene group having a tertiary carbon atom bonded thereto, as the groups bonded to the oxygen atom of the carbonyl group (—C(O)—O—) within the structural units represented by general formulas (a1″-1) to (a1″-6) shown below, can be exemplified.

[Chemical Formula 11]

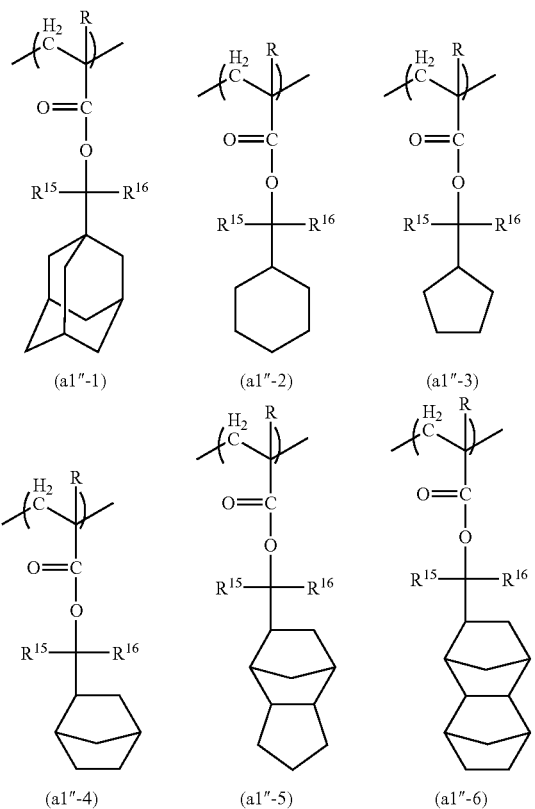

(a1″-1)  (a1″-2)  (a1″-3)
(a1″-4)  (a1″-5)  (a1″-6)

wherein R represents a hydrogen atom, a lower alkyl group or a halogenated lower alkyl group; and $R^{15}$ and $R^{16}$ each independently represents an alkyl group (which may be linear or branched, and preferably has 1 to 5 carbon atoms).

In general formulas (a1″-1) to (a1″-6) above, the lower alkyl group or halogenated lower alkyl group for R are the same as the lower alkyl group or halogenated lower alkyl group which can be bonded to the α-position of the aforementioned acrylate ester.

An "acetal-type acid dissociable, dissolution inhibiting group" generally substitutes a hydrogen atom at the terminal of an alkali-soluble group such as a carboxy group or hydroxyl group, so as to be bonded to an oxygen atom. When an acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 12]

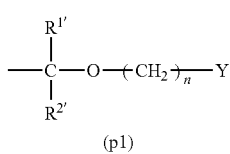

(p1)

wherein $R^{1\prime}$ and $R^{2\prime}$, each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$, and $R^{2\prime}$, the same as the lower alkyl groups for R above can be exemplified. As the lower alkyl group for $R^{1\prime}$, and $R^{2\prime}$, a methyl group or an ethyl group is preferable, and a methyl group is particularly desirable.

In the present invention, it is preferable that at least one of $R^{1\prime}$, and $R^{2\prime}$, be a hydrogen atom. That is, it is preferable that the acid dissociable, dissolution inhibiting group (p1) is a group represented by general formula (p1-1) shown below.

[Chemical Formula 13]

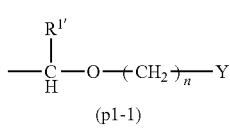

(p1-1)

wherein $R^{1\prime}$, n and Y are the same as $R^{1\prime}$, n and Y in general formula (p1) shown above.

As the lower alkyl group for Y, the same as the lower alkyl groups for R above can be exemplified.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be exemplified.

Further, as the acetal-type, acid dissociable, dissolution inhibiting group, groups represented by general formula (p2) shown below can also be exemplified.

[Chemical Formula 14]

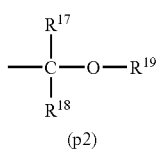

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and tetrahydrofuranyl group.

As the structural unit (a1), it is preferable to use at least one member selected from the group consisting of structural units represented by formula (a1-0-1) shown below and structural units represented by formula (a1-0-2) shown below.

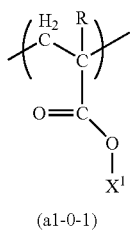

(a1-0-1)

[Chemical Formula 15]

wherein R represents a hydrogen atom, a lower alkyl group or a halogenated lower alkyl group; and $X^1$ represents an acid dissociable, dissolution inhibiting group.

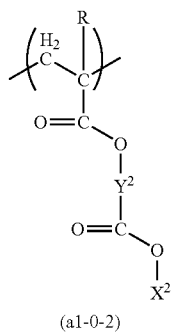

(a1-0-2)

[Chemical Formula 16]

wherein R represents a hydrogen atom, a lower alkyl group or a halogenated lower alkyl group; $X^2$ represents an acid dissociable, dissolution inhibiting group; and $y^2$ represents an alkylene group or an aliphatic cyclic group.

In general formula (a1-0-1) shown above, the lower alkyl group and halogenated lower alkyl group for R are the same as the lower alkyl group and halogenated lower alkyl group which can be bonded to the α-position of the aforementioned acrylate ester.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as R in general formula (a1-0-1).

$X^2$ is the same as $X^1$ in general formula (a1-0-1).

$Y^2$ is an alkylene group or an aliphatic cyclic group, and preferably an alkylene group of 1 to 10 carbon atoms or a divalent aliphatic cyclic group. As the aliphatic cyclic group, the same as those exemplified above in connection with the explanation of "aliphatic cyclic group" can be used, except that two hydrogen atoms have been removed therefrom.

When $Y^2$ represents an alkylene group of 1 to 10 carbon atoms, it is more preferable that the number of carbons is 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

Specific examples of the structural unit (a1) include structural units represented by general formulas (a1-1) to (a1-4) shown below.

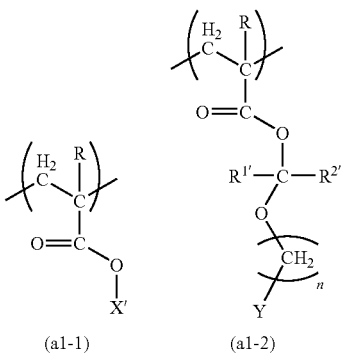

(a1-1)    (a1-2)

[Chemical Formula 17]

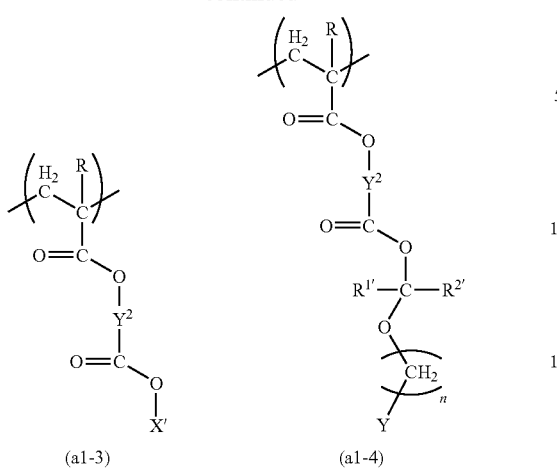

(a1-3)  (a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; $Y^2$ represents an alkylene group or an aliphatic cyclic group; R represents a hydrogen atom, a lower alkyl group or a halogenated lower alkyl group; and $R^{1\prime}$ and $R^{2\prime}$ each independently represents a hydrogen atom or a lower alkyl group of 1 to 5 carbon atoms.

The lower alkyl group and halogenated lower alkyl group for R in general formulas (a1-1) to (a1-4) shown above are the same as the lower alkyl group and halogenated lower alkyl group which may be bonded to the α-position of the aforementioned acrylate ester.

Examples of the tertiary alkyl ester-type acid dissociable, dissolution inhibiting group for X' are the same as the above-exemplified tertiary alkyl ester-type acid dissociable, dissolution inhibiting groups for $X^1$.

As $R^{1\prime}$, $R^2$, n and Y, the same as $R^1$, $R^2$, n and Y defined for general formula (p1) described above in connection with the "acetal-type acid dissociable, dissolution inhibiting group" may be exemplified.

As $Y^2$, the same alkylene group or aliphatic cyclic group as $Y^2$ defined for general formula (a1-0-2) above may be exemplified.

Specific examples of structural units represented by general formula (a1-1) to (a1-4) are shown below.

[Chemical Formula 18]

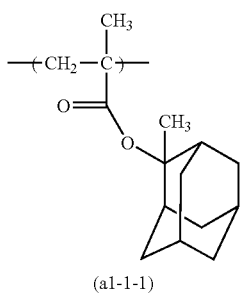
(a1-1-1)

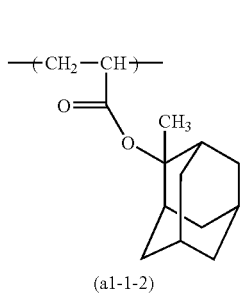
(a1-1-2)

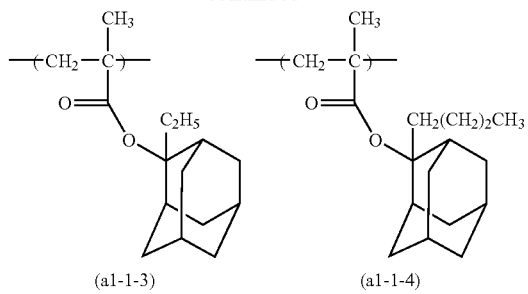
(a1-1-3)  (a1-1-4)

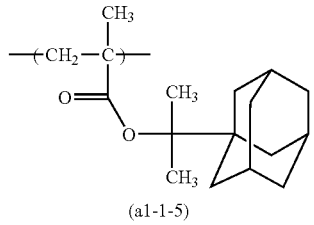
(a1-1-5)

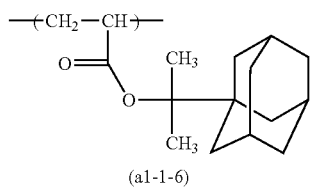
(a1-1-6)

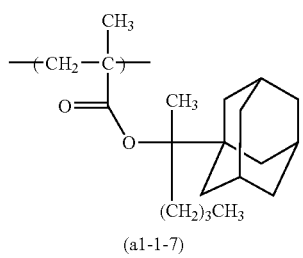
(a1-1-7)

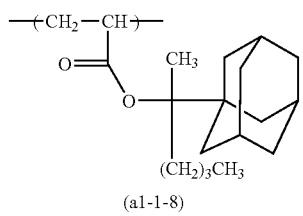
(a1-1-8)

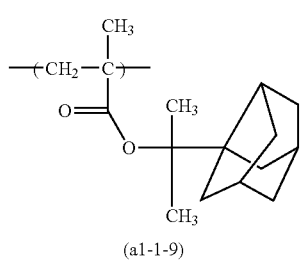
(a1-1-9)

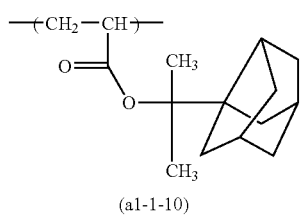
(a1-1-10)

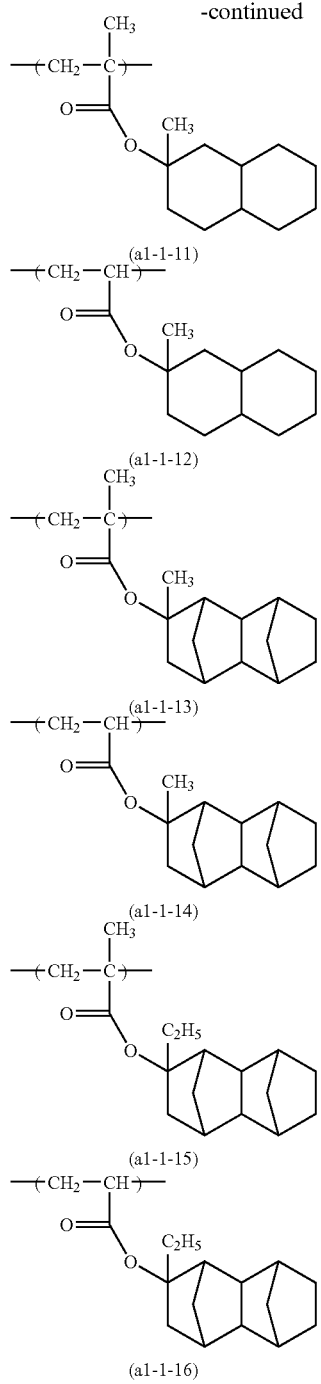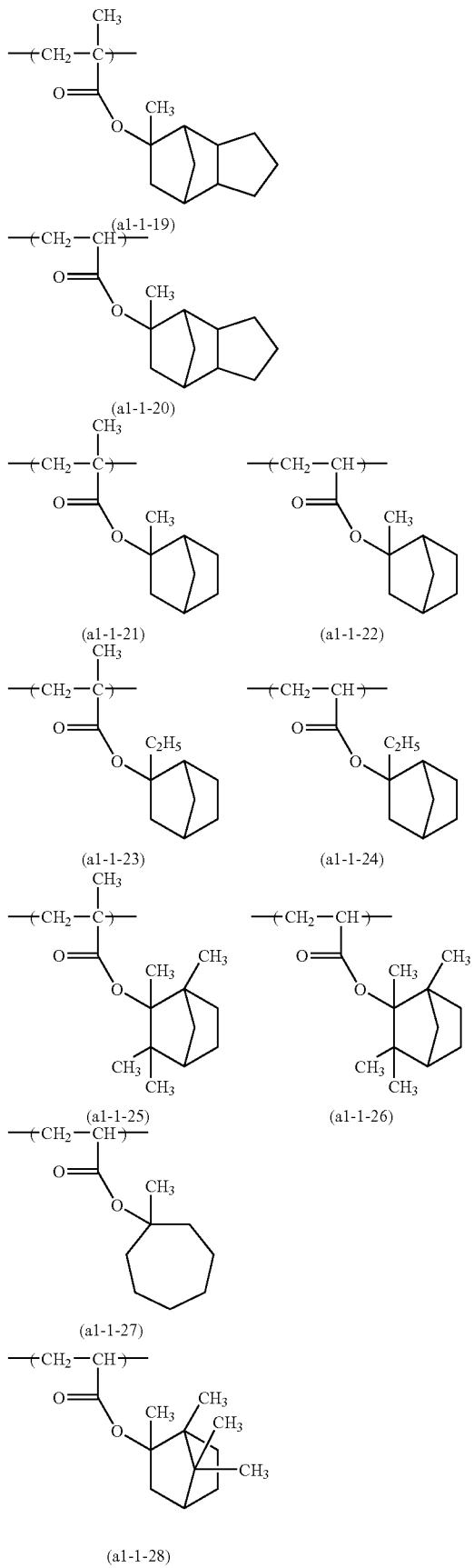

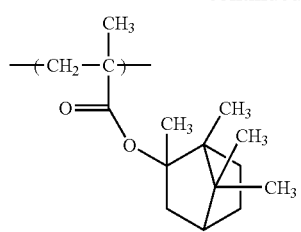
(a1-1-29)
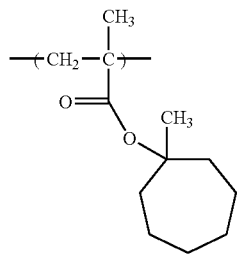
(a1-1-30)
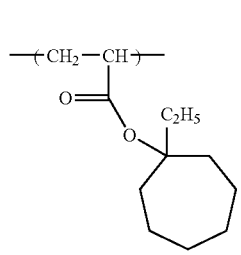
(a1-1-31)
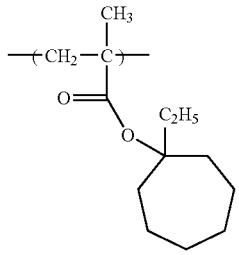
(a1-1-32)
[Chemical Formula 20]
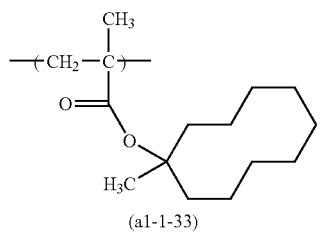
(a1-1-33)
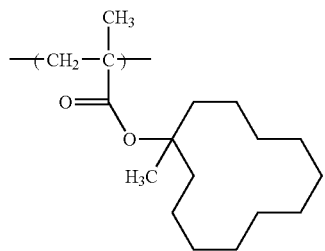
(a1-1-34)
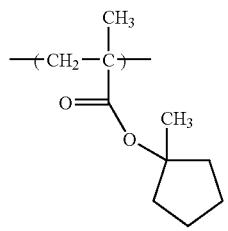
(a1-1-35)
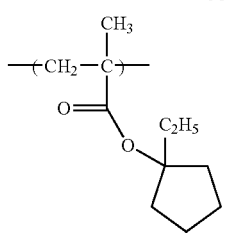
(a1-1-36)
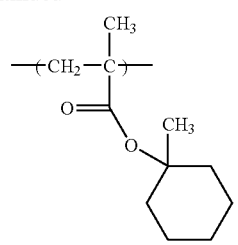
(a1-1-37)
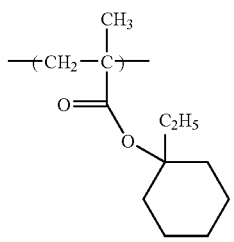
(a1-1-38)
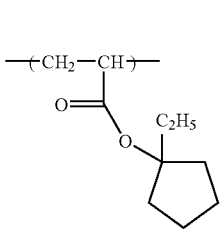
(a1-1-39)
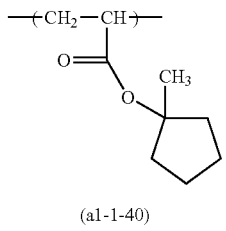
(a1-1-40)
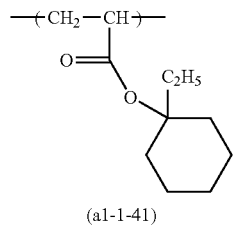
(a1-1-41)
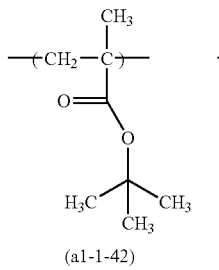
(a1-1-42)
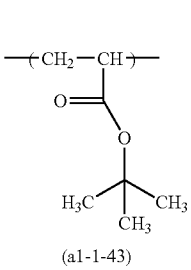
(a1-1-43)
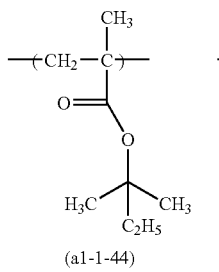
(a1-1-44)
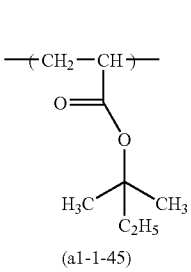
(a1-1-45)
[Chemical Formula 21]
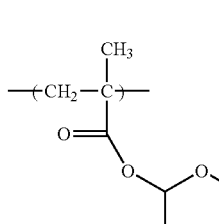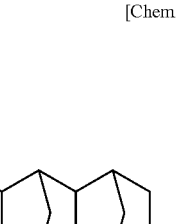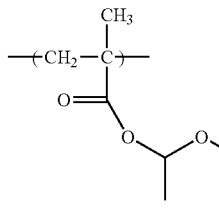
(a1-2-1)

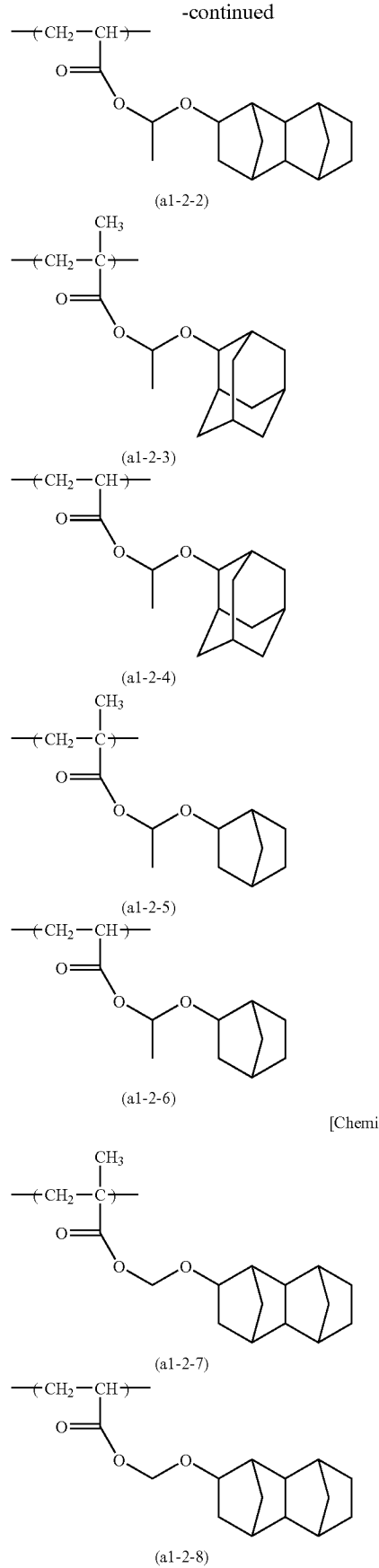

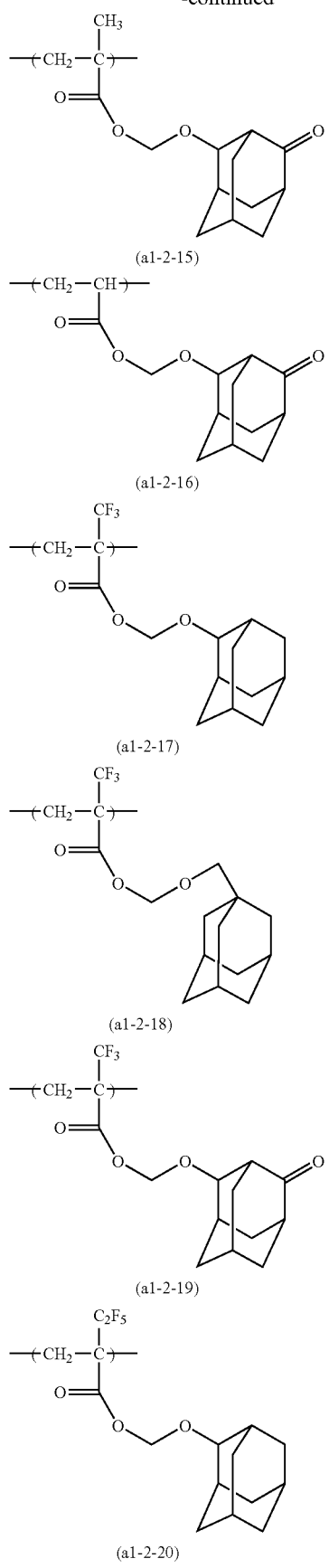

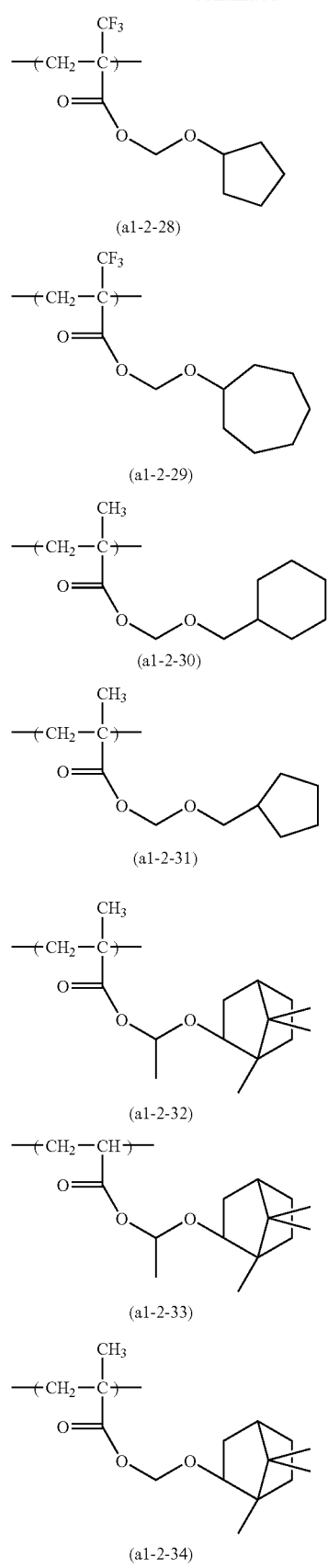
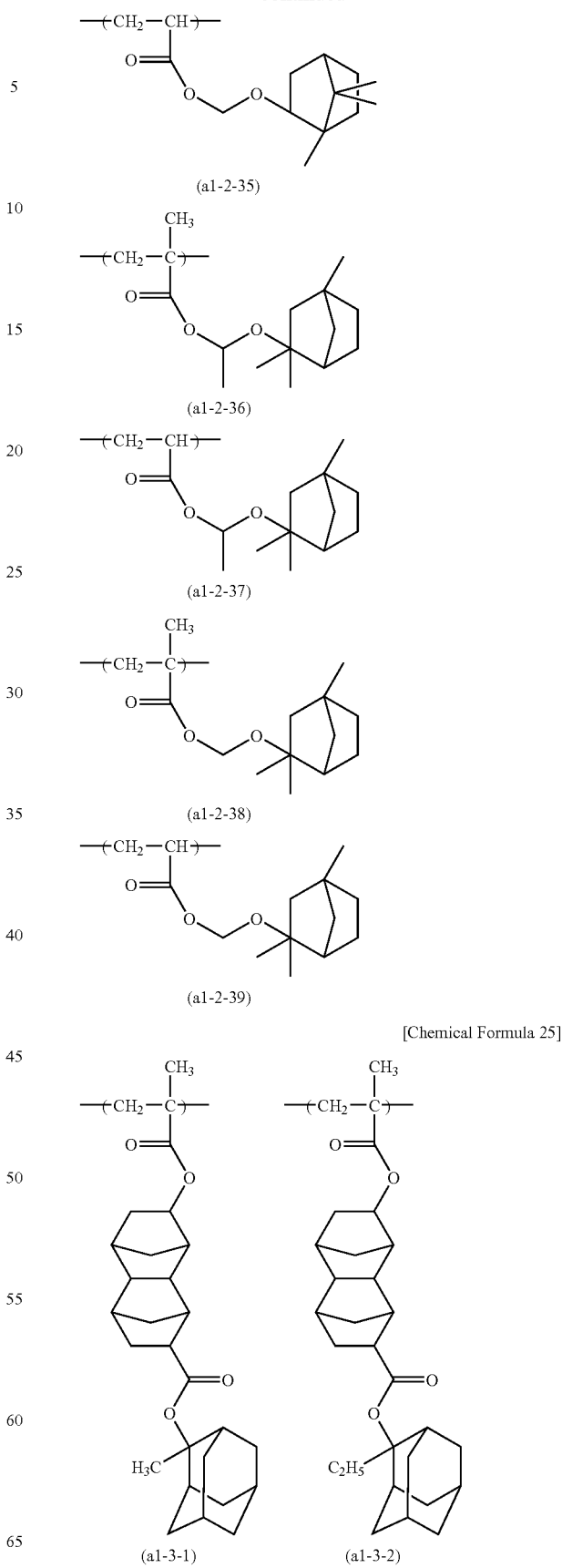

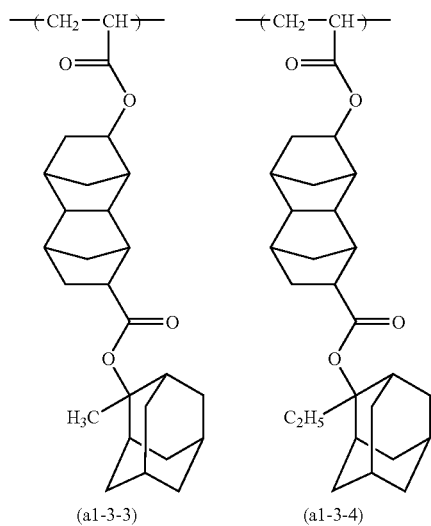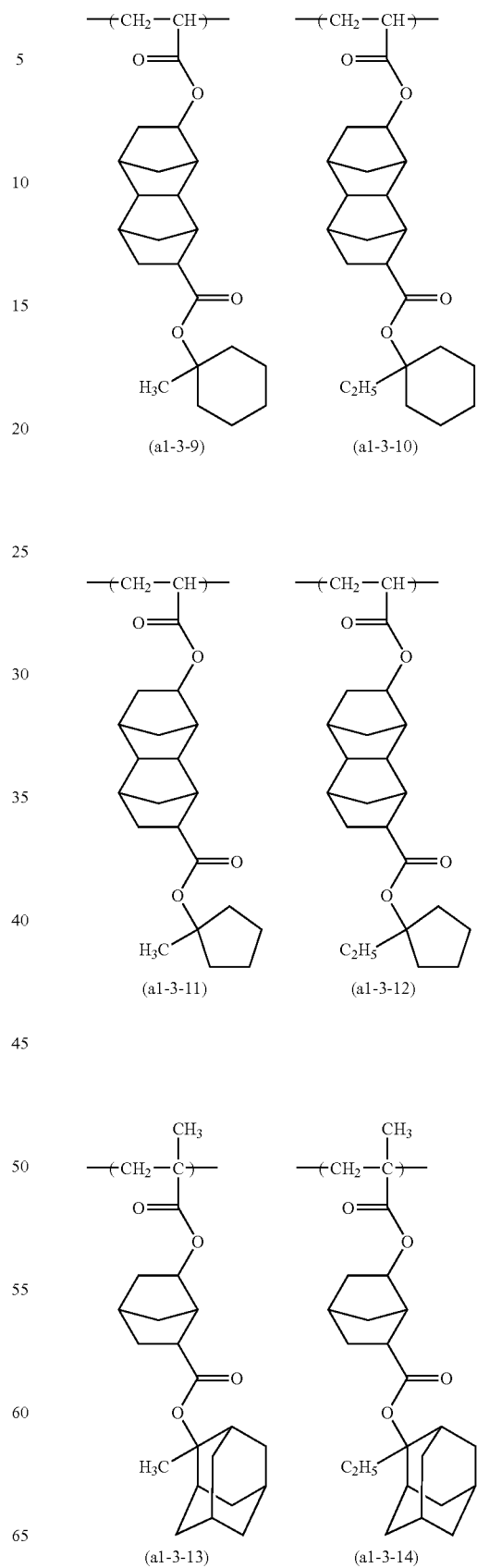

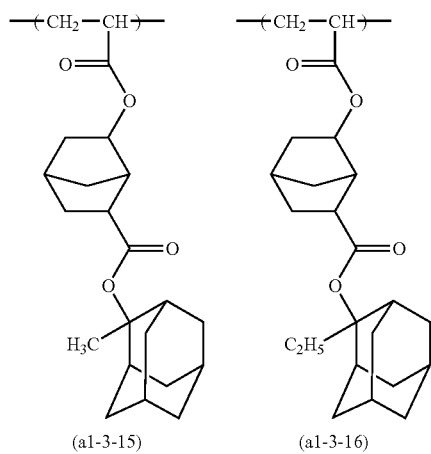
(a1-3-15)  (a1-3-16)
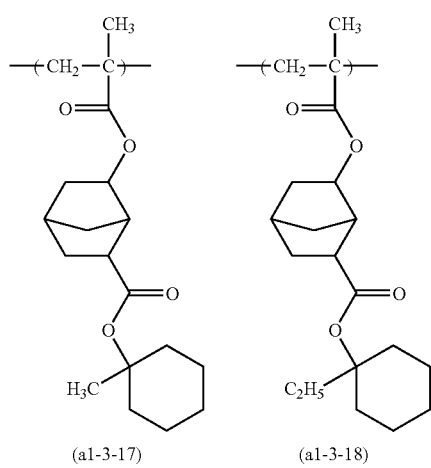
(a1-3-17)  (a1-3-18)
[Chemical Formula 26]
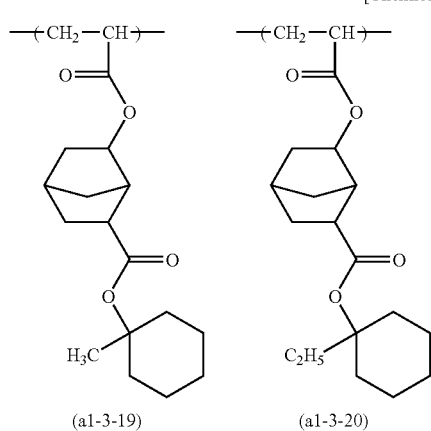
(a1-3-19)  (a1-3-20)
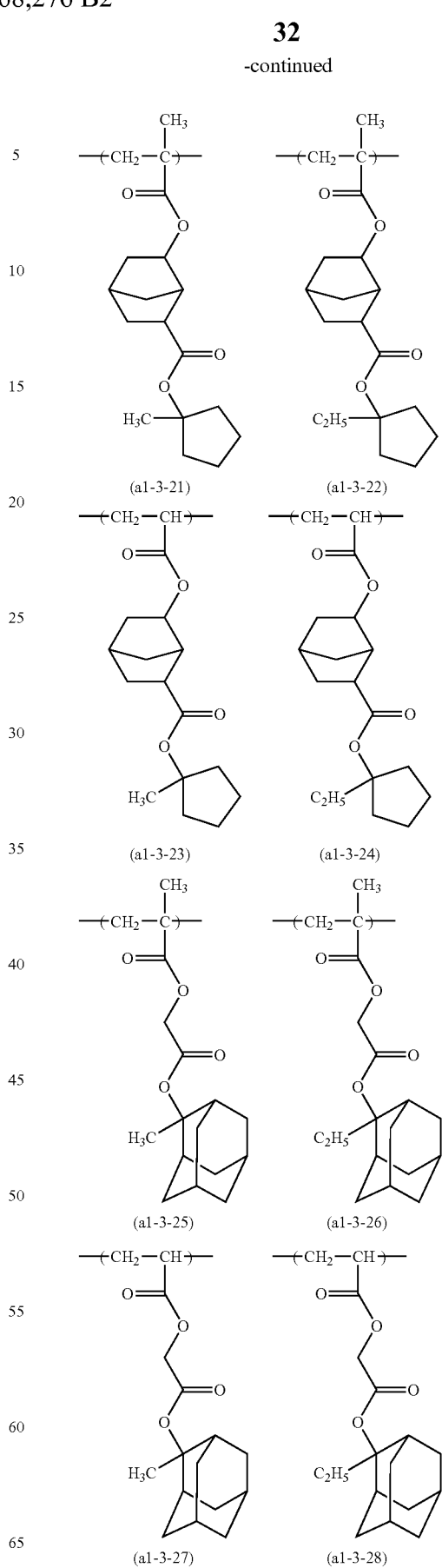
(a1-3-21)  (a1-3-22)
(a1-3-23)  (a1-3-24)
(a1-3-25)  (a1-3-26)
(a1-3-27)  (a1-3-28)

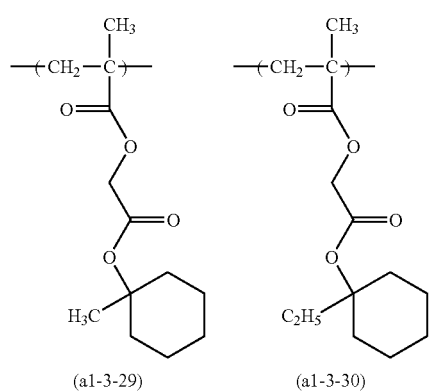
(a1-3-29)  (a1-3-30)
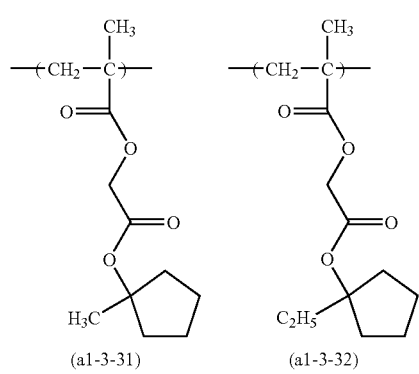
(a1-3-31)  (a1-3-32)
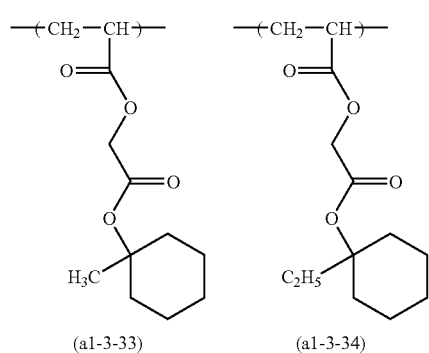
(a1-3-33)  (a1-3-34)
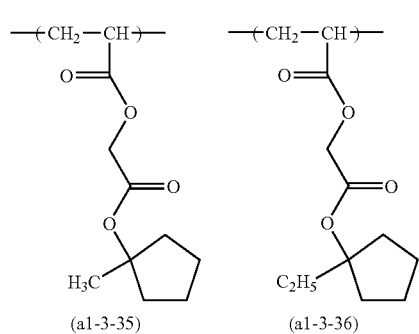
(a1-3-35)  (a1-3-36)
[Chemical Formula 27]
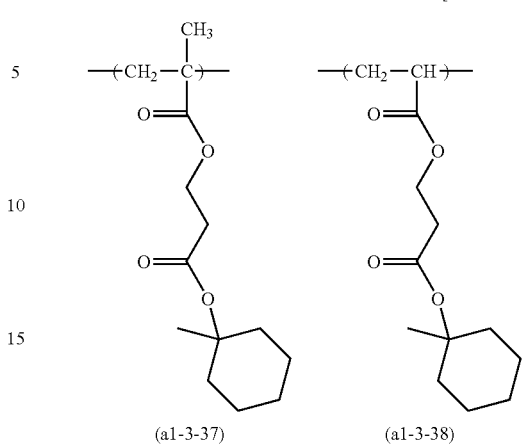
(a1-3-37)  (a1-3-38)
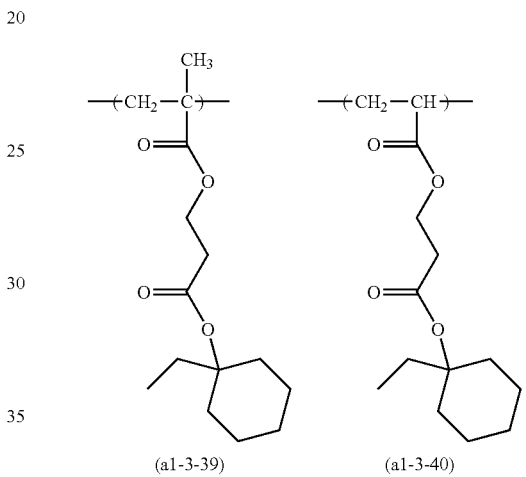
(a1-3-39)  (a1-3-40)
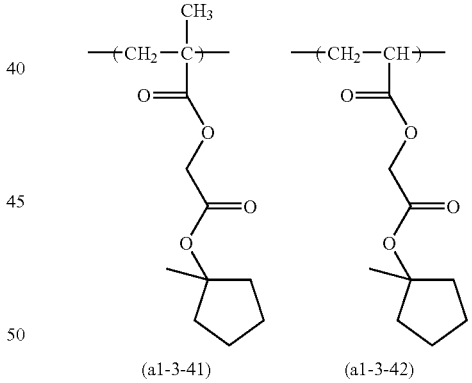
(a1-3-41)  (a1-3-42)
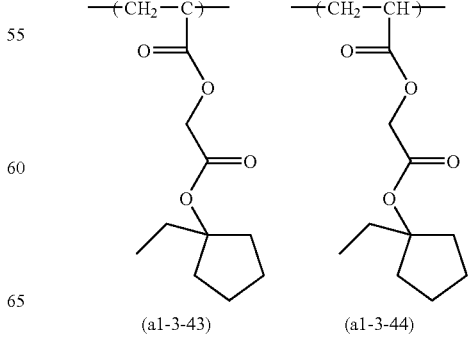
(a1-3-43)  (a1-3-44)

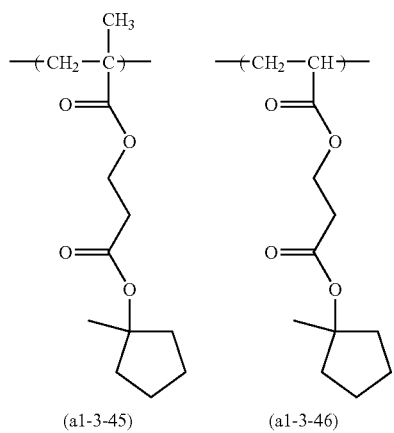
(a1-3-45) (a1-3-46)
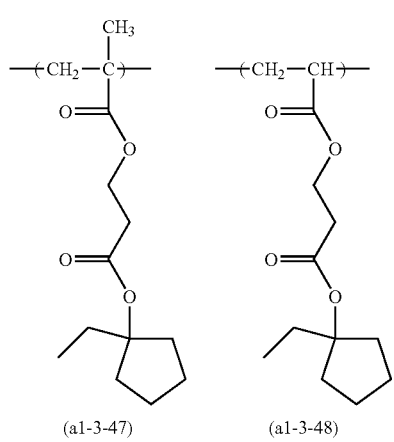
(a1-3-47) (a1-3-48)
[Chemical Formula 28]
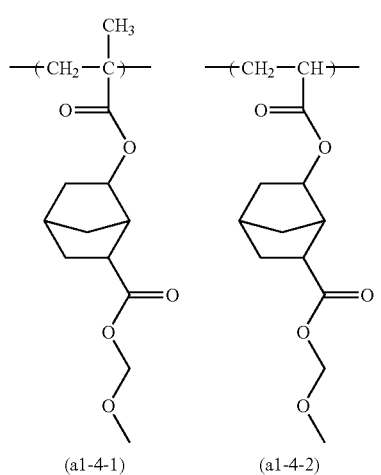
(a1-4-1) (a1-4-2)
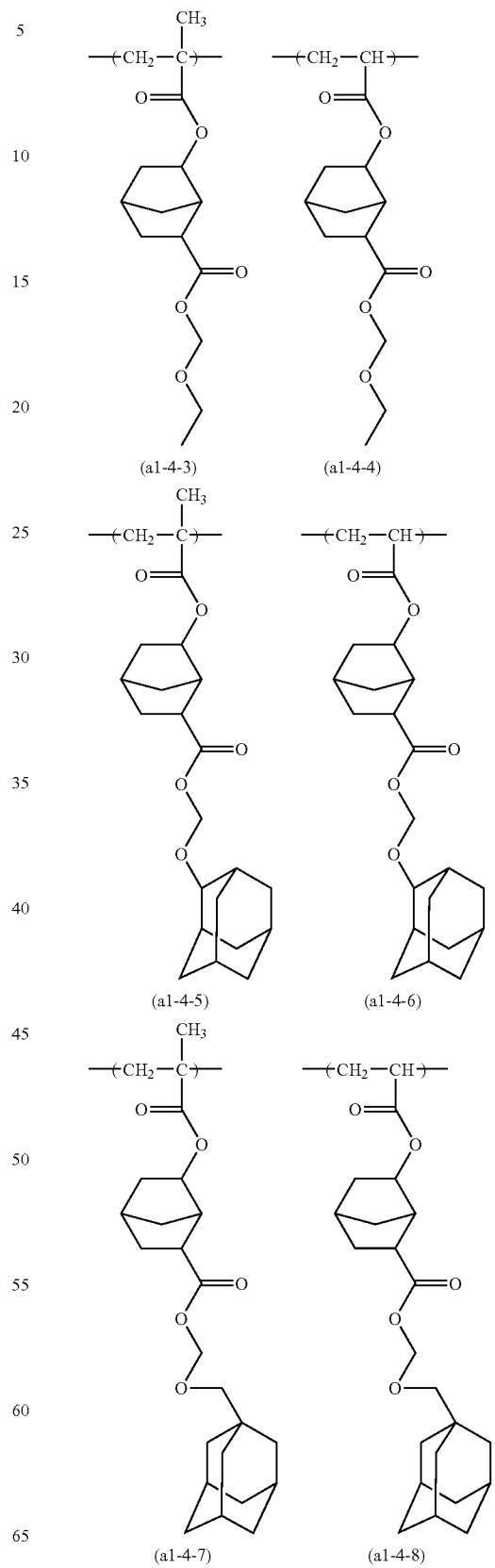
(a1-4-3) (a1-4-4)
(a1-4-5) (a1-4-6)
(a1-4-7) (a1-4-8)

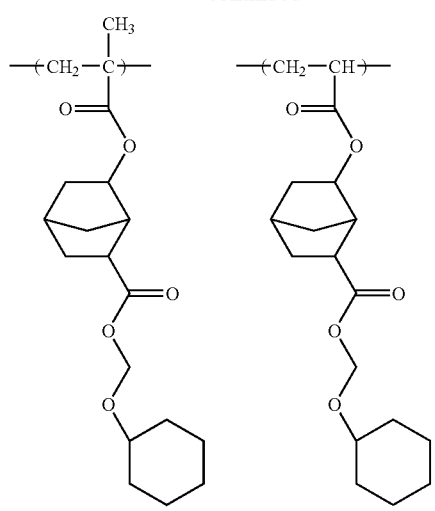
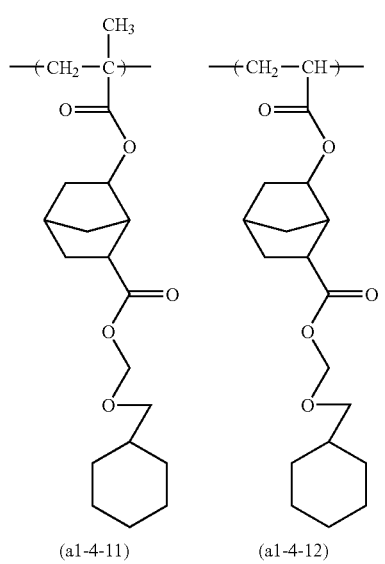
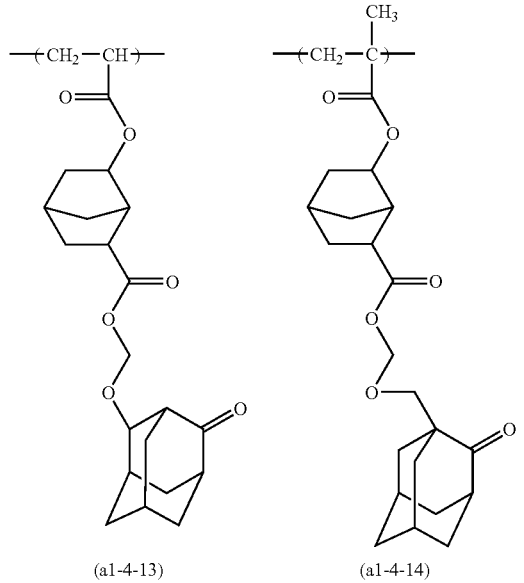
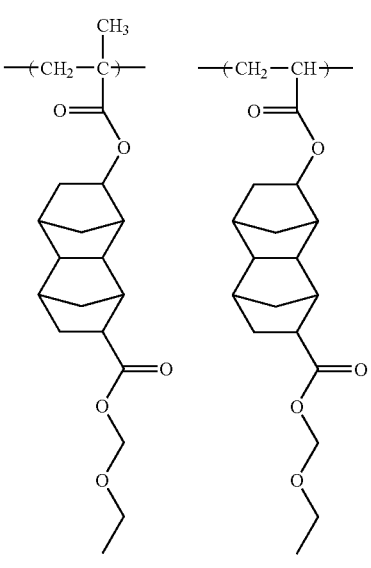
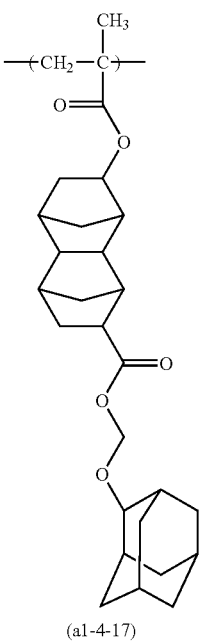

[Chemical Formula 29]
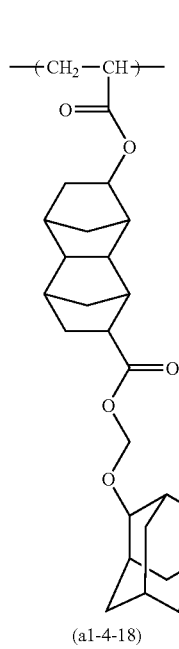
(a1-4-18)
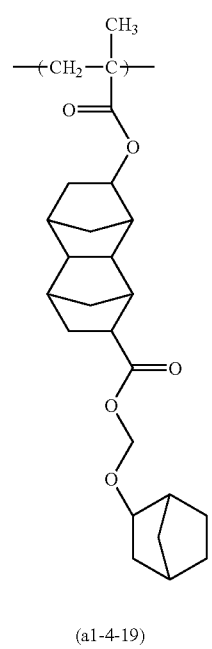
(a1-4-19)
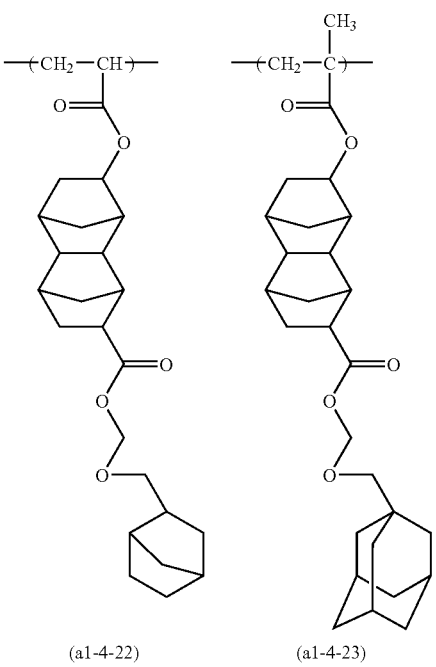
(a1-4-22)     (a1-4-23)
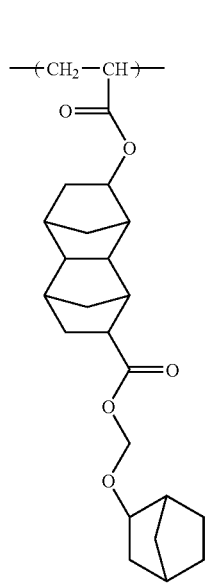
(a1-4-20)
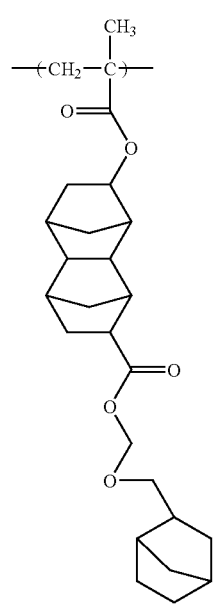
(a1-4-21)
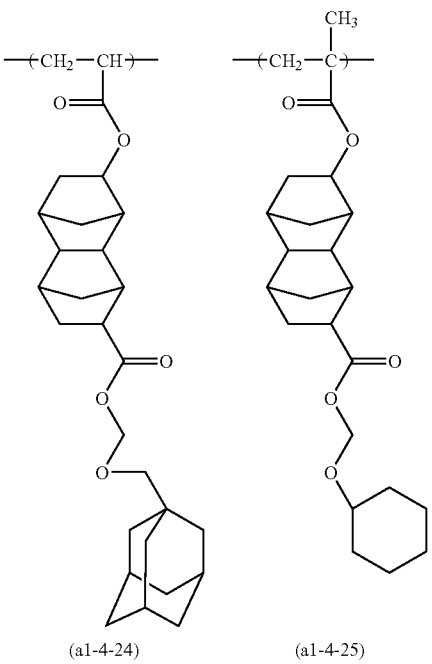
(a1-4-24)     (a1-4-25)

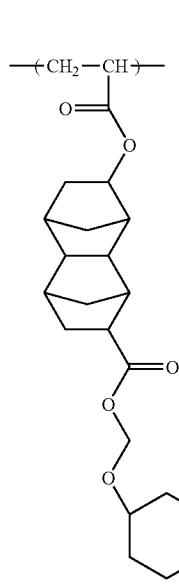
(a1-4-26)

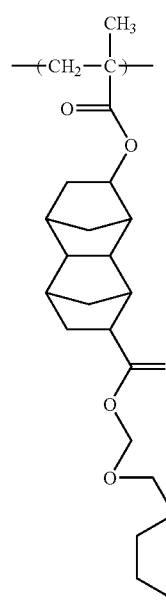
(a1-4-27)

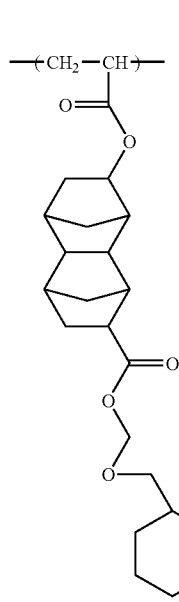
(a1-4-28)

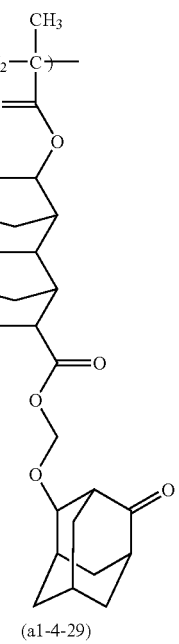
(a1-4-29)

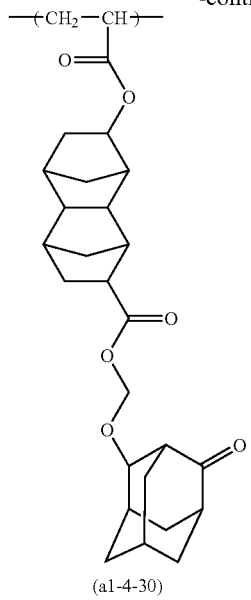
(a1-4-30)

As the structural unit (a1), one type may be used alone, or two or more types may be used in combination. Among these, structural units represented by general formula (a1-1) are preferable. More specifically, at least one structural unit selected from the group consisting of structural units represented by formulas (a1-1-1) to (a-1-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are also preferable.

[Chemical Formula 30]

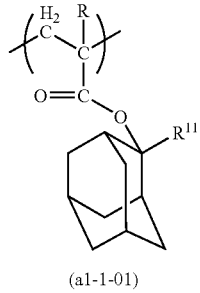
(a1-1-01)

wherein R represents a hydrogen atom, a lower alkyl group or a halogenated lower alkyl group; and $R^{11}$ represents a lower alkyl group.

[Chemical Formula 31]

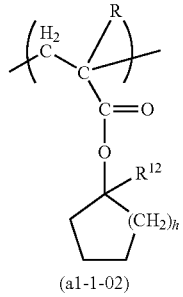
(a1-1-02)

wherein R represents a hydrogen atom, a lower alkyl group or a halogenated lower alkyl group; $R^{12}$ represents a lower alkyl group; and h represents an integer of 1 to 3.

In general formula (a1-1-01), R is the same as R in general formula (a0-1) shown above. The lower alkyl group for $R^{11}$ is the same as the lower alkyl group for R above, and is preferably a methyl group or an ethyl group.

In general formula (a1-1-02), R is the same as R in general formula (a0-1) shown above. The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

In the component (A), the amount of the structural unit (a1) based on the combined total of all structural units constituting the component (A) is preferably 10 to 80 mol %, more preferably 20 to 70 mol %, and still more preferably 25 to 50 mol %. By making the amount of the structural unit (a1) no less than 10 mol %, a pattern can be easily formed using a resist composition prepared from the component (A). On the other hand, by making the amount of the structural unit (a1) no more than 80 mol %, a good balance can be achieved with the other structural units.

Structural Unit (a2)

The component (A) may have, in addition to the structural unit (a0-1), the structural unit (a0-2) and the structural unit (a1), a structural unit (a2) derived from an acrylate ester containing a lactone-containing cyclic group as long as the effects of the present invention are not impaired.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 32]

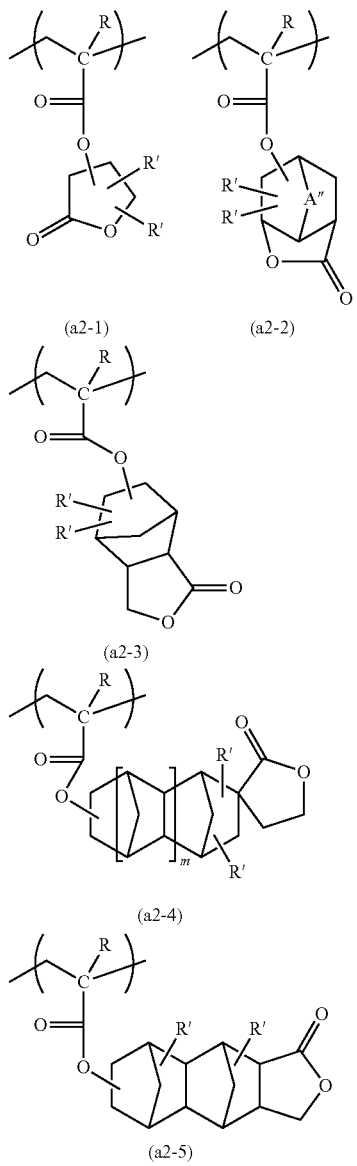

wherein R represents a hydrogen atom, a lower alkyl group or a halogenated lower alkyl group; R' represents a hydrogen atom, a lower alkyl group, an alkoxy group of 1 to 5 carbon atoms or —COOR", wherein R" each independently represents a hydrogen atom or a linear, branched or cyclic alkyl group of 1 to 15 carbon atoms; m represents 0 or 1; and A" represents an alkylene group of 1 to 5 carbon atoms, which may contain an oxygen atom or a sulfur atom, an oxygen atom or a sulfur atom.

In general formulas (a2-1) to (a2-5), R is the same as R in general formula (a1-0-1) of the structural unit (a1).

The lower alkyl group for R' is the same as the lower alkyl group for R in general formula (a1-0-1) of the structural unit (a1).

When R" is a linear or branched alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, and which may or may not be substituted with fluorine atoms or fluorinated alkyl groups. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In the structural units represented by general formulas (a2-1) to (a2-5), in consideration of industrial availability, R' is preferably a hydrogen atom.

Specific examples of alkylene groups of 1 to 5 carbon atoms, which may contain an oxygen atom or a sulfur atom, for A" include a methylene group, an ethylene group, an n-propylene group, an isopropylene group, —O—CH$_2$—, —CH$_2$—O—CH$_2$—, —S—CH$_2$— and —CH$_2$—S—CH$_2$—.

Specific examples of structural units represented by general formulas (a2-1) to (a2-5) above are shown below.

[Chemical Formula 33]

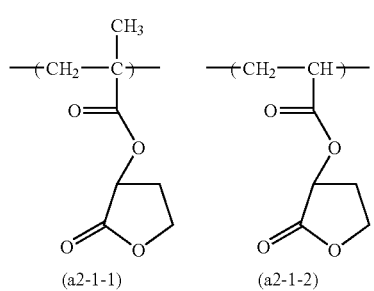

(a2-1-1)    (a2-1-2)

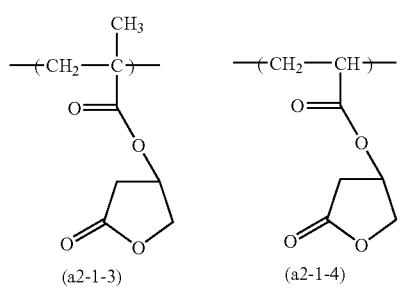

(a2-1-3)    (a2-1-4)

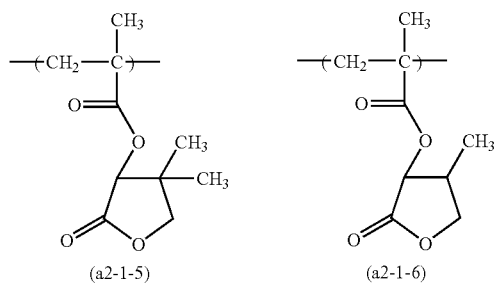

(a2-1-5)    (a2-1-6)

[Chemical Formula 34]

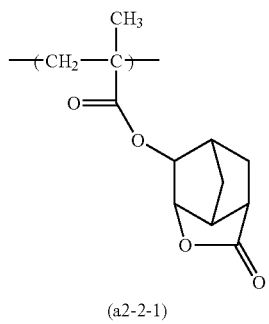

(a2-2-1)

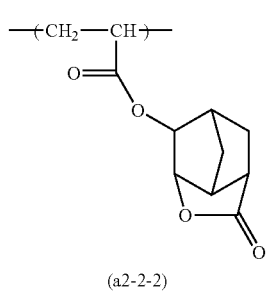

(a2-2-2)

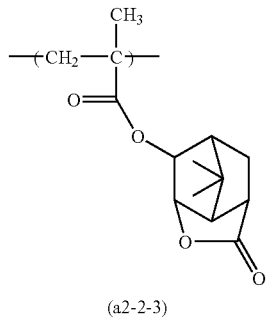

(a2-2-3)

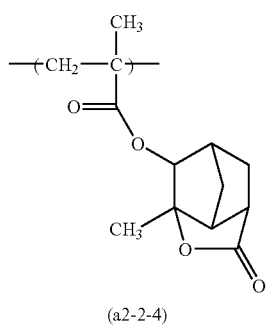

(a2-2-4)

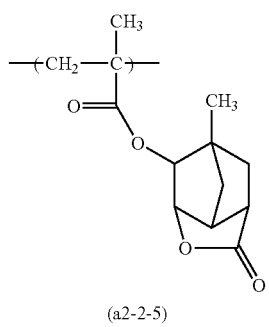 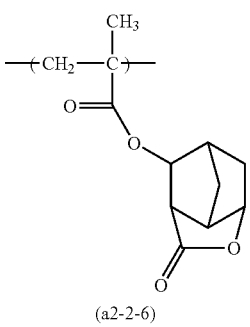

(a2-2-5)    (a2-2-6)

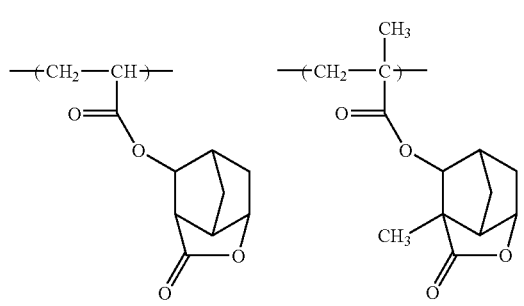
(a2-2-7) (a2-2-8)
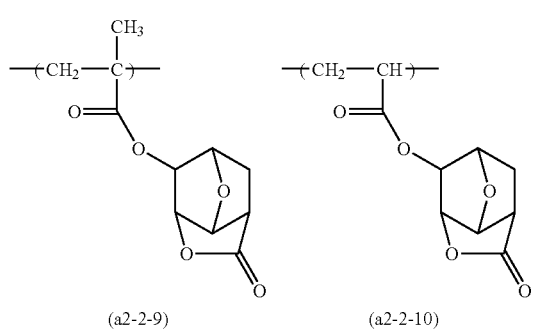
(a2-2-9) (a2-2-10)
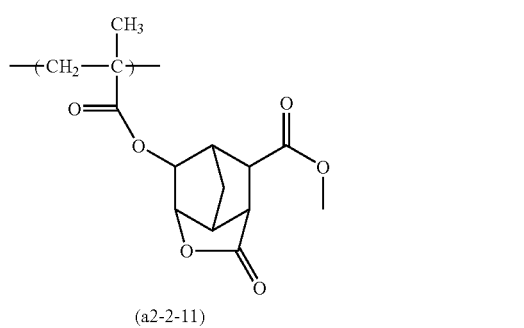
(a2-2-11)
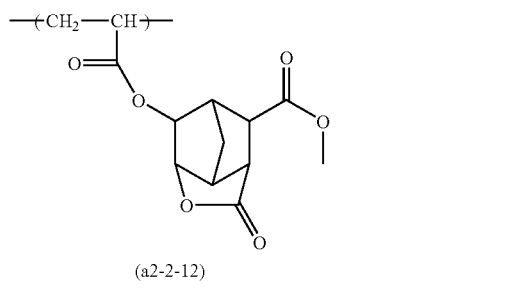
(a2-2-12)
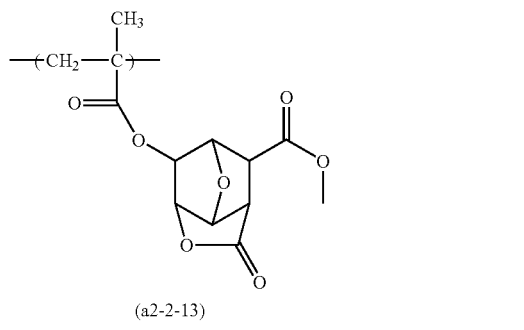
(a2-2-13)
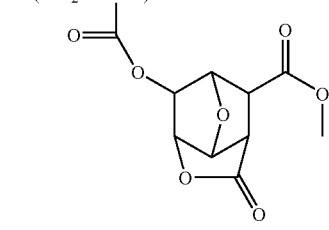
(a2-2-14)
[Chemical Formula 35]
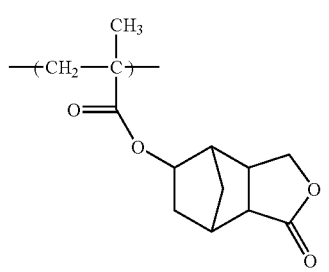
(a2-3-1)
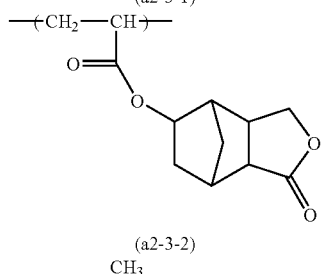
(a2-3-2)
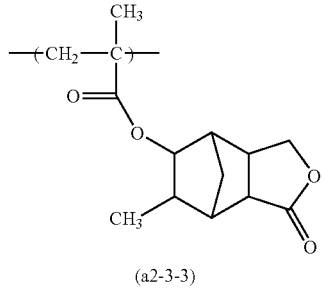
(a2-3-3)
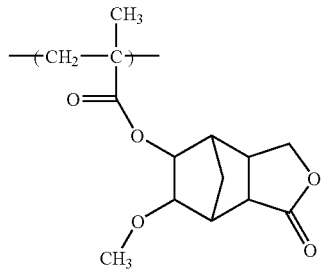
(a2-3-4)
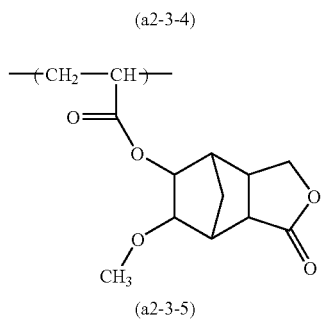
(a2-3-5)

-continued
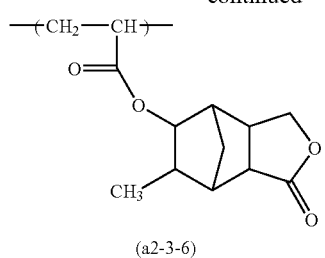
(a2-3-6)
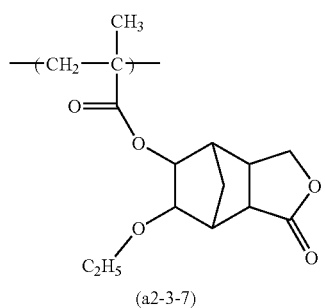
(a2-3-7)
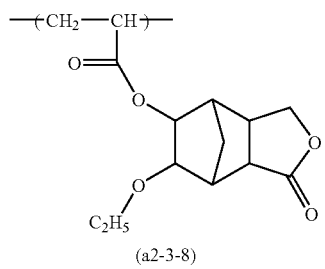
(a2-3-8)
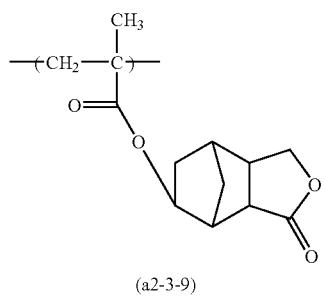
(a2-3-9)
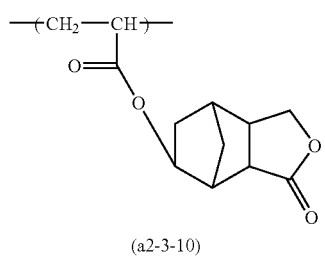
(a2-3-10)
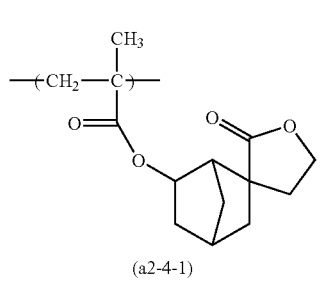
(a2-4-1)
-continued
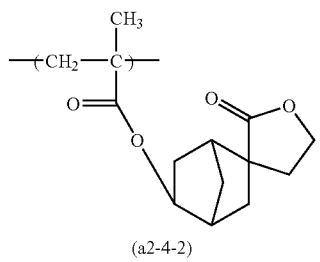
(a2-4-2)
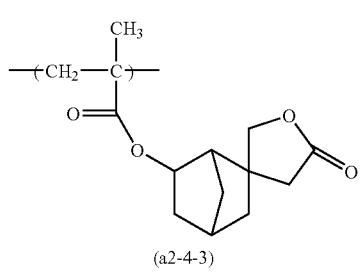
(a2-4-3)
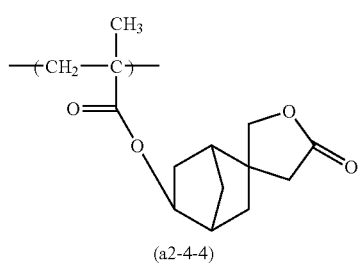
(a2-4-4)
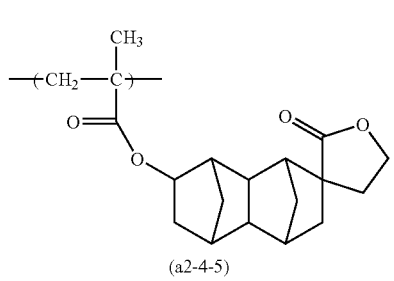
(a2-4-5)
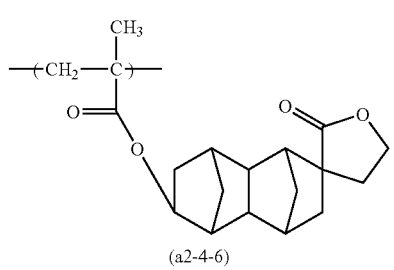
(a2-4-6)
[Chemical Formula 36]
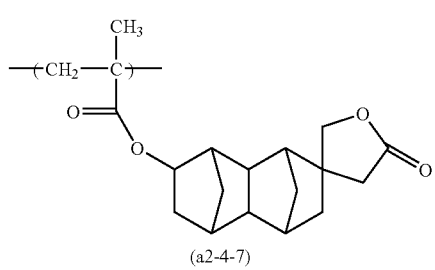
(a2-4-7)

-continued

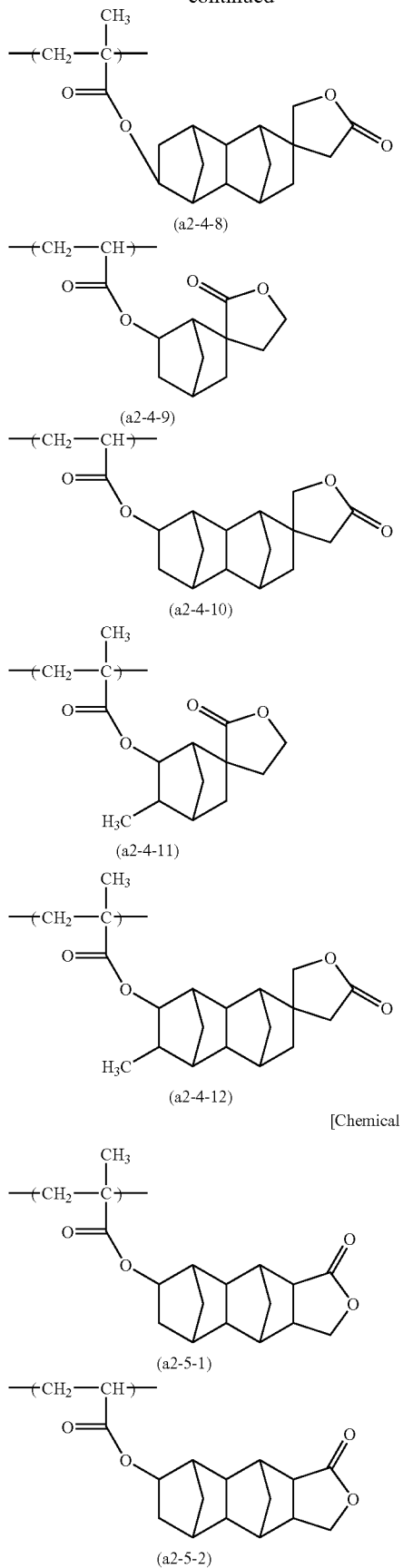

(a2-4-8)
(a2-4-9)
(a2-4-10)
(a2-4-11)
(a2-4-12)

[Chemical Formula 37]

(a2-5-1)
(a2-5-2)

-continued

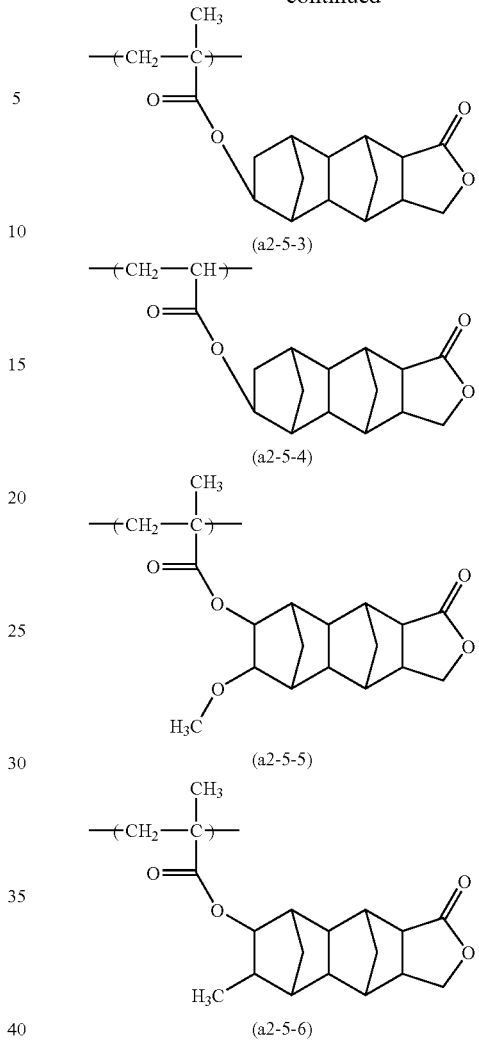

(a2-5-3)
(a2-5-4)
(a2-5-5)
(a2-5-6)

In the component (A), as the structural unit (a2), one type of structural unit may be used, or two or more types may be used in combination.

As the structural unit (a2), at least one structural unit selected from the group consisting of formulas (a2-1) to (a2-5) is preferable, and at least one structural unit selected from the group consisting of formulas (a2-1) to (a2-3) is more preferable. Specifically, it is preferable to use at least one structural unit selected from the group consisting of formulas (a2-1-1), (a2-1-2), (a2-1-3), (a2-1-4), (a2-2-1), (a2-2-2), (a2-2-9), (a2-2-10), (a2-3-1 ), (a2-3-2), (a2-3-9) and (a2-3-10).

When the component (A) contains a structural unit (a2), the amount of the structural unit (a2) based on the combined total of all structural units constituting the component (A) is preferably 1 mol % or more and less than 20 mol %, more preferably 1 to 15 mol %, and still more preferably 5 to 15 mol %. By making the amount of the structural unit (a2) no less than 1 mol %, the effect of using the structural unit (a2) can be satisfactorily achieved. On the other hand, by making the amount of the structural unit (a2) no more than 20 mol %, the solubility of the component (A) in an organic solvent (S) described hereinafter can be improved and a good balance can be achieved with the other structural units.

Structural Unit (a3)

The component (A) may have a structural unit (a3) derived from an acrylate ester containing a polar group-containing aliphatic hydrocarbon group, which does not contain a structural unit represented by general formula (a0-1) or (a0-2), in addition to the structural unit (a0-1), the structural unit (a0-2) and the structural unit (a1) as long as the effects of the present invention are not impaired.

When the component (A) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which some of the hydrogen atoms of the alkyl group have been substituted with fluorine atoms (for example, fluorinated alkylalcohol), although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, cyano group, carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a polycyclic group, structural units represented by formulas (a3-1) and (a3-2) shown below are preferable as the structural unit (a3).

[Chemical Formula 38]

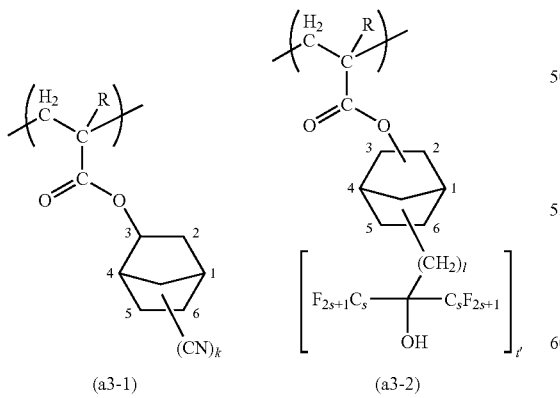

(a3-1)     (a3-2)

wherein R represents a hydrogen atom, a lower alkyl group or a halogenated lower alkyl group; k is an integer of 1 to 3; t' is an integer of 1 to 3; l is an integer of 1 to 5 ; and s is an integer of 1 to 3.

In general formulas (a3-1) and (a3-2), the lower alkyl group or halogenated lower alkyl group for R is the same as the lower alkyl group or halogenated lower alkyl group which may be bonded to the α-position of the acrylate ester.

In formula (a3-1), k is preferably 1. The cyano group is preferably bonded to the 5th or 6th position of the norbonyl group.

In formula (a3-2), t' is preferably 1, l is preferably 1 and s is preferably 1. It is preferable that a 2-norbonyl group or 3-norbonyl group be bonded to the terminal of the carboxy group of the acrylic acid. The fluorinated alkylalcohol (a hydroxyalkyl group in which some of the hydrogen atoms of the alkyl group are substituted with fluorine atoms) is preferably bonded to the 5th or 6th position of the norbonyl group.

As the structural unit (a3), one type of structural unit may be used, or two or more types may be used in combination.

When the component (A) contains the structural unit (a3), the amount of structural unit (a3) based on the combined total of all structural units constituting the component (A) is preferably 1 to 30 mol %, more preferably 5 to 30 mol %, and still more preferably 10 to 20 mol %.

Structural Unit (a4)

The component (A) may have, in addition to the structural unit (a0-2) and the structural unit (a1), a structural unit (a4) as long as the effects of the present invention are not impaired.

As the structural unit (a4), any other structural unit which cannot be classified as one of the above structural units (a0-1), (a0-2) and (a1) to (a3) can be used without any particular limitations, and any of the multitude of conventional structural units used within resist resins for ArF excimer lasers or KrF excimer lasers (and particularly for ArF excimer lasers) can be used.

As the structural unit (a4), a structural unit which contains a non-acid-dissociable aliphatic polycyclic group, and is also derived from an acrylate ester is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, an adamantyl group, a tetracyclododecanyl group, an isobornyl group, and a norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 39]

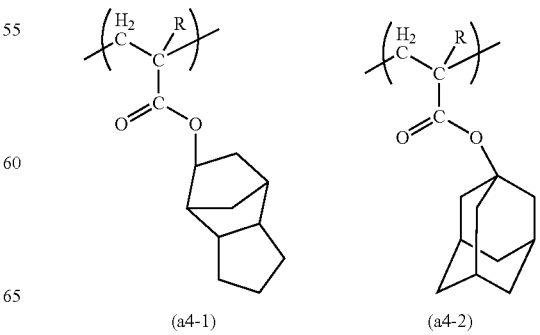

(a4-1)     (a4-2)

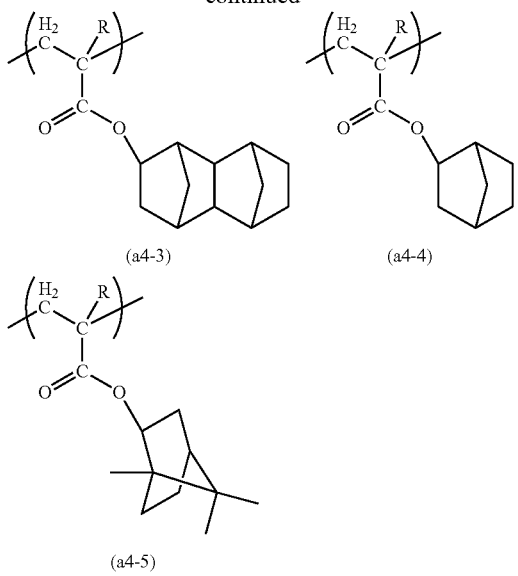

(a4-3)  (a4-4)

(a4-5)

wherein R is the same hydrogen atom, lower alkyl group or halogenated lower alkyl group as defined above.

The lower alkyl group or halogenated lower alkyl group for R of general formulas (a4-1) to (a4-5) are the same as the lower alkyl group or halogenated lower alkyl group which may be bonded to the α-position of the acrylate ester.

When the structural unit (a4) is included in the component (A), the amount of the structural unit (a4) based on the combined total of all the structural units that constitute the component (A) is preferably within the range from 1 to 30 mol %, and more preferably from 10 to 20 mol %.

In the present invention, the component (A) is preferably a copolymer (A2) having a structural unit (a0-1) represented by general formula (a0-1) and a structural unit (a0-2) represented by general formula (a0-2). Examples of the copolymer (A2) include a ternary copolymer consisting of the structural units (a0-1), (a0-2) and (a1) and a quaternary copolymer consisting of the structural units (a0-1), (a0-2), (a1) and (a2).

In the present invention, it is preferred to contain, as the copolymer (A2), at least any one among a copolymer (A-21) including three types of structural units shown in general formula (A-21) below, a copolymer (A-22) including three types of structural units shown in general formula (A-22) below, a copolymer (A-23) including three types of structural units shown in general formula (A-23) below and a copolymer (A-24) including fours types of structural units shown in general formula (A-24) below. It is particularly preferred to contain the copolymer (A-21). In the component (A), as the copolymer (A2), one type may be used alone, or two or more types may be used in combination.

[Chemical Formula 40]

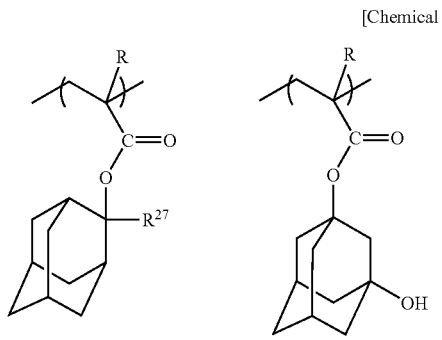

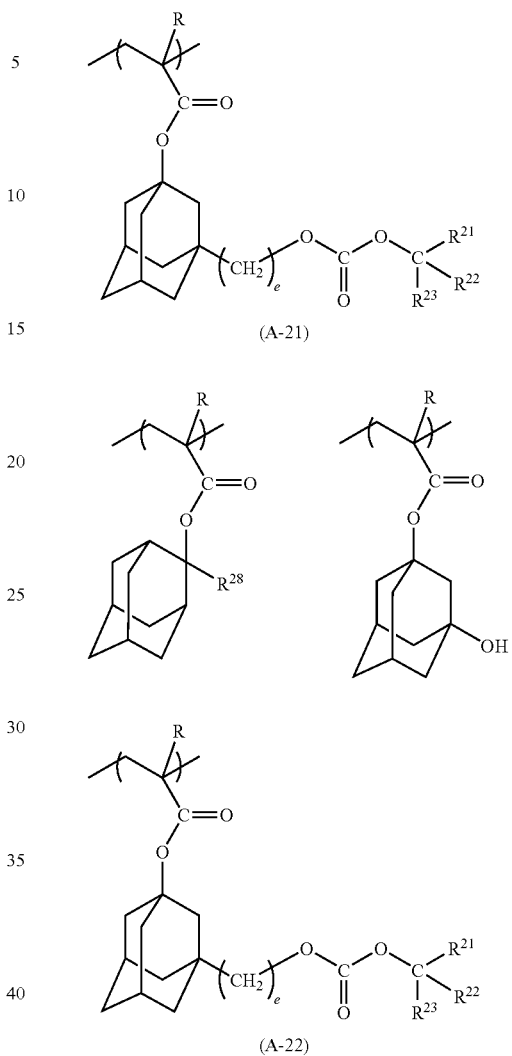

In formula (A-21), R is a hydrogen atom, a lower alkyl group or a halogenated lower alkyl group (with the proviso that R in the structural unit as the structural unit (a0-2) is a hydrogen atom, a halogen atom, a lower alkyl group or a halogenated lower alkyl group), e is the same as e in general formula (a0-1), $R^{21}$ to $R^{23}$ are the same as $R^{21}$ to $R^{23}$ in general formula (I), the plurality of R may be the same or different, and $R^{27}$ is a lower alkyl group. In formula (A-22), R is a hydrogen atom, a lower alkyl group or a halogenated lower alkyl group (with the proviso that R in the structural unit as the structural unit (a0-2) is a hydrogen atom, a halogen atom, a lower alkyl group or a halogenated lower alkyl group), e is the same as e in general formula (a0-1), $R^{21}$ to $R^{23}$ are the same as $R^{21}$ to $R^{23}$ in general formula (I), the plurality of R may be the same or different, and $R^{28}$ is a lower alkyl group.

In general formula (A-21), as the lower alkyl group for $R^{27}$, the same as the lower alkyl group for R can be exemplified.

In general formula (A-22), as the lower alkyl group for $R^{28}$, the same as the lower alkyl group for R can be exemplified.

[Chemical Formula 41]

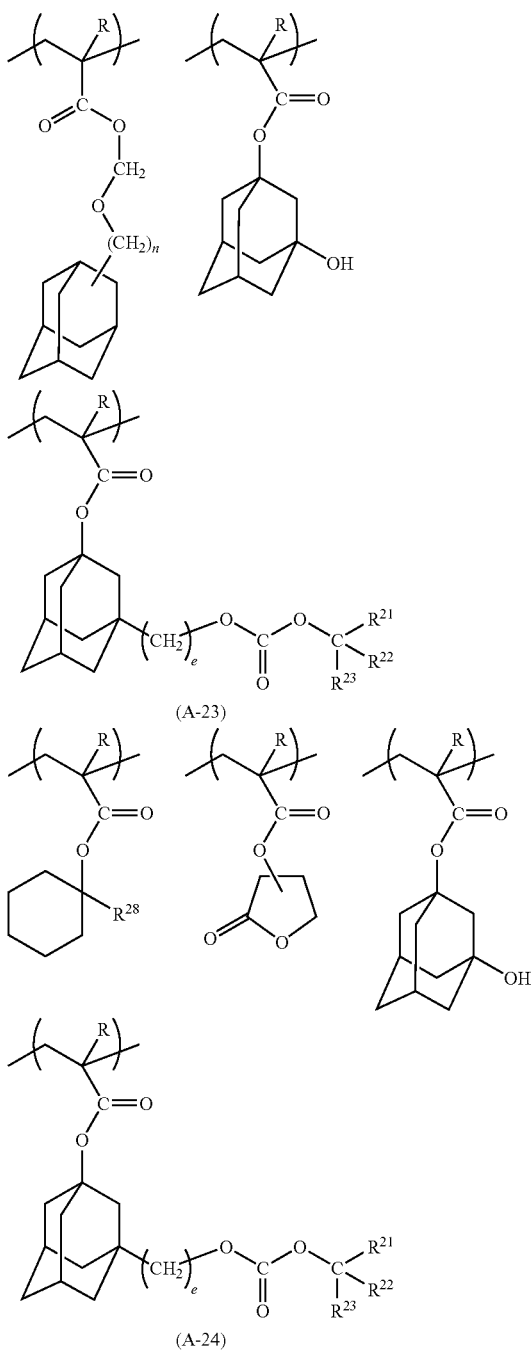

In formula (A-23), R is a hydrogen atom, a lower alkyl group or a halogenated lower alkyl group (with the proviso that R in the structural unit as the structural unit (a0-2) is a hydrogen atom, a halogen atom, a lower alkyl group or a halogenated lower alkyl group), e is the same as e in general formula (a0-1), $R^{21}$ to $R^{23}$ are the same as $R^{21}$ to $R^{23}$ in general formula (I), the plurality of R may be the same or different, and n is the same as n in general formula (p1). In formula (A-24), R is a hydrogen atom, a lower alkyl group or a halogenated lower alkyl group (with the proviso that R in the structural unit as the structural unit (a0-2) is a hydrogen atom, a halogen atom, a lower alkyl group or a halogenated lower alkyl group), e is the same as e in general formula (a0-1), $R^{21}$ to $R^{23}$ are the same as $R^{21}$ to $R^{23}$ in general formula (I), and the plurality of R may be the same or different.

The component (A) may contain one or more types of both of the above-mentioned structural unit (a0-1) and structural unit (a0-2), or may be a mixture of a polymer having at least the structural unit (a0-1) and a polymer having at least the structural unit (a0-2).

The component (A) can be obtained, for example, by a conventional radical polymerization or the like of the monomers corresponding to each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group can be introduced at the terminals of the component (A). Such a copolymer having introduced a hydroxyalkyl group in which some of the hydrogen atoms of the alkyl group are substituted with fluorine atoms is effective in reducing LWR (Line Width Roughness), developing defects and LER (line edge roughness: unevenness of the side walls of a line pattern).

The weight average molecular weight (Mw) (the polystyrene equivalent value determined by gel permeation chromatography) of the component (A) is not particularly limited, but is preferably 2,000 to 50,000, more preferably 3,000 to 30,000, still more preferably 5,000 to 20,000, and most preferably 5,000 to 10,000. By making the weight average molecular weight no more than 50,000, the component (A) exhibits satisfactory solubility in a resist solvent when used as a resist. On the other hand, by making the weight average molecular weight at least as large as 2,000, dry etching resistance and cross-sectional shape of the resist pattern becomes satisfactory.

Although there is no particular limitation, the dispersity (Mw/number average molecular weight (Mn)) is preferably 1.0 to 5.0, more preferably 1.0 to 3.0, and most preferably 1.2 to 2.5.

Here, Mn is the number average molecular weight.

<Component (B)>

As the component (B), there is no particular limitation as long as it is an acid generator other than the component (B1), and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator a compound represented by general formula (b-1) or (b-2) shown below can be preferably used.

[Chemical Formula 42]

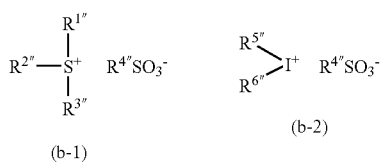

wherein $R^{1\prime\prime}$ to $R^{3\prime\prime}$, $R^{5\prime\prime}$ and $R^{6\prime\prime}$ each independently represents an aryl group which may have a substituent or alkyl group which may have a substituent, wherein two of $R^{1\prime\prime}$ to $R^{3\prime\prime}$ in formula (b-1) may be bonded to each other to form a ring with the sulfur atom; and $R^{4\prime\prime}$ represents a linear, branched or cyclic alkyl group or fluorinated alkyl group which may have a substituent, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In general formula (b-1), $R^{1\prime\prime}$ to $R^{3\prime\prime}$ each independently represents an aryl group or an alkyl group. In general formula (b-1), two of $R^{1\prime\prime}$ to $R^{3\prime\prime}$ in formula (b-1) may be bonded to each other to form a ring with the sulfur atom. Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with alkyl groups, alkoxy groups, halogen atoms, hydroxyl groups, alkoxyalkyloxy groups or alkoxycarbonylalkyloxy groups. The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group, an ethoxy group, an n-propoxy group, an iso-propoxy group, an n-butoxy group or a tert-butoxy group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkoxyalkyloxy group, with which hydrogen atoms of the aryl group may be substituted, includes groups represented by general formula: —O—C($R^{47}$)($R^{48}$)—O—$R^{49}$, in which $R^{47}$ and $R^{48}$ each independently represents a hydrogen atom, or a linear or branched alkyl group, and $R^{49}$ is an alkyl group.

In $R^{47}$ and $R^{48}$, the alkyl group preferably has 1 to 5 carbon atoms, and may be either linear or branched, and is preferably an ethyl group or a methyl group, and most preferably a methyl group.

At least one of $R^{47}$ and $R^{48}$ is preferably a hydrogen atom. It is more preferred that one is a hydrogen atom and the other one is a hydrogen atom or a methyl group.

The alkyl group for $R^{49}$ has preferably 1 to 15 carbon atoms, and may be linear, branched or cyclic.

The linear or branched alkyl group for $R^{49}$ has 1 to 5 carbon atoms and is preferably a methyl group, an ethyl group, a propyl group, an n-butyl group or a tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, and which may or may not be substituted with alkyl groups of 1 to 5 carbon atoms, fluorine atoms or fluorinated alkyl groups. Examples of the monocycloalkane include cyclopentane and cyclohexane. Examples of the polycycloalkane include adamantane, norbornane, isobornane, tricyclodecane and tetracyclododecane. Of these groups, those in which one or more hydrogen atoms have been removed from the adamantane are preferred.

The alkoxycarbonylalkyloxy group, with which hydrogen atoms of the aryl group may be substituted, includes groups represented by general formula: —O—$R^{50}$—C(=O)—O—$R^{51}$, in which $R^{50}$ is a linear or branched alkylene group, and $R^{51}$ is a tertiary alkyl group.

The linear or branched alkylene group for $R^{50}$ preferably has 1 to 5 carbon atoms and examples thereof include a methylene group, an ethylene group, a trimethylene group, a tetramethylene group and a 1,1-dimethylethylene group.

Examples of the tertiary alkyl group for $R^{51}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. Among these, a linear alkyl group is preferable, and a methyl group is most preferable because it is excellent in resolution and can be synthesized at a low cost.

It is most preferred that $R^{1\prime\prime}$ to $R^{3\prime\prime}$ each represents a phenyl group or a naphthyl group.

When two of $R^{1\prime\prime}$ to $R^{3\prime\prime}$ in formula (b-1) are bonded to each other to form a ring with the sulfur atom, it is preferable that the two of $R^{1\prime\prime}$ to $R^{3\prime\prime}$ form a 3- to 10-membered ring including the sulfur atom, and it is particularly desirable that two of $R^{1\prime\prime}$ to $R^{3\prime\prime}$ form a 5- to 7-membered ring including the sulfur atom.

When two of $R^{1\prime\prime}$ to $R^{3\prime\prime}$ in formula (b-1) are bonded to each other to form a ring with the sulfur atom, the remaining one of $R^{1\prime\prime}$ to $R^{3\prime\prime}$ is preferably an aryl group. As examples of the aryl group, the same as the above-mentioned aryl groups for $R^{1\prime\prime}$ to $R^{3\prime\prime}$ can be exemplified.

$R^{4\prime\prime}$ represents a linear, branched or cyclic alkyl group or fluorinated alkyl group which may have a substituent. Examples of the substituent, which may be included in $R^{4\prime\prime}$, include a halogen atom, a hetero atom and an alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and a fluorinated alkyl group in which all hydrogen atoms are substituted with fluorine atoms (i.e., a perfluoroalkyl group) is particularly desirable because the acid strength increases.

$R^{4\prime\prime\prime}$ is most preferably a linear or cyclic alkyl group or fluorinated alkyl group.

In formula (b-2), $R^{5\prime\prime\prime}$ and $R^{6\prime\prime\prime}$ each independently represents an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime\prime\prime}$ to $R^{3\prime\prime\prime}$ can be exemplified.

As the alkyl group for $R^{5\prime\prime\prime}$ and $R^{6\prime\prime\prime}$, the same as the alkyl groups for $R^{1\prime\prime\prime}$ to $R^{3\prime\prime\prime}$ can be exemplified.

It is particularly desirable that both of $R^{5\prime\prime\prime}$ and $R^{6\prime\prime\prime}$ represents a phenyl group.

As $R^{4\prime\prime\prime}$ in formula (b-2), the same as those mentioned above for $R^{4\prime\prime\prime}$ in formula (b-1) can be exemplified.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 43]

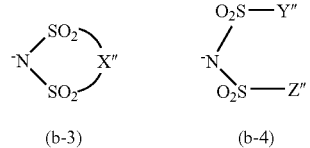

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or the electron beam is improved. The amount of fluorine atoms within the alkylene group or alkyl group, i.e., fluorination ratio, is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Further, onium salt-based acid generators in which the anion moiety in general formula (b-1) or (b-2) is replaced by an anion moiety represented by general formula (b1-12) shown below (the cation moiety is the same as in b-1) or (b-2)) may be used.

$$R^2-O-Y^{1\prime}-SO_3^- \qquad (b1\text{-}12)$$

wherein $R^2$ is a monovalent aromatic organic group; and $Y^{1\prime}$ is an alkylene group of 1 to 4 carbon atoms which may be substituted with fluorine.

In general formula (b1-12), $R^2$ is a monovalent aromatic organic group; and $Y^{1'}$ is an alkylene group of 1 to 4 carbon atoms which may be substituted with fluorine.

Examples of the monovalent aromatic organic group for $R^2$ include groups in which one hydrogen atom has been removed from an aromatic hydrocarbon ring, such as a phenyl group, a biphenyl group, a fluorenyl group, a naphthyl group, an anthryl group, and a phenanthryl group; heteroaryl groups in which some of the carbon atoms constituting the ring(s) of these groups are substituted with hetero atoms such as an oxygen atom, a sulfur atom, and a nitrogen atom; and arylalkyl groups such as a benzyl group and a phenethyl group. The alkyl chain in the arylalkyl group preferably has 1 to 4 carbon atoms, more preferably 1 to 3 carbon atoms, and particularly preferably 1 to 2 carbon atoms. These aryl group, heteroaryl group and arylalkyl group may have substituents such as an alkyl group of 1 to 10 carbon atoms, a halogenated alkyl group, an alkoxy group, a hydroxyl group and a halogen atom. The alkyl group or halogenated alkyl group as the substituent preferably has 1 to 8 carbon atoms, and more preferably 1 to 4 carbon atoms. The halogenated alkyl group is preferably a fluorinated alkyl group. The halogen atom includes, a fluorine atom, a chlorine atom, an iodine atom or a bromine atom, and is preferably a fluorine atom.

The monovalent aromatic organic group for $R^2$ preferably has 6 to 20 carbon atoms, more preferably 6 to 10 carbon atoms, and particularly preferably 10 carbon atoms.

The monovalent aromatic organic group for $R^2$ is more preferably an arylalkyl group such as a benzyl group or a phenethyl group, and particularly preferably a benzyl group.

Examples of the alkylene group of 1 to 4 carbon atoms, which may be substituted with fluorine, for $Y^{1'}$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—$CH_2CF_2CF_2$—, —$CH(CF_3)CH_2$—, —CH($CF_2CF_3$)—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—;—$CH_2$—, —$CH_2CH_2$—, —$CH_2CH_2CH_2$—,—$CH(CH_3)CH_2$—, —$CH(CH_2CH_3)$—, —C($CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$— and —$C(CH_3)(CH_2CH_3)$—.

The alkylene group of 1 to 4 carbon atoms, which may be substituted with fluorine, for $Y^{1'}$ is an alkylene group in which carbon atoms bonded to S are fluorinated, and examples of the fluorinated alkylene group include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$— and —$CH_2CF_2CF_2CF_2$—.

Of these, —$CF_2CF_2$—, —$CF_2CF_2CF_2$— or —$CH_2CF_2CF_2$— is preferred, —$CF_2CF_2$— or —$CF_2CF_2CF_2$— is more preferred, and —$CF_2CF_2$— is particularly preferred.

Specific examples of the onium salt-based acid generators in which the anion moiety is replaced by an anion moiety represented by general formula (b1-12) include compounds represented by formulas (b-12-1) to (b-12-18) shown below.

[Chemical Formula 44]

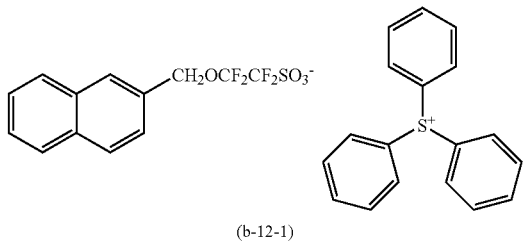

(b-12-1)

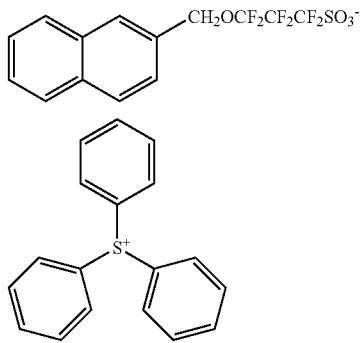

(b-12-2)

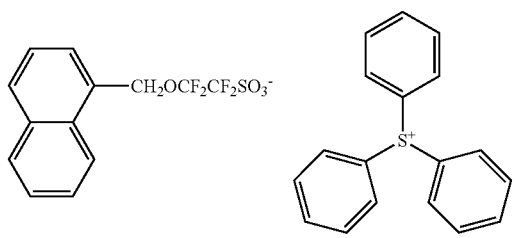

(b-12-3)

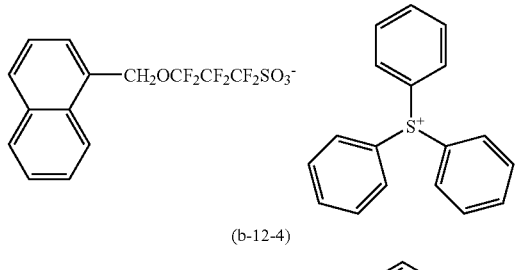

(b-12-4)

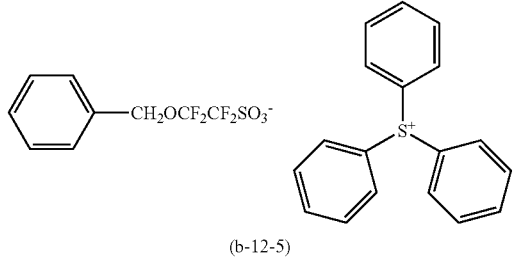

(b-12-5)

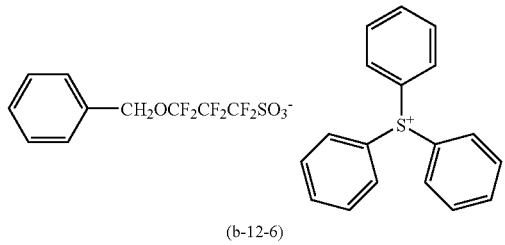

(b-12-6)

[Chemical Formula 45]
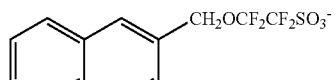
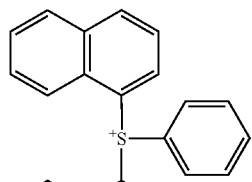
(b-12-7)
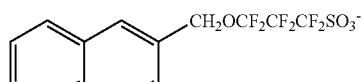
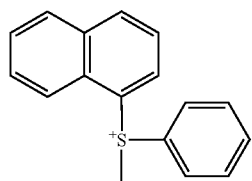
(b-12-8)
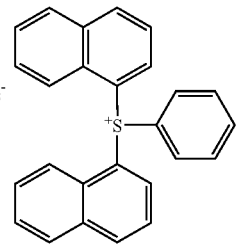
(b-12-9)
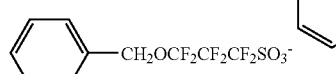
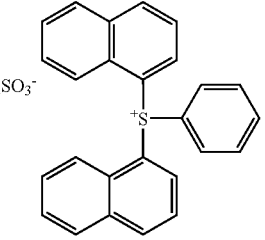
(b-12-10)
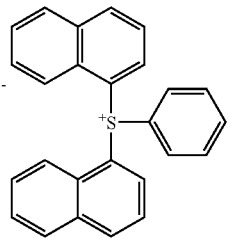
(b-12-11)
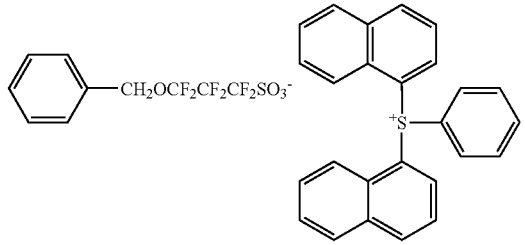
(b-12-12)
[Chemical Formula 46]
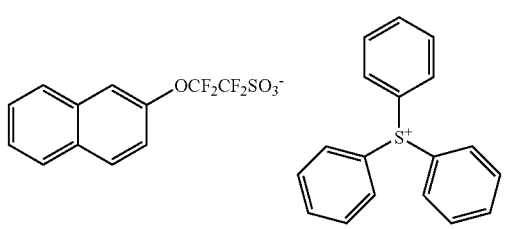
(b-12-13)
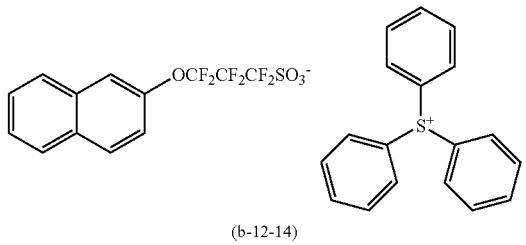
(b-12-14)
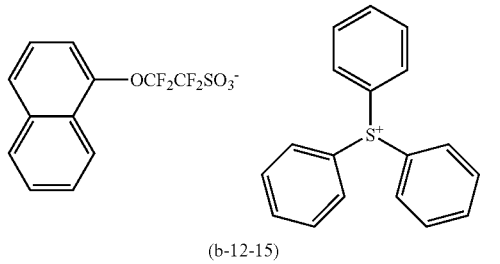
(b-12-15)
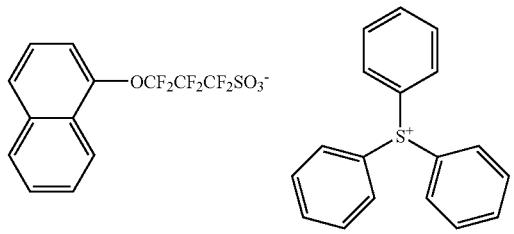
(b-12-16)
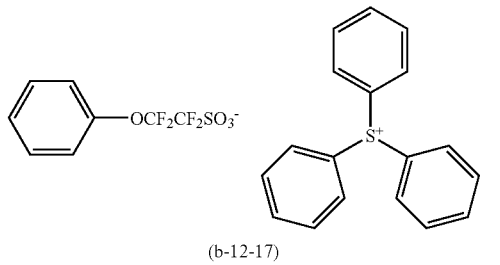
(b-12-17)

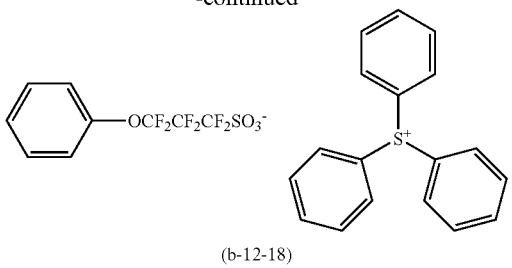

(b-12-18)

Sulfonium salts having a cation moiety represented by general formula (b-5) or (b-6) shown below can also be used as the onium salt-based acid generator.

[Chemical Formula 47]

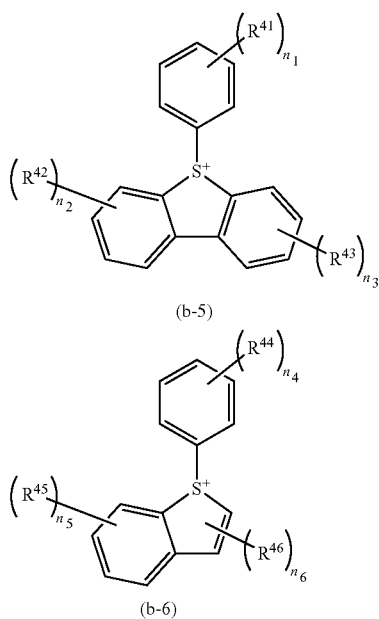

wherein $R^{41}$ to $R^{46}$ each independently represents an alkyl group, an acetyl group, an alkoxy group, a carboxy group, a hydroxyl group or a hydroxyalkyl group; $n_1$ to $n_5$ each independently represents an integer of 0 to 3; and $n_6$ is an integer of 0 to 2.

In $R^{41}$ to $R^{46}$, the alkyl group is preferably an alkyl group of 1 to 5 carbon atoms, more preferably a linear or branched alkyl group, and particularly preferably a methyl group, an ethyl group, a propyl group, an isopropyl group, an n-butyl group or a tert-butyl group.

The alkoxy group is preferably an alkoxy group of 1 to 5 carbon atoms, more preferably a linear or branched alkoxy group, and particularly preferably a methoxy group or an ethoxy group.

The hydroxyalkyl group is preferably a group in which one or plural hydrogen atom(s) in the alkyl group is/are substituted on the hydroxy group, and examples thereof include a hydroxymethyl group, a hydroxyethyl group and a hydroxypropyl group.

When the subscripts $n_1$ to $n_6$ of $R^{41}$ to $R^{46}$ represent an integer of 2 or more, the plurality of $R^{41}$ to $R^{46}$ may be the same or different.

$n_1$ is preferably 0 to 2, more preferably 0 or 1, and still more preferably 0.

It is preferable that $n_2$ and $n_3$ each independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4''}SO_3^-$) for onium salt-based acid generators represented by general formula (b-1) or (b-2) shown above and anion moieties represented by general formula (b-3) or (b-4) shown above. Among these, fluorinated alkylsulfonic acid ions are preferable, more preferably fluorinated alkylsulfonic acid ions of 1 to 4 carbon atoms, and linear perfluoroalkylsulfonic acid ions of 1 to 4 carbon atoms are particularly desirable. Specific examples include a trifluoromethylsulfonic acid ion, heptafluoro-n-propylsulfonic acid ion and nonafluoro-n-butylsulfonic acid ion.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 48]

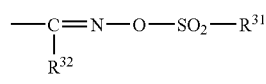

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

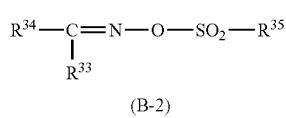

[Chemical Formula 49]

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

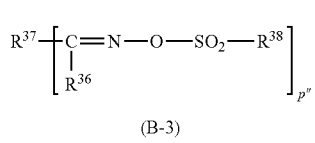

[Chemical Formula 50]

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, and still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino) -2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl] acetonitrile, α-[(dodecylbenzenesulfonyloxyimino)-4-methoxyphenyl] acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 51]

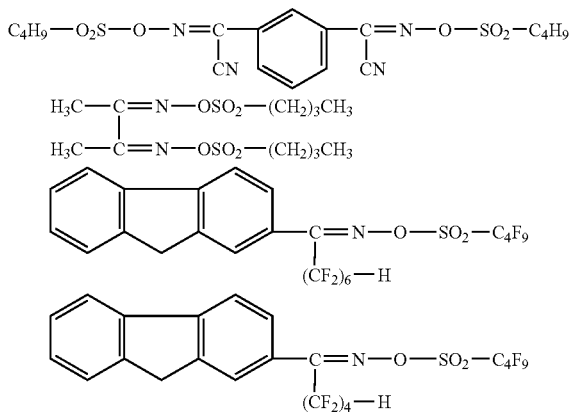

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of these acid generators may be used alone, or two or more types may be used in combination.

In the present invention, it is preferred to use, as the component (B), onium salts containing a fluorinated alkylsulfonic acid ion as an anion.

The content of the component (B) in the positive resist composition of the present invention is 0.5 to 30 parts by weight, and preferably 1 to 10 parts by weight, based on 100 parts by weight of the component (A). By making the content of the component (B) within the above-mentioned range, a pattern is satisfactorily formed. It is preferred since a uniform solution is obtained and storage stability is improved.

<Component (S)>

The positive resist composition of the present invention is obtained by dissolving the component (A) and the component (B) in an organic solvent (S) (hereinafter may be referred to as the component (S)).

In the positive resist composition of the present invention, the component (S) is an organic solvent which does not dissolve a first resist film described hereinafter and also can dissolve the component (A) and the component (B). By containing the component (S), even when the positive resist composition of the present invention is applied on a substrate on which a first resist pattern formed of a first positive resist composition described hereinafter is formed, the first resist pattern is hardly dissolved and a resist pattern can be stably formed by a double patterning process.

The component (S) is not particularly limited as long as it is an organic solvent, which scarcely has compatibility with a first resist film described hereinafter and also dissolve the component (A) and the component (B) to form a uniform solution, and there can be used one or more types of arbitrary solvents selected from conventionally known solvents for a chemically amplified photoresist.

Component (S1)

In the positive resist composition of the present invention, the component (S) is particularly preferably an alcohol-based organic solvent (hereinafter may be referred to as the component (S1)).

Here, the term "alcohol-based organic solvent" refers to a compound in which at least one hydrogen atom of an aliphatic hydrocarbon has been substituted with a hydroxyl group, and is liquid at normal temperature under normal pressure.

The component (S1) is preferably a monohydric alcohol, more preferably a primary or secondary monohydric alcohol, although it depends on the number of carbon atoms, and most preferably a primary monohydric alcohol.

The boiling point of the alcohol-based organic solvent is preferably 80 to 160° C., more preferably 90 to 150° C., and most preferably 100 to 135° C., in terms of coatability, stability of the composition during storage, and heating temperature of a prebaked treatment (PAB step) and a post exposure bake treatment (PEM step).

Here, the monohydric alcohol means that the number of hydroxy groups contained in the alcohol molecule is one, and a dihydric alcohol, or a trihydric alcohol and derivatives thereof are not included.

Examples of the alcohol-based organic solvent include n-pentyl alcohol (boiling point 138.0° C.), s-pentyl alcohol (boiling point 119.3° C.), t-pentyl alcohol (boiling point 101.8° C.), isopentyl alcohol (boiling point 130.8° C.), isobutanol (also referred to as isobutyl alcohol or 2-methyl-1-propanol) (boiling point 107.9° C.), isopropyl alcohol (boiling point 82.3° C.), 2-ethyl butanol (boiling point 147° C.), neopentyl alcohol (boiling point 114° C.), n-butanol (boiling point 117.7° C.), s-butanol (boiling point 99.5° C.), t-butanol (boiling point 82.5° C.), 1-propanol (boiling point 97.2° C.), n-hexanol (boiling point 157.1° C.), 2-heptanol (boiling point 160.4° C.), 3-heptanol (boiling point 156.2° C.), 2-methyl-1-butanol (boiling point 128.0° C.), 2-methyl-2-butanol (boiling point 112.0° C.) and 4-methyl-2-pentanol (boiling point 131.8° C.). Since satisfactory effect of containing the component (S1) is exerted, isobutanol (2-methyl-1-propanol), 4-methyl-2-pentanol and n-butanol are preferred. Of these, isobutanol and n-butanol are preferred, and isobutanol is most preferred.

As the components (S1), one type thereof may be used alone, or two or more types may be used in combination.

In the present invention, it is particularly preferred to contain isobutanol as the component (S1).

The content of the component (S1) in the component (S) is preferably 50% by weight or more and 100% by weight or less, more preferably 80% by weight or more, and most preferably 100% by weight. By making the content of the component (S1) in the component (S) no less than 50% by weight, a first resist pattern is dissolved more hardly when the positive resist composition of the present invention is applied.

Component (S2)

The component (S) may contain, in addition to the component (S1), an ether-based organic solvent containing no hydroxyl group (hereinafter may be referred to as the component (S2)) as long as the effects of the present invention are not impaired.

Here, the term "ether-based organic solvent containing no hydroxyl group" refers to a compound which contains an ether bond (C—O—C) and contains no hydroxyl group in the structure, and is also liquid at normal temperature under normal pressure.

It is more preferred that the ether-based organic solvent containing no hydroxyl group contains neither a hydroxyl group nor a carbonyl group As the ether-based organic solvent containing no hydroxyl group, a compound represented by general formula (s1'-1) shown below is exemplified as a preferable one.

$$R^{40}\text{—}O\text{—}R^{41} \quad (s1'\text{-}1)$$

wherein $R^{40}$ and $R^{41}$ each independently represents a hydrocarbon group, or $R^{40}$ and $R^{41}$ may be bonded to each other to form a ring, and —O— represents an ether bond.

In general formula (s1'-1) shown above, the hydrocarbon group for $R^{40}$ and $R^{41}$ is an alkyl group or an aryl group, and preferably an alkyl group. Both of $R^{40}$ and $R^{41}$ are preferably alkyl groups, and $R^{40}$ and $R^{41}$ are more preferably the same alkyl group.

There is no particular limitation on each alkyl group for $R^{40}$ and $R^{41}$ and, for example, a linear, branched or cyclic alkyl group of 1 to 20 carbon atoms is exemplified. Hydrogen atoms of the alkyl group may or may not be partially or completely substituted with halogen atoms.

In terms of satisfactory coatability of the resist composition, the alkyl group preferably has 1 to 15 carbon atoms, and more preferably 1 to 10 carbon atoms. Specific examples thereof include an ethyl group, a propyl group, an isopropyl group, an n-butyl group, an isobutyl group, an n-pentyl group, an isopentyl group, a cyclopentyl group and a hexyl group. Of these, an n-butyl group and an isopentyl group are particularly preferred.

The halogen atom, with which hydrogen atoms of the alkyl group may be substituted, is preferably a fluorine atom.

There is no particular limitation on each aryl group for $R^{40}$ and $R^{41}$ and, for example, hydrogen atoms of the aryl group of 6 to 12 carbon atoms may or may not be partially or completely substituted with alkyl groups, alkoxy groups or halogen atoms.

The aryl group is preferably an aryl group of 6 to 10 carbon atoms since synthesis can be conducted at low cost. Specific examples thereof include a phenyl group, a benzyl group and a naphthyl group.

The alkyl group, with which hydrogen atoms of the aryl group may be substituted, is preferably an alkyl group of 1 to 5 carbon atoms, and more preferably a methyl group, an ethyl group, a propyl group, an n-butyl group or a tert-butyl group.

The alkoxy group, with which hydrogen atoms of the aryl group may be substituted, is preferably an alkoxy group of 1 to 5 carbon atoms, and more preferably a methoxy group or an ethoxy group.

The halogen atom, with which hydrogen atoms of the aryl group may be substituted, is preferably a fluorine atom.

In general formula (s1'-1), $R^{40}$ and $R^{41}$ may be bonded to each other to form a ring.

$R^{40}$ and $R^{41}$ each independently represents a linear or branched alkylene group (preferably an alkylene group of 1 to 10 carbon atoms) and the terminal of $R^{40}$ and the terminal of $R^{41}$ are bonded to each other to form a ring. Carbon atoms of the alkylene group may be substituted with oxygen atoms.

Specific examples of the ether-based organic solvent include 1,8-cineol, tetrahydrofuran and dioxane.

The boiling point (under normal pressure) of the ether-based organic solvent containing no hydroxyl group is preferably 30 to 300° C., more preferably 100 to 200° C., and still more preferably 140 to 180° C. By making the boiling point of the ether-based organic solvent containing no hydroxyl group no less than 30° C., the component (S) is hardly vaporized during spin-coating upon application of the positive resist composition of the present invention, and thus coating unevenness is suppressed and coatability is improved. On the other hand, by making the boiling point no more than 300° C., the component (S) is sufficiently removed from the resist film and second resist film-forming properties are improved. By making the boiling point of the ether-based organic solvent containing no hydroxyl group within the above-mentioned range, the effect of reducing thickness loss of the resist pattern and stability of the composition during storage are more improved. It is also preferred in terms of the heating temperature of the PAB step and the PEB step.

Specific examples of the ether-based organic solvent containing no hydroxyl group include 1,8-cineol (boiling point 176° C.), dibutylether (boiling point 142° C.), diisopentylether (boiling point 171° C.), dioxane (boiling point 101° C.), anisole (boiling point 155° C.), ethylbenzylether (boiling point 189° C.), diphenylether (boiling point 259° C.), dibenzylether (boiling point 297° C.), phenetole (boiling point 170° C.), butyl phenyl ether, tetrahydrofuran (boiling point 66° C.), ethyl propyl ether (boiling point 63° C.), diisopropylether (boiling point 69° C.), dihexylether (boiling point 226° C.) and dipropylether (boiling point 91° C.).

As the component (S2), one type thereof may be used alone, or two or more types may be used in combination.

In the present invention, the component (S2) is preferably a cyclic or chain ether-based organic solvent since satisfactory effect of reducing thickness loss of a resist pattern is exerted, and is particularly preferably at least one selected from the group consisting of 1,8-cineol, dibutylether and diisopentylether.

Component (S3)

The component (S) can contain, in addition to the component (S1), an organic solvent other than the component (S1) and the component (S2) (hereinafter referred to as the component (S3)) as long as the effects of the present invention are not impaired. Characteristics such as solubility of the component (A) and the component (B) can be adjusted by using in combination with the component (S3).

As the component (S3), there can be used one or more types of arbitrary solvents selected from conventionally known solvents for a chemically amplified photoresist.

Examples of the component (S3) include lactones such as γ-butyrolactone; ketones such as acetone, methyl ethyl ketone, cyclohexanone, methyl-n-pentylketone, methyl isopentyl ketone and 2-heptanone; polyhydric alcohols such as ethylene glycol, diethylene glycol, propylene glycol and dipropylene glycol; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane, and esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic-based organic solvents such as anisole, ethyl benzyl ether, cresyl methyl ether, diphenylether, dibenzylether, phenetole, butyl phenyl ether, ethylbenzene, diethylbenzene, pentylbenzene, isopropylbenzene, toluene, xylene, cymene and mesitylene.

As the compound (S3), one type thereof may be used alone, or two or more types may be used in combination.

The amount of the component (S3) is not particularly limited, and is appropriately adjusted to a concentration which enables coating of a coating solution to a substrate.

<Arbitrary components>

[Component (D)]

The positive resist composition of the present invention can further comprise, as an arbitrary component, a nitrogen-containing organic compound (D) (hereinafter referred to as the component (D)) so as to improve resist pattern shape and post exposure stability of the latent image formed by the pattern-wise exposure of the resist layer.

The component (D) can be selected appropriately from the multitude of known compounds, and is preferably a cyclic amine or aliphatic amine, and particularly preferably a secondary aliphatic amine or tertiary aliphatic amine. Here, the aliphatic amine refers to an amine containing one or more aliphatic groups, and the aliphatic group preferably has 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines. Specific examples thereof include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkylalcoholamines such as diethanolamine, triethanolamine, diisopropanolamine, triisopropanolamine, di-n-octanolamine, and tri-n-octanolamine.

Of these, an alkylalcoholamine and a trialkylamine are preferred, and an alkylalcoholamine is most preferred. Of the alkylalcoholamines, triethanolamine and triisopropanolamine are most preferred.

Examples of the cyclic amine include heterocycle compounds containing a nitrogen atom as a hetero atom. The heterocyclic compound may be a monocyclic compound (aliphatic monocyclic amine), or a polycyclic compound (aliphatic polycyclic amine)

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight based on 100 parts by weight of the component (A).

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

The component (E) is typically used in an amount within a range from 0.01 to 5.0 parts by weight, based on 100 parts by weight of the component (A).

In the double patterning process in which a positive resist composition is used as a first resist composition, when the positive resist composition of the present invention is used as a second resist composition, even when the positive resist composition of the present invention is directly applied on a first resist pattern formed on a substrate, a second resist pattern can be formed without damaging the first resist pattern. The reason why such an effect is exerted is not clear, but is considered as follows. Since the component (A) having structural units (a0-1) and (a0-2) can be sufficiently dissolved in an organic solvent such as an alcohol-based organic solvent, in which a conventional positive resist composition is hardly dissolved, it becomes possible to use, as the component (S), an organic solvent which does not dissolve a conventional positive resist composition. Namely, since the positive resist composition of the present invention can stably form a resist pattern by a double patterning process since the component (S) is an organic solvent which does not dissolve a first resist film described hereinafter and the first resist pattern is not easily dissolved.

The reason why the positive resist composition of the present invention has high solubility in an organic solvent such as an alcohol-based organic solvent in which a conventional positive resist composition is not easily dissolved is not clear, but is considered as follows. Almost all of the positive resist compositions which have conventionally been used for ArF excimer laser lithography contain a large amount of structural units having a structure such as a polar group-containing aliphatic hydrocarbon group, for example, "—Y¹ (aliphatic cyclic group) —OH" so as to increase affinity with a developing solution thereby improving alkali solubility at the exposed portions. On the other hand, the positive resist composition of the present invention contains, as the component (A), a structural unit (a0-1) having a structure such as "—Y'—$(CH_2)_e$—O—Z". It is estimated that Z in "—Y¹—$(CH_2)_e$—O—Z" has lower polarity than that of the hydrogen atom and also has commonly long molecular chain length and thus affinity of the component (A) with the alcohol-based organic solvent is enhanced thereby improving solubility. It is also estimated that, when the positive resist composition of the present invention includes, as the component (A) the structural unit (a0-2) in addition to the structural unit (a0-1), solubility in an alcohol-based organic solvent can be improved without deteriorating lithography characteristics.

<<Method of Forming a Resist Pattern>>

The method of forming a resist pattern of the present invention includes: applying a positive resist composition (hereinafter may be referred to as a first positive resist composition) on a substrate to form a first resist film on the substrate (hereinafter referred to as the film-forming step (1)); selectively exposing the first resist film and alkali-developing the first resist film to form a first resist pattern (hereinafter referred to as the patterning step (1)); applying the positive resist composition on the substrate on which the first resist pattern is formed to form a second resist film (hereinafter referred to as the film-forming step (2)); and selectively exposing the second resist film and alkali-developing the second resist film to form a resist pattern (hereinafter referred to as the patterning step (2)).

Each step will now be described in detail.

[Film forming step (1)]

The substrate is not specifically limited and a conventionally known substrate can be used. For example, substrates for electronic components, and such substrates having wiring patterns formed thereon can be exemplified. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-exemplified substrates provided with an inorganic and/or organic film on the surface thereof may be used. As the inorganic film, an inorganic antireflection film (inorganic BARC) can be exemplified. As the organic film, an organic antireflection film (organic BARC) can be exemplified.

The first resist film can be formed by a conventionally known method and can be formed, for example, by applying a positive resist composition on a substrate. The positive resist composition can be applied by a conventionally known method using a spinner or the like.

The positive resist composition used for formation of a first resist film (hereinafter may be referred to as a first positive resist composition) will be described in detail below.

Specifically, the first positive resist composition is applied on a substrate using a spinner or the like, and a bake treatment (prebake) is conducted under temperature conditions of 80 to 150° C. for 40 to 120 seconds, and preferably 60 to 90 seconds thereby volatilizing an organic solvent, and thus a first resist film can be formed.

The thickness of the resist film is preferably 50 to 500 nm, and more preferably 50 to 450 nm. By making the thickness of the resist film within the above-mentioned range, there can be exerted the effect of forming a resist pattern with high resolution and achieving sufficient resistance to etching.

[Patterning Step (1)]

The patterning step (1) can be conducted using a conventionally known method. For example, the first resist film is selectively exposed to an ArF excimer laser beam through a mask (mask pattern) having a desired pattern, followed by post exposure bake (PEB) under temperature conditions of 80 to 150° C. for 40 to 120 seconds, and preferably 60 to 90 seconds. Subsequently, developing is conducted using an alkali developing solution such as a 0.1 to 10% by weight aqueous solution of tetramethylammonium hydroxide (TMAH). Thus, the exposed portions of the first resist film are removed to form a plurality of resist patterns.

If desired, a post bake treatment can be conducted following the alkali-developing.

The wavelength to be used for exposure is not particularly limited and the exposure can be conducted using radiations such as KrF excimer laser, ArF excimer laser, $F_2$ excimer laser, extreme ultraviolet rays (EUV), vacuum ultraviolet rays (VUV), electron beam (EB), X-rays, and soft X-rays.

The selective exposure of the first resist film can be either a general exposure (dry exposure) conducted in air or an inert gas such as nitrogen, or immersion lithography.

In immersion lithography, exposure (immersion exposure) is conducted in a state where the region between the lens and the resist layer formed on a wafer (which was conventionally filled with air or an inert gas such as nitrogen) is filled with a solvent (an immersion medium) that has a larger refractive index than the refractive index of air.

More specifically, in immersion lithography, the region between the resist film formed in the above-described manner and lens at the lowermost portion of the exposure apparatus is filled with a solvent (an immersion medium) that has a larger refractive index than the refractive index of air, and in this state, the resist film is subjected to exposure (immersion exposure) through a desired mask pattern.

The immersion medium preferably exhibits a refractive index larger than the refractive index of air but smaller than the refractive index of the resist film (a first resist film in the pattering step (1)) to be subjected to immersion exposure. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

[Film-Forming Step (2)]

On the substrate on which the first resist pattern is formed, the positive resist composition of the present invention is applied to form a second resist film with which spaces between the plurality of resist patterns are filled. The second resist film can be formed by a conventionally known method similar to the first resist film.

The thickness of the second resist film is preferably at least the same as or more than the height of the first resist pattern. It is preferred that the surface of the substrate is flat in the case of seeing it from the side of the second resist film.

[Patterning Step (2)]

Next, a position, which is different from the position at which the plurality of resist patterns is formed, of the second resist film is selectively exposed and then developed. Thus, the unexposed portions of the second resist film are removed to form a plurality of resist patterns between the plurality of resist patterns. As a result, on the substrate, a resist pattern comprising a plurality of resist patterns and a plurality of resist patterns formed newly on the second resist film is formed.

In the present invention, except for the case of complete agreement with the first resist pattern, any position is the "position which is different from the position at which the first resist pattern is formed", and the case of no overlap and partial overlap are included.

In the present invention, it is preferred that the position at which the first resist pattern is formed and the position which is selectively exposed in the patterning step (2) are not overlapped at all. Thus, it is possible to form a pattern with a distance (pitch) between patterns which is narrower than that of the first resist pattern formed in the patterning step (1).

Selective exposure at a position which is different from that at which the first resist pattern is formed can be conducted by a method using a mask pattern, which is different from the first mask pattern used in the patterning step (1).

Referring to the case of forming a line and space pattern as an example, in the patterning step (1), a line and space coarse pattern was formed using a mask with a line and space pattern in which a plurality of patterns is disposed at a fixed pitch. In the patterning step (2), the mask pattern was changed and a line pattern was formed at a middle position of the line patterns formed in the patterning step (1), and thus a line and space resist pattern is formed at a pitch which is about ½ of the line and space pitch of the pattern formed first. Namely, a resist pattern with a pitch which is narrower than that of the coarse pattern formed first.

Here, the term "coarse pattern" refers to a line and space resist pattern with a larger space width as compared with a pattern with a ratio of a line width to a space width of 1:2 or more.

As described above, in the present invention, the first resist pattern is preferably a line and space resist pattern. Thus, a dense line and space pattern with a narrow pitch can be formed.

Specifically, a line and space resist pattern with a line width of 100 nm and a ratio of a line width to a space width of 1:3 (coarse pattern) is formed and a mask pattern is paralleltranslated to the line direction by 200 nm, and then a line and space resist pattern with a line width of 100 nm and a ratio of a line width to a space width of 1:3 (coarse pattern) is formed, and thus a line and space pattern with a line width of 100 nm and a ratio of a line width to a space width of 1:1 (dense pattern) can be formed.

It is also possible to form fine and/or various resist patterns by rotationally transferring the mask pattern used in the patterning step (1) or using a mask pattern which is different from that used in the patterning step (1) (for example, a line and space pattern used in the patterning step (1) and the hole mask pattern used in the patterning step (2)).

<First Positive Resist Composition>

In the above-mentioned film-forming step (1), the first positive resist composition that forms a first resist film is not particularly limited as long as it is a positive resist composition having low compatibility with the organic solvent (S) component, and is preferably a chemically amplified positive resist composition. There is no particular limitation on the chemically amplified positive resist composition, and it is possible to use those selected appropriately from among various positive resist compositions which have conventionally been proposed in ArF resists according to exposure light sources to be used, lithography characteristics and the like.

The chemically amplified positive resist composition usually contains a resin component (A') which exhibits increased solubility in an alkali developing solution under action of an acid (hereinafter referred to as the component (A')) and an acid-generator component (B') which generates an acid upon exposure (hereinafter referred to as the component (B')).

[Component (A')]

Structural Unit (a1)

In the first positive resist composition, the component (A') preferably contains a copolymer (A1) including a structural unit (a1). The structural unit (a1) is a structural unit derived from an acrylate ester containing an acid dissociable, dissolution inhibiting group, and is the same as those exemplified above in connection with the explanation of the structural unit (a1) which may be included in the component (A) of the positive resist composition according to the first aspect of the present invention.

As the structural unit (a1), one type may be used alone, or two or more types may be used in combination.

There is no particular limitation on the structural unit (a1) and arbitrary structural units can be used. A structural unit represented by general formula (a1-1) is preferred. Specifically, it is more preferred to use at least one selected from the group consisting of structural units (a1-1-1) to (a1-1-6) and (a1-1-35) to (a1-1-41).

The amount of the structural unit (a1) in the copolymer (A1) is preferably 10 to 80 mol %, more preferably 20 to 70 mol %, and still more preferably 25 to 50 mol %, based on the combined total of all structural units constituting the component (A1). By making the amount of the structural unit (a1) no less than 10 mol %, a pattern can be easily formed using a resist composition prepared. On the other hand, by making the amount of the structural unit (a1) no more than 80 mol %, a good balance can be achieved with the other structural units.

Structural Unit (a2)

The copolymer (A1) preferably has, in addition to the structural unit (a1), a structural unit (a2). The structural unit (a1) is a structural unit derived from an acrylate ester containing a lactone-containing cyclic group, and is the same as those exemplified above in connection with the explanation of the structural unit (a2) which may be included in the component (A) of the positive resist composition according to the first aspect of the present invention.

As the structural unit (a2), one type may be used alone, or two or more types may be used in combination.

There is no particular limitation on the structural unit (a2) and arbitrary structural units can be used. At least one type selected from the group consisting of structural units represented by general formulas (a2-1) to (a2-5) is preferred, at least one selected from the group consisting of structural units represented by general formulas (a2-1) to (a2-3) is more preferred. It is still more preferred to use at least one selected from the group consisting of structural units represented by general formulas (a2-1-1), (a2-1-2), (a2-2-1), (a2-2-2), (a2-2-9), (a2-2-10), (a2-3-1), (a2-3-2), (a2-3-9) and (a2-3-10).

The amount of the structural unit (a2) in the copolymer (A1) is preferably 5 to 60 mol %, more preferably 10 to 50 mol %, and still more preferably 20 to 50 mol %, based on the combined total of all structural units constituting the component (A1). By making the amount of the structural unit (a1) no less than 5 mol %, the effect of using the structural unit (a2) can be satisfactorily achieved. On the other hand, by making the amount of the structural unit (a1) no more than 60 mol %, a good balance can be achieved with the other structural units.

Structural Unit (a3')

The copolymer (A1) preferably has, in addition to the structural unit (a1), a structural unit (a3') derived from an acrylate ester containing a polar group-containing aliphatic hydrocarbon group.

When the component (A1) includes the structural unit (a3), the hydrophilicity of the component (A') is improved, and hence, the compatibility of the component (A') with the developing solution is improved. As a result, the alkali solubility of the exposed portions improves, which contributes to favorable improvements in the resolution.

Examples of the polar group include a hydroxyl group, a cyano group, a carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group that contains a hydroxyl group, a cyano group, a carboxyl group or a hydroxyalkyl group in which some of the hydrogen atoms of the alkyl group have been substituted with fluorine atoms are particularly desirable. Examples of polycyclic groups include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3') is preferably a structural unit derived from a hydroxyethyl ester of acrylic acid. On the other hand, when the hydrocarbon group is a polycyclic group, structural units represented by formulas (a3'-1), (a3'-2), and (a3'-3) shown below are preferable.

[Chemical Formula 52]

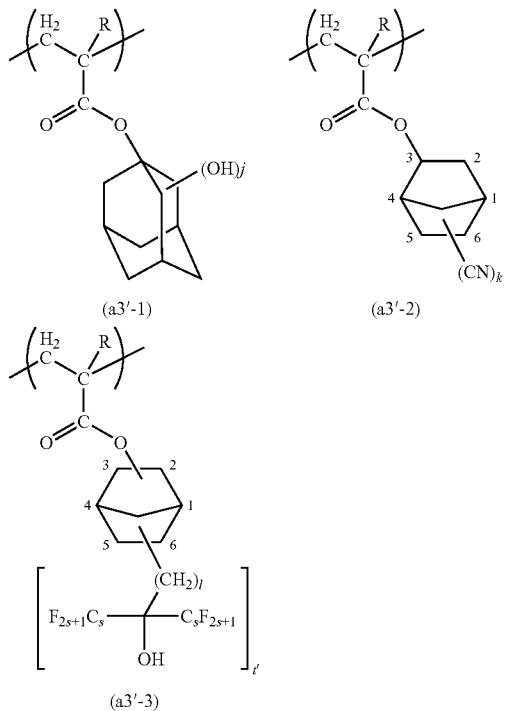

wherein R is a hydrogen atom, a lower alkyl group or a halogenated lower alkyl group; j is an integer of 1 to 3; k is an integer of 1 to 3; t' is an integer of 1 to 3; l is an integer of 1 to 5; and s is an integer of 1 to 3.

In general formula (a3'-1) to (a3'-3), the lower alkyl group or halogenated lower alkyl group for R is the same as the lower alkyl group or halogenated lower alkyl group which may be bonded to the α-position of the acrylate ester.

In formula (a3'-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group. j is preferably 1, and it is particularly desirable that the hydroxyl group be bonded to the 3rd position of the adamantyl group.

In formula (a3'-2), k is preferably 1. The cyano group is preferably bonded to the 5th or 6th position of the norbonyl group.

In formula (a3'-3), t' is preferably 1, l is preferably 1 and s is preferably 1. Further, it is preferable that a 2-norbonyl group or 3-norbonyl group be bonded to the terminal of the carboxy group of the acrylic acid. The fluorinated alkyl alcohol is preferably bonded to the 5th or 6th position of the norbonyl group.

As structural unit (a3'), one type may be used alone, or two or more types may be used in combination.

The amount of structural unit (a3') in the copolymer (A1) is preferably 5 to 50 mol %, more preferably 5 to 40 mol %, and still more preferably 5 to 25 mol %, based on the combined total of all structural units constituting the copolymer.

Structural Unit (a4')

The component (A1) may also have a structural unit (a4') which is other than the above-mentioned structural units (a1), (a2) and (a3') as long as the effects of the present invention are not impaired.

As the structural unit (a4'), any other structural unit which cannot be classified as one of the above structural units (a1), (a2) and (a3') can be used without any particular limitations, and any of the multitude of conventional structural units used within resist resins for ArF excimer lasers or KrF excimer lasers (and particularly for ArF excimer lasers) can be used. For example, those described in the positive resist composition according to the first aspect of the present invention can be used.

When the component (A1) contains the structural unit (a4'), the amount of structural unit (a4') based on the combined total of all structural units constituting the component (A1) is preferably 1 to 30 mol %, and more preferably 10 to 20 mol %.

In the first positive resist composition, the copolymer (A1) is preferably a copolymer having a structural unit (a1). Examples of such a copolymer include a copolymer consisting of the structural units (a1), (a2) and (a3).

In the component (A'), as the copolymer (A1), one type may be used alone, or two or more types may be used in combination.

In the first positive resist composition, the copolymer (A1) preferably contains a combination of structural units as shown in general formula (A-11) shown below.

[Chemical Formula 53]

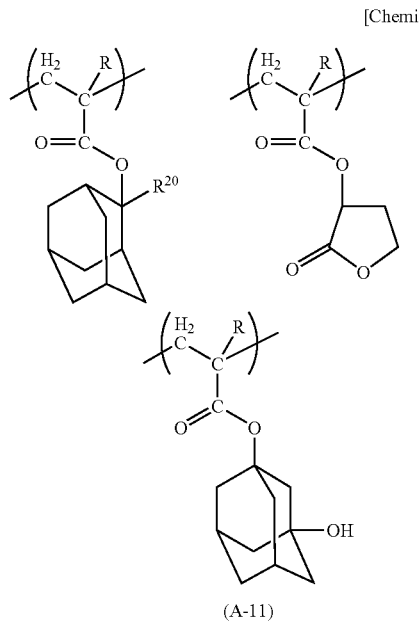

(A-11)

In formula (A-11), R is a hydrogen atom, a lower alkyl group or a halogenated lower alkyl group, and $R^{20}$ is a lower alkyl group.

The component (A') can be obtained, for example, by a conventional radical polymerization or the like of the monomers corresponding to each of the structural units, using a radical polymerization initiator such as azobisisobutyronitrile (AIBN).

Furthermore, in the component (A'), by using a chain transfer agent such as HS—$CH_2$—$CH_2$—$CH_2$—$C(CF_3)_2$—OH, a —$C(CF_3)_2$—OH group can be introduced at the terminals of the component (A'). Such a copolymer having introduced a hydroxyalkyl group in which some of the hydrogen atoms of the alkyl group are substituted with fluorine atoms is effective in reducing LWR, developing defects and LER (line edge roughness: unevenness of the side walls of a line pattern).

The weight average molecular weight (Mw) (the polystyrene equivalent value determined by gel permeation chromatography) of the component (A') is not particularly limited, but is preferably 2,000 to 50,000, more preferably 3,000 to 30,000, and most preferably 5,000 to 20,000. By making the weight average molecular weight no more than 50,000, the component (A') exhibits satisfactory solubility in a resist solvent when used as a resist. On the other hand, by making the weight average molecular weight no less than 2,000, dry etching resistance and cross-sectional shape of the resist pattern becomes satisfactory.

Further, the dispersity (Mw/number average molecular weight (Mn)) is not particularly limited and is preferably 1.0 to 5.0, more preferably 1.0 to 3.0, and most preferably 1.2 to 2.5.

Here, Mn is the number average molecular weight.

[Component (B')]

There is no particular limitation on the component (B') and there can be used those which have conventionally been proposed as the acid generator for a chemically amplified photoresist. Examples of the component (B') include the same as those exemplified above in connection with the explanation of the component (B) of the positive resist composition according to the first aspect of the present invention.

As the component (B'), one type may be used alone, or two or more types may be used in combination.

In the present invention, it is preferred to use, as the component (B'), an onium salt containing a fluorinated alkylsulfonic acid ion as an anion in combination with an onium salt containing general formula (b1-12) as an anion. It is preferred to use, as the onium salt containing general formula (b1-12) as an anion, compounds represented by formulas (b-12-1) to (b-12-18), and particularly the compound represented by formula (b-12-1).

The content of the component (B') in the first positive resist composition is 0.5 to 30 parts by weight, and preferably 1 to 10 parts by weight, based on 100 parts by weight of the component (A'). By making the content of the component (B') within the above-mentioned range, a pattern is satisfactorily formed. It is preferred since a uniform solution is obtained and storage stability is improved.

[Component (D')]

In the resist composition of the present invention, for improving the resist pattern shape and the post exposure stability of the latent image formed by the pattern-wise exposure of the resist layer, at least one compound (D') (hereafter referred to as the component (D')) can be added as an arbitrary component.

The component (D') can be selected appropriately from the multitude of known compounds. Examples of the component (D') include the same as those exemplified above in connection with the explanation of the component (D) of the positive resist composition according to the first aspect of the present invention.

As the component (D'), one type may be used alone, or two or more types may be used in combination.

The component (D') is typically used in an amount within a range from 0.01 to 5.0 parts by weight based on 100 parts by weight of the component (A').

[Component (E')]

In the first resist composition of the present invention, for preventing any deterioration in sensitivity, and improving the resist pattern shape and the post exposure stability of the latent image formed by the pattern-wise exposure of the resist layer, at least one compound (E') (hereafter referred to as the component (E')) selected from the group consisting of an organic carboxylic acid, or a phosphorus oxo acid or derivative thereof can be added as an arbitrary component.

The component (E') can be selected appropriately from the multitude of known compounds. Examples of the component (E') include the same as those exemplified above in connection with the explanation of the component (E) of the positive resist composition according to the first aspect of the present invention.

As the component (E'), one type may be used alone, or two or more types may be used in combination.

As the component (E'), an organic carboxylic acid is preferable, and salicylic acid is particularly desirable.

The component (E') is typically used in an amount within a range from 0.01 to 5.0 parts by weight based on 100 parts by weight of the component (A').

If desired, other miscible additives can also be added to the first resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S')]

The first positive resist composition can be prepared by dissolving a material in an organic solvent (hereinafter may be referred to as the component (S')).

The component (S') is not particularly limited as long as it can dissolve components to be used to form a uniform solution and there can be used one or more types of arbitrary solvents selected from conventionally known solvents for a chemically amplified photoresist. As the component (S'), the same as those exemplified above in connection with the explanation of the component (S3) of the positive resist composition can be used.

As the component (S'), one type may be used alone, or two or more types may be used in combination.

In the first positive resist composition, propylene glycol monomethyl ether acetate (PGMEA), propylene glycol monomethyl ether (PGME), and ethyl lactate (EL) are preferable as the component (S').

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S'), a mixed solvent of at least one of PGMEA and EL with γ-butyrolactone is also preferable. The mixing ratio (former:latter) of such a mixed solvent is preferably from 70:30 to 95:5.

The amount of the component (S') is not particularly limited, and is appropriately adjusted to a concentration which enables coating of a coating solution of a first positive resist composition to a substrate.

EXAMPLES

As follows is a description of examples of the present invention, although the scope of the present invention is by no way limited by these examples.

Copolymers (A)-11 to 12, 21 to 28, 28-1, 27-1, 27-2 and 31 to 37 were synthesized by copolymerizing monomers (1) to (8) shown below using a known drop polymerization method.

Mw and Mw/Mn of the copolymers (A)-11 to 12, 21 to 28, 28-1, 27-1, 27-2 and 31 to 37 were measured by gel permeation chromatography (GPC).

Numbers of the lower-right portion of parenthesis of formulas (A)-11 to 12, 21 to 28, 28-1, 27-1, 27-2 and 31 to 37 denote the amount of each structural unit (mol %).

[Chemical Formula 54]

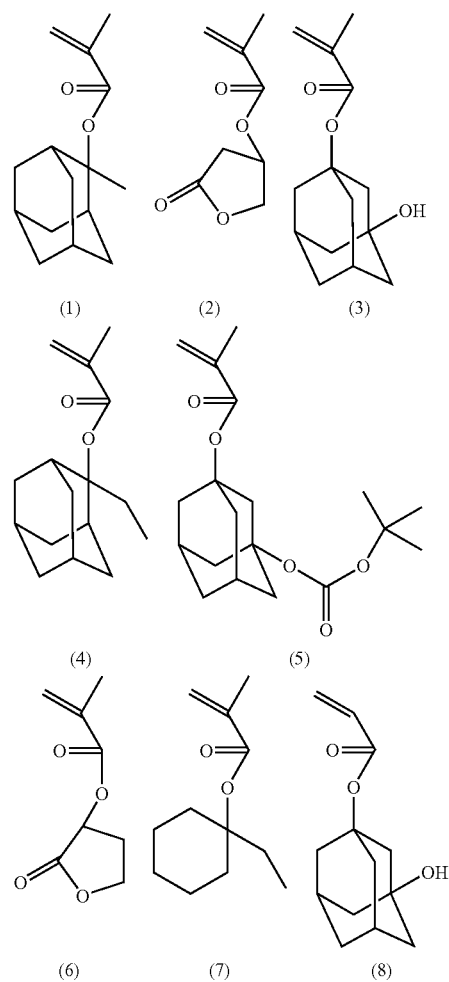

Synthesis Example 1:

Synthesis of Copolymer (A)-11

5.85 g of a monomer (1), 7.65 g of a monomer (2) and 7.08 g of a monomer (3) were dissolved in 95.03 g of methyl ethyl ketone. To the solution, 3.02 mmol of V-601 manufactured by Wako Pure Chemical Industries, Ltd. (polymerization initiator) was added and dissolved. The resulting solution was added dropwise to 3.00 g of methyl ethyl ketone heated to 75° C. under a nitrogen atmosphere over 6 hours. After completion of the dropwise addition, the reaction solution was stirred with heating for one hour and then the reaction solution was cooled to room temperature. Then, the operation of adding dropwise the reaction solution to a large amount of a methanol/water mixed solution thereby precipitating a reaction product was repeated three times. The reaction product thus obtained was dried under reduced pressure at room temperature to obtain a white powder. With respect to the resulting resin (A)-11, GPC measurement was conducted. As a result, the weight average molecular weight (Mw) was 7,000 and the dispersion degree (Mw/Mn) was 1.72.

[Chemical Formula 55]

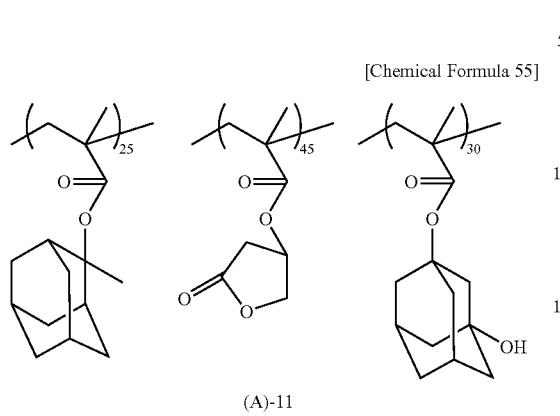

(A)-11

Copolymers (A)-12, (A)-21 to 28, 28-1, 27-1, 27-2 and 31 to 37 were synthesized in the same manner as in Synthesis Example 1.

[Chemical Formula 56]

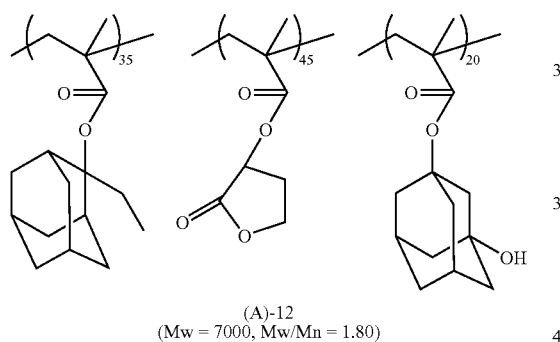

(A)-12
(Mw = 7000, Mw/Mn = 1.80)

[Chemical Formula 57]

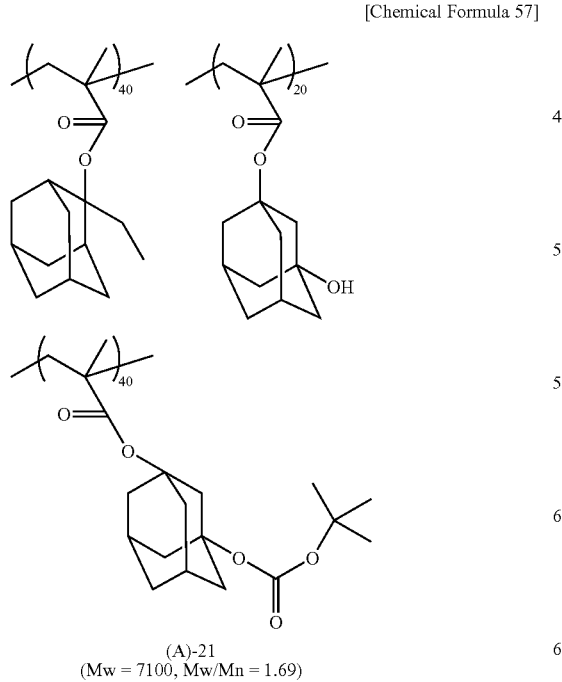

(A)-21
(Mw = 7100, Mw/Mn = 1.69)

[Chemical Formula 58]

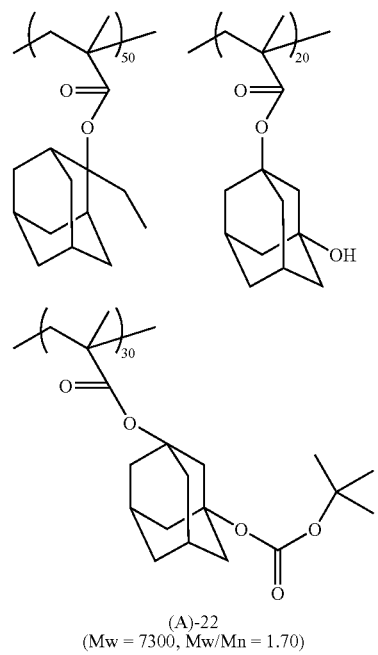

(A)-22
(Mw = 7300, Mw/Mn = 1.70)

[Chemical Formula 59]

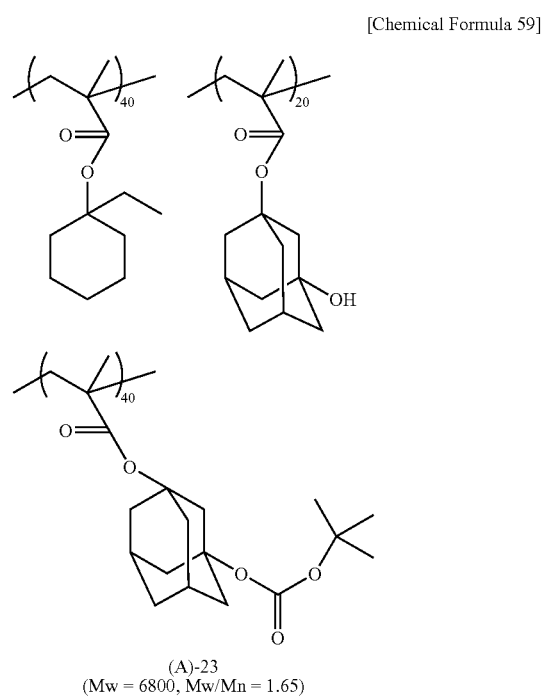

(A)-23
(Mw = 6800, Mw/Mn = 1.65)

[Chemical Formula 60]

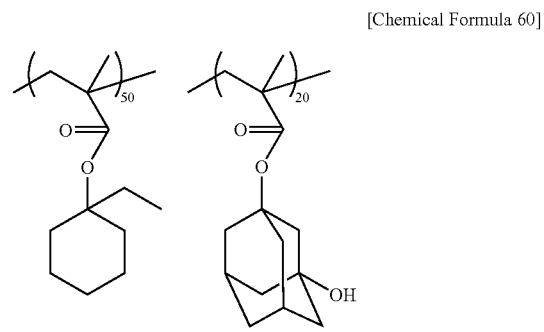

[Chemical Formula 61]
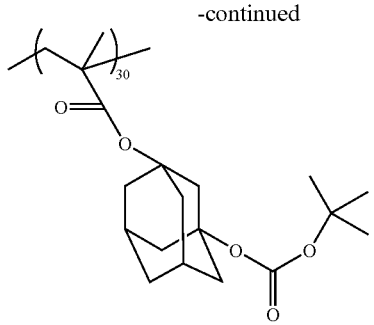
(A)-24
(Mw = 6900, Mw/Mn = 1.72)
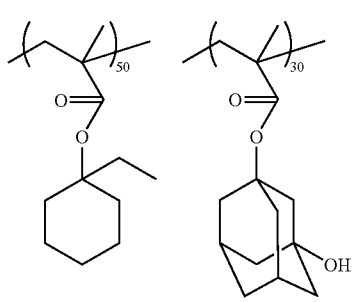
(A)-25
(Mw = 7200, Mw/Mn = 1.70)
[Chemical Formula 62]
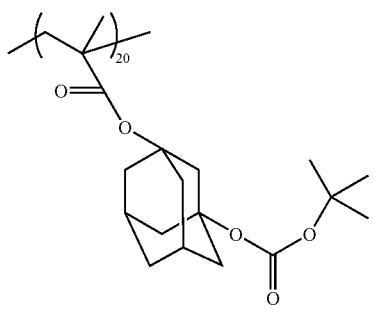
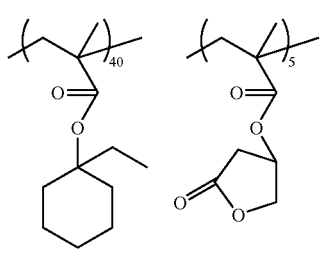
(A)-26
(Mw = 7200, Mw/Mn = 1.71)
[Chemical Formula 63]
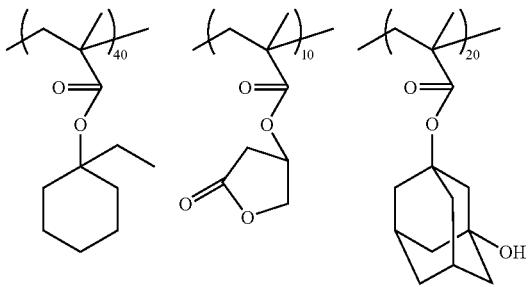
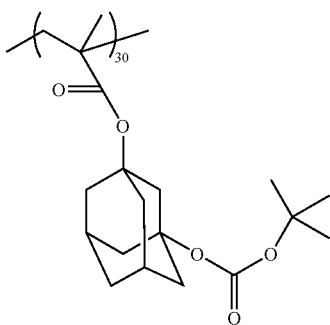
(A)-27
(Mw = 7100, Mw/Mn = 1.75)
[Chemical Formula 64]
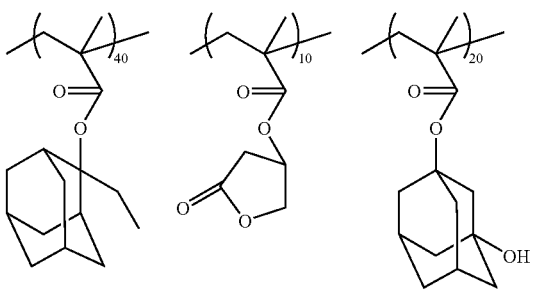
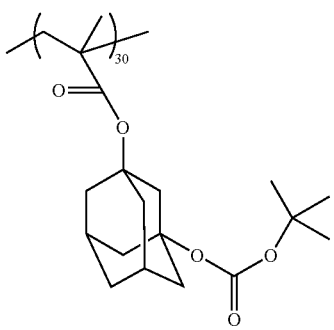
(A)-28
(Mw = 7200, Mw/Mn = 1.80)
[Chemical Formula 65]
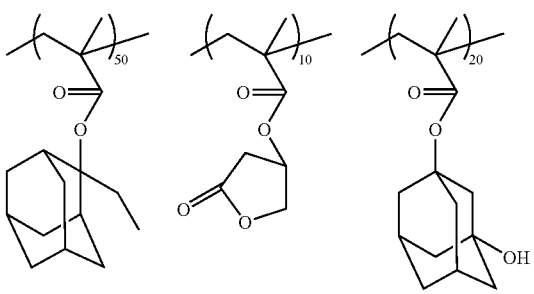

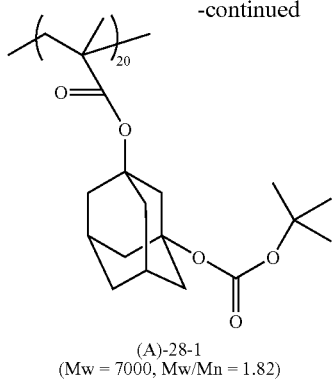
(A)-28-1
(Mw = 7000, Mw/Mn = 1.82)
[Chemical Formula 66]
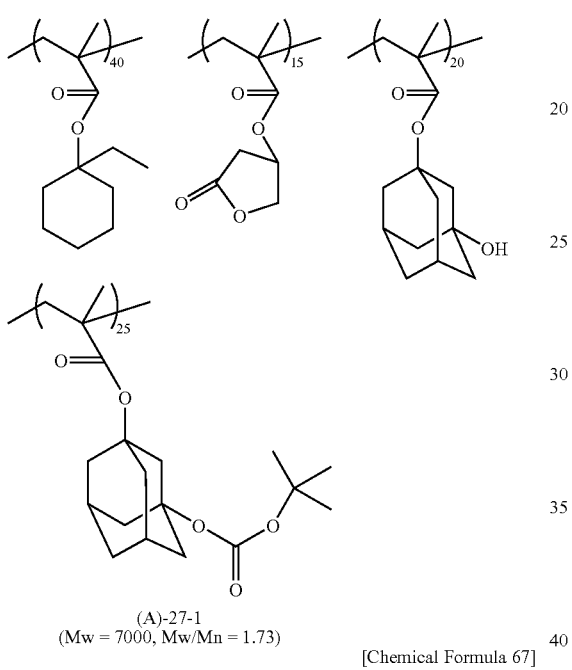
(A)-27-1
(Mw = 7000, Mw/Mn = 1.73)
[Chemical Formula 67]
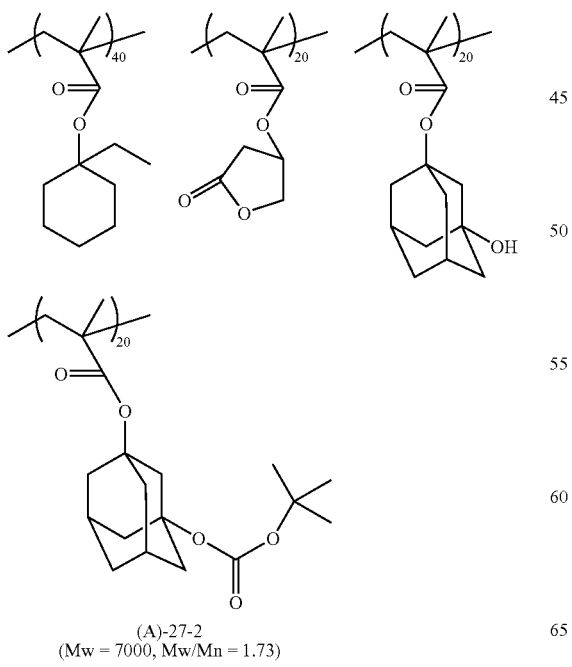
(A)-27-2
(Mw = 7000, Mw/Mn = 1.73)
[Chemical Formula 68]
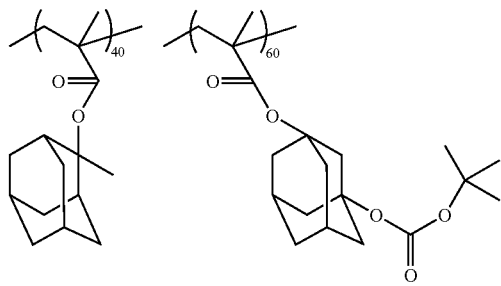
(A)-31
(Mw = 6500, Mw/Mn = 1.65)
[Chemical Formula 69]
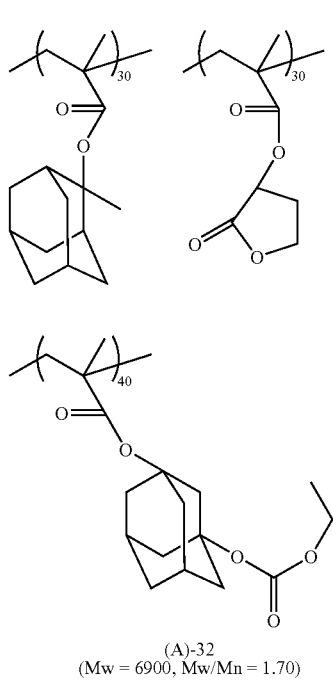
(A)-32
(Mw = 6900, Mw/Mn = 1.70)
[Chemical Formula 70]
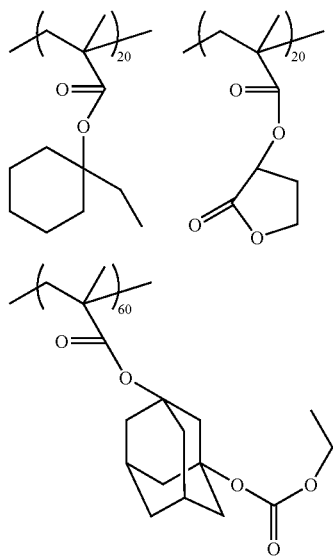
(A)-33
(Mw = 7000, Mw/Mn = 1.66)

-continued

[Chemical Formula 71]

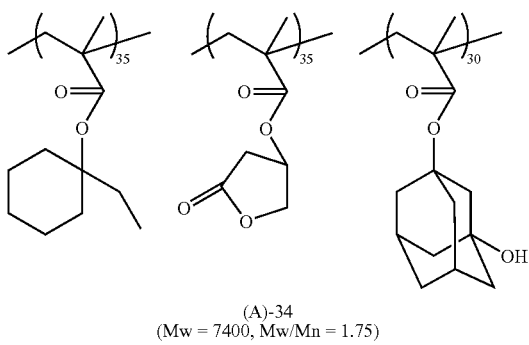

(A)-34
(Mw = 7400, Mw/Mn = 1.75)

[Chemical Formula 72]

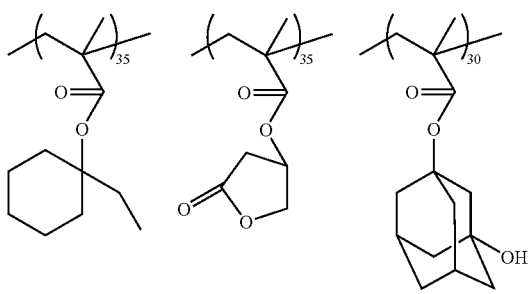

(A)-35
(Mw = 6900, Mw/Mn = 1.73)

[Chemical Formula 73]

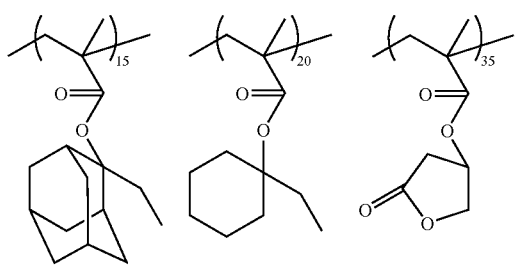

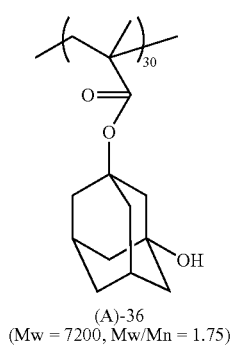

(A)-36
(Mw = 7200, Mw/Mn = 1.75)

[Chemical Formula 74]

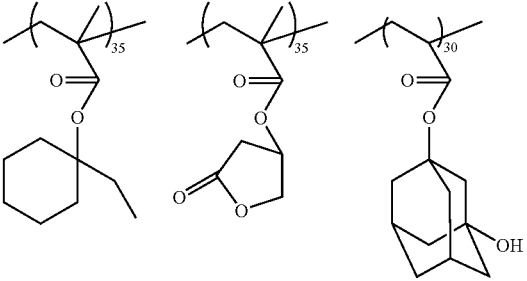

(A)-37
(Mw = 6500, Mw/Mn = 1.64)

<Study of Solubility of Copolymers (A)-11 to 12, 21 and 31 to 33 in Organic Solvent>

Copolymers (A)-11 to 12, 21 and 31 to 33 were respectively added to PGMEA, isobutanol (IBA), diisopentylether (DIAE) and 1,8-cineol (CNL) so as to obtain a 1% solution, followed by mixing, and then it was confirmed whether or not the copolymers are dissolved. The results are shown in Table 1. The symbols "A" and "C" respectively denote "dissolved" and "not dissolved". Although all copolymers were dissolved in PGMEA, only the copolymer (A)-21 having a structural unit (a0-1) represented by general formula (a0-1) and a structural unit (a0-2) represented by general formula (a0-2) was dissolved in isobutanol. Similarly, only the copolymer (A)-31 was dissolved in diisopentylether. On the other hand, four types of copolymers other than copolymers (A)-11 to (A)-12 were dissolved in 1,8-cineol.

As is apparent from the results, the solubility of the positive resist composition in an alcohol-based organic solvent is improved by inclusion of structural units (a0-1) and (a0-2).

TABLE 1

|  | PGMEA | IBA | DIAE | CNL |
| --- | --- | --- | --- | --- |
| Copolymer (A)-11 | A | C | C | C |
| Copolymer (A)-12 | A | C | C | C |
| Copolymer (A)-21 | A | A | C | A |
| Copolymer (A)-31 | A | C | A | A |
| Copolymer (A)-32 | A | C | C | A |
| Copolymer (A)-33 | A | C | C | A |

<Study of Solubility of Copolymers (A)-11 to 12, 21 to 28, 28-1, 27-1, 27-2 and 34 to 37 in Isobutanol and 4-Methyl-2-Pentanol>

To 0.1 g of each resin powder of copolymers (A)-11 to 12, 21 to 28, 28-1, 27-1, 27-2 and 34 to 37, 0.1 g of isobutanol was added so as to obtain a 50% solution, followed by mixing, and then it was confirmed whether or not the copolymers are dissolved. When the copolymers were not dissolved, 0.2 g of isobutanol was further added so as to obtain a 25% solution, and then it was confirmed whether or not the copolymers are dissolved. When the copolymers were not dissolved, 0.6 g of isobutanol was further added so as to obtain a 10% solution, and then it was confirmed whether or not the copolymers are dissolved. When the copolymers were not dissolved, 1.0 g of isobutanol was further added so as to obtain a 5% solution, and then it was confirmed whether or not the copolymers are dissolved. When the copolymers were not dissolved, 3.0 g of isobutanol was further added so as to obtain a 2% solution, and then it was confirmed whether or not the copolymers are dissolved. When the copolymers were not dissolved, 5.0 g of isobutanol was further added so as to obtain a 1% solution, and then it was confirmed whether or not the copolymers are dissolved. The results are shown in Table 2. In Table 2, the symbol "A" or "C" has the same meaning as in Table 1. As a result, it was confirmed that all copolymers (A)-11 to 12 and 34 to 37 are not dissolved in isobutanol for all the concentrations. On the other hand, it was found that the solubility of copolymers (A)-21 to 28, 28-1, 27-1 and 27-2 in isobutanol increases as the concentration of the solution decreases and that all copolymers are dissolved in isobutanol in the case of a 2% solution.

Similarly, the solubility of copolymers (A)-28 and in 4-methyl-2-pentanol was evaluated. As a result, it was confirmed that both copolymers (A)-28 and 28-1 are dissolved in 4-methyl-2-pentanol in the case of a 2% solution.

TABLE 2

| Concentration | 1% | 2% | 5% | 10% | 25% | 50% |
|---|---|---|---|---|---|---|
| (Solubility in isobutanol) | | | | | | |
| Copolymer (A)-11 | C | C | C | C | C | C |
| Copolymer (A)-12 | C | C | C | C | C | C |
| Copolymer (A)-21 | A | A | A | C | C | C |
| Copolymer (A)-22 | A | A | C | C | C | C |
| Copolymer (A)-23 | A | A | A | A | C | C |
| Copolymer (A)-24 | A | A | A | A | A | C |
| Copolymer (A)-25 | A | A | A | A | C | C |
| Copolymer (A)-26 | A | A | A | C | C | C |
| Copolymer (A)-27 | A | A | A | C | C | C |
| Copolymer (A)-28 | A | A | C | C | C | C |
| Copolymer (A)-28-1 | A | A | A | C | C | C |
| Copolymer (A)-27-1 | A | A | C | C | C | C |
| Copolymer (A)-27-2 | A | A | C | C | C | C |
| Copolymer (A)-34 | C | C | C | C | C | C |
| Copolymer (A)-35 | C | C | C | C | C | C |
| Copolymer (A)-36 | C | C | C | C | C | C |
| Copolymer (A)-37 | C | C | C | C | C | C |
| (Solubility in 4-methyl-2-pentanol) | | | | | | |
| Copolymer (A)-28 | A | A | C | C | C | C |
| Copolymer (A)-28-1 | A | A | A | C | C | C |

<Preparation of Positive Resist Composition>

Components shown in Table 3 and Table 4 were mixed and then dissolved to prepare positive resist composition solutions.

TABLE 3

| | (A) Component | (B) Component | | (D) Component | (E) Component | (S) Component |
|---|---|---|---|---|---|---|
| Resist composition 1-1 | (A)-11 [100] | (B)-1 [1.00] | (B)-2 [7.00] | (D)-1 [0.97] | (E)-1 [1.32] | (S)-1 [2700] |
| Resist composition 1-2 | (A)-11 [100] | (B)-4 [8.0] | | (D)-1 [1.2] | | (S)-1 [2700] |
| Resist composition 1-3 | (A)-12 [100] | (B)-4 [8.0] | | (D)-1 [1.2] | | (S)-1 [2700] |
| Resist composition 2-1 | (A)-21 [100] | (B)-3 [10.0] | | (D)-2 [0.10] | | (S)-4 [3700] |
| Resist composition 2-2 | (A)-22 [100] | (B)-3 [10.0] | | (D)-2 [0.10] | | (S)-4 [3700] |
| Resist composition 2-3 | (A)-24 [100] | (B)-3 [10.0] | | (D)-2 [0.10] | | (S)-4 [3700] |
| Resist composition 2-4 | (A)-27 [100] | (B)-3 [10.0] | | (D)-2 [0.10] | | (S)-4 [3700] |
| Resist composition 2-5 | (A)-27 [100] | (B)-3 [5.0] | (B)-1 [4.0] | (D)-2 [0.10] | | (S)-4 [3700] |
| Resist composition 2-6 | (A)-27 [100] | (B)-3 [10.0] | | (D)-2 [0.15] | | (S)-4 [3700] |
| Resist composition 2-7 | (A)-28 [100] | (B)-3 [10.0] | | (D)-2 [0.15] | | (S)-4 [3700] |
| Resist composition 2-8 | (A)-27-1 [100] | (B)-3 [10.0] | | (D)-2 [0.15] | | (S)-4 [3700] |
| Resist composition 2-9 | (A)-27-2 [100] | (B)-3 [10.0] | | (D)-2 [0.15] | | (S)-4 [3700] |
| Resist composition 2-10 | (A)-27 [100] | (B)-3 [10.0] | | (D)-2 [0.15] | | (S)-5 [3700] |
| Resist composition 2-11 | (A)-28 [100] | (B)-3 [7.0] | (B)-5 [7.0] | (D)-2 [0.25] | | (S)-4 [3700] |
| Resist composition 2-12 | (A)-28 [100] | (B)-3 [7.0] | | (D)-2 [0.15] | | (S)-4 [3700] |
| Resist composition 2-13 | (A)-27-2 [100] | (B)-3 [10.0] | | (D)-2 [0.45] | | (S)-4 [3700] |
| Resist composition 2-14 | (A)-27-2 [100] | (B)-3 [13.0] | | (D)-2 [0.45] | | (S)-4 [3700] |
| Resist composition 2-15 | (A)-27-2 [100] | (B)-3 [13.0] | (B)-6 [1.0] | | | (S)-4 [3700] |
| Resist composition 2-16 | (A)-28 [100] | (B)-3 [7.0] | (B)-5 [10.0] | (D)-2 [0.35] | | (S)-4 [3700] |
| Resist composition 2-17 | (A)-28 [100] | (B)-3 [4.0] | (B)-7 [5.0] | (D)-2 [0.15] | | (S)-4 [3700] |
| Resist composition 2-18 | (A)-28 [100] | (B)-3 [7.0] | (B)-7 [6.0] | (D)-2 [0.35] | | (S)-4 [3700] |
| Resist composition 2-19 | (A)-28 [100] | (B)-8 [15.0] | | (D)-2 [0.35] | | (S)-4 [3700] |
| Resist composition 2-20 | (A)-28 [100] | (B)-9 [15.0] | | (D)-2 [0.35] | | (S)-4 [3700] |

TABLE 3-continued

|  | (A) Component | (B) Component | (D) Component | (E) Component | (S) Component |
|---|---|---|---|---|---|
| Resist composition 2-21 | (A)-28-1 [100] | (B)-8 [15.0] | (D)-2 [0.35] |  | (S)-4 [3700] |
| Resist composition 2-22 | (A)-28-1 [100] | (B)-8 [15.0] | (D)-2 [0.35] |  | (S)-5 [3700] |

TABLE 4

|  | (A) Component | (B) Component | | (D) Component | (E) Component | (S) Component |
|---|---|---|---|---|---|---|
| Resist composition 3-1 | (A)-21 [100] | (B)-3 [10.0] |  | (D)-2 [0.10] |  | (S)-1 [2700] |
| Resist composition 3-2 | (A)-22 [100] | (B)-3 [10.0] |  | (D)-2 [0.10] |  | (S)-1 [2700] |
| Resist composition 3-3 | (A)-24 [100] | (B)-3 [10.0] |  | (D)-2 [0.10] |  | (S)-1 [2700] |
| Resist composition 3-4 | (A)-27 [100] | (B)-3 [10.0] |  | (D)-2 [0.10] |  | (S)-1 [2700] |
| Resist composition 3-5 | (A)-27 [100] | (B)-3 [5.0] | (B)-1 [4.0] | (D)-2 [0.10] |  | (S)-1 [2700] |
| Resist composition 4-1 | (A)-21 [100] | (B)-3 [10.0] |  | (D)-2 [0.10] |  | (S)-2 [2700] |
| Resist composition 4-2 | (A)-22 [100] | (B)-3 [10.0] |  | (D)-2 [0.10] |  | (S)-2 [2700] |
| Resist composition 4-3 | (A)-24 [100] | (B)-3 [10.0] |  | (D)-2 [0.10] |  | (S)-2 [2700] |
| Resist composition 4-4 | (A)-27 [100] | (B)-3 [10.0] |  | (D)-2 [0.10] |  | (S)-2 [2700] |
| Resist composition 4-5 | (A)-27 [100] | (B)-3 [5.0] | (B)-1 [4.0] | (D)-2 [0.10] |  | (S)-2 [2700] |
| Resist composition 5-1 | (A)-21 [100] | (B)-3 [10.0] |  | (D)-2 [0.10] |  | (S)-3 [2700] |
| Resist composition 5-2 | (A)-22 [100] | (B)-3 [10.0] |  | (D)-2 [0.10] |  | (S)-3 [2700] |
| Resist composition 5-3 | (A)-24 [100] | (B)-3 [10.0] |  | (D)-2 [0.10] |  | (S)-3 [2700] |
| Resist composition 5-4 | (A)-27 [100] | (B)-3 [10.0] |  | (D)-2 [0.10] |  | (S)-3 [2700] |
| Resist composition 5-5 | (A)-27 [100] | (B)-3 [5.0] | (B)-1 [4.0] | (D)-2 [0.10] |  | (S)-3 [2700] |

Abbreviations in Table 3 and Table 4 have meanings shown below. Numerical values in the parenthesis are amounts (parts by weight).

(A)-11: Polymer compound represented by formula (A)-11 shown above
(A)-21: Polymer compound represented by formula (A)-21 shown above
(A)-22: Polymer compound represented by formula (A)-22 shown above
(A)-24: Polymer compound represented by formula (A)-24 shown above
(A)-27: Polymer compound represented by formula (A)-27 shown above
(A)-28: Polymer compound represented by formula (A)-28 shown above
(A)-28-1: Polymer compound represented by formula (A)-28-1 shown above
(A)-27-1: Polymer compound represented by formula (A)-27-1 shown above
(A)-27-2: Polymer compound represented by formula (A)-27-2 shown above
(B)-1: Triphenylsulfonium heptafluoro-n-propanesulfonate
(B)-2: Acid generator represented by chemical formula (b-12-1) shown above
(B)-3: Triphenylsulfonium trifluoromethanesulfonate
(B)-4: 4-methylphenyldiphenylsulfonium nonafluoro-n-butanesulfonate
(B)-5: Acid generator represented by chemical formula (B)-5 shown below
(B)-6: Acid generator represented by chemical formula (B)-6 shown below
(B)-7: 4-methylphenyldiphenylsulfonium trifluoromethanesulfonate
(B)-8: Acid generator represented by chemical formula (B)-8 shown below
(B)-9: Acid generator represented by chemical formula (B)-9 shown below

[Chemical Formula 75]

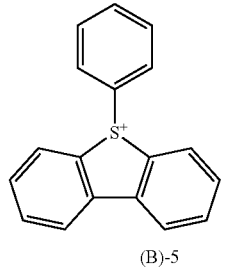

(B)-5

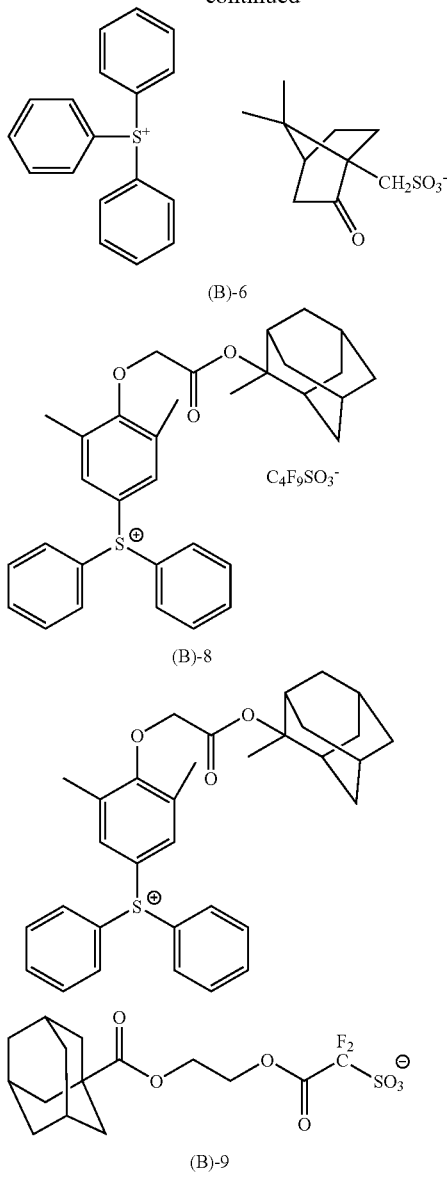

(B)-6

(B)-8

(B)-9

(D)-1: Tri-n-pentylamine
(D)-2: Triethanolamine
(E)-1: Salicylic acid
(S)-1: Mixed solvent of PGMEA/PGME=6/4 (weight ratio)
(S)-2: PGMEA
(S)-3: PGME
(S)-4: Isobutanol
(S)-5: 4-methyl-2-pentanol <Formation of Resist Pattern by Double Patterning>

As described in Table 5 and Table 6 shown below, resist compositions obtained in Table 3 and Table 4 were used as a positive resist composition which forms a first resist film and a positive resist composition which forms a second resist film were respectively used, and then a resist pattern was formed by a double patterning process. In Table 5 and Table 6, "first resist film" means a positive resist composition which forms a first resist film and "second resist film" means a positive resist composition which forms a second resist film, respectively.

An organic anti-reflection film composition (product name: ARC29A, manufactured by Brewer Science Ltd.) was applied on an 8-inch silicon wafer using a spinner, and the composition was then baked at 205° C. for 60 seconds, thereby forming an organic anti-reflection film having a film thickness of 77 nm.

Then, a positive resist composition capable of forming a first resist film was applied on the organic anti-reflection film using a spinner, and was then prebaked (PAB) on a hotplate at 110° C. for 60 seconds in Examples 1 to 5 and Comparative Examples 1 to 15, or at 90° C. for 60 seconds in Examples 6 to 22, and dried, thereby forming a resist film having a film thickness of 120 nm (first resist film).

Thereafter, using an ArF exposure apparatus (product name: NSR-S302, manufactured by Nikon Corporation, NA (numerical aperture)=0.60, ⅔ annular illumination), the first resist film was selectively irradiated with an ArF excimer laser (193 nm) through a mask pattern (6% halftone). A post exposure bake (PEB) treatment was conducted at 110° C. for 60 seconds in Examples 1 to 5 and Comparative Examples 1 to 15, or a post exposure bake (PEB) treatment was conducted at 90° C. for 60 seconds in Examples 6 to 22, followed by development for 30 seconds at 23° C. in a 2.38% by weight aqueous solution of tetramethylammonium hydroxide (TMAH). Then, the resist film was rinsed for 30 seconds with pure water, followed by drying by shaking. As a result, in each of the examples, a line and space pattern (referred to as an L/S pattern) with a line width of 120 nm and a pitch of 480 nm was formed on the resist film. The optimum exposure dose (Eop, mJ/cm$^2$) (energy amount per unit area) with which a line and space pattern having a line width of 120 nm and a pitch of 480 nm are shown in Table 5 and Table 6.

Then, a positive resist composition capable of forming a second resist film was applied on the substrate on which the 1:3 L/S pattern was formed using a spinner, and was then prebaked (PAB) on a hotplate at 90° C. for 60 seconds and dried, thereby forming a positive resist film having a film thickness of 120 nm (second resist film).

Thereafter, using an ArF exposure apparatus (product name: NSR-S302B, manufactured by Nikon Corporation, NA (numerical aperture)=0.60, ⅔ annular illumination), the second resist film was selectively irradiated with an ArF excimer laser (193 nm) through a mask pattern (6% halftone). A post exposure bake (PEB) treatment was conducted at 90° C. for 60 seconds, followed by development for 30 seconds at 23° C. in a 2.38% by weight aqueous solution of tetramethylammonium hydroxide (TMAH). Then, the second resist film was rinsed for 30 seconds with pure water, followed by drying by shaking.

The exposure doses are shown in Table 5 and Table 6.

TABLE 5

| | Resist film | Resist composition | Exposure dose (mJ/cm$^2$) | Double patterning |
|---|---|---|---|---|
| Example 1 | First resist film | Resist composition 1-1 | 18.5 | A |
| | Second resist film | Resist composition 2-1 | 18.5 | |
| Example 2 | First resist film | Resist composition 1-2 | 18.5 | A |
| | Second resist film | Resist composition 2-2 | 23 | |

TABLE 5-continued

| | Resist film | Resist composition | Exposure dose (mJ/cm$^2$) | Double patterning |
|---|---|---|---|---|
| Example 3 | First resist film | Resist composition 1-2 | 18.5 | A |
| | Second resist film | Resist composition 2-3 | 16 | |
| Example 4 | First resist film | Resist composition 1-2 | 18.5 | A |
| | Second resist film | Resist composition 2-4 | 16 | |
| Example 5 | First resist film | Resist composition 1-2 | 18.5 | A |
| | Second resist film | Resist composition 2-5 | 18 | |
| Example 6 | First resist film | Resist composition 1-2 | 18.5 | A |
| | Second resist film | Resist composition 2-6 | 15.5 | |
| Example 7 | First resist film | Resist composition 1-2 | 18.5 | A |
| | Second resist film | Resist composition 2-7 | 14 | |
| Example 8 | First resist film | Resist composition 1-2 | 18.5 | A |
| | Second resist film | Resist composition 2-8 | 11 | |
| Example 9 | First resist film | Resist composition 1-2 | 18.5 | A |
| | Second resist film | Resist composition 2-9 | 6.5 | |
| Example 10 | First resist film | Resist composition 1-2 | 18.5 | A |
| | Second resist film | Resist composition 2-10 | 14 | |
| Example 11 | First resist film | Resist composition 1-2 | 18.5 | A |
| | Second resist film | Resist composition 2-11 | 20 | |
| Example 12 | First resist film | Resist composition 1-2 | 18.5 | A |
| | Second resist film | Resist composition 2-12 | 21.5 | |
| Example 13 | First resist film | Resist composition 1-2 | 18.5 | A |
| | Second resist film | Resist composition 2-13 | 11 | |
| Example 14 | First resist film | Resist composition 1-2 | 18.5 | A |
| | Second resist film | Resist composition 2-14 | 8 | |
| Example 15 | First resist film | Resist composition 1-2 | 18.5 | A |
| | Second resist film | Resist composition 2-15 | 6.5 | |
| Example 16 | First resist film | Resist composition 1-2 | 18.5 | A |
| | Second resist film | Resist composition 2-16 | 18.5 | |
| Example 17 | First resist film | Resist composition 1-2 | 18.5 | A |
| | Second resist film | Resist composition 2-17 | 12.5 | |
| Example 18 | First resist film | Resist composition 1-2 | 18.5 | A |
| | Second resist film | Resist composition 2-18 | 9.5 | |
| Example 19 | First resist film | Resist composition 1-2 | 18.5 | A |
| | Second resist film | Resist composition 2-19 | 20 | |
| Example 20 | First resist film | Resist composition 1-2 | 18.5 | A |
| | Second resist film | Resist composition 2-20 | 56 | |
| Example 21 | First resist film | Resist composition 1-3 | 17 | A |
| | Second resist film | Resist composition 2-21 | 14 | |
| Example 22 | First resist film | Resist composition 1-2 | 17 | A |
| | Second resist film | Resist composition 2-22 | 14 | |

TABLE 6

| | | | | |
|---|---|---|---|---|
| Comparative Example 1 | First resist film | Resist composition 1-2 | 18.5 | C |
| | Second resist film | Resist composition 3-1 | — | |
| Comparative Example 2 | First resist film | Resist composition 1-2 | 18.5 | C |
| | Second resist film | Resist composition 3-2 | — | |
| Comparative Example 3 | First resist film | Resist composition 1-2 | 18.5 | C |
| | Second resist film | Resist composition 3-3 | — | |
| Comparative Example 4 | First resist film | Resist composition 1-2 | 18.5 | C |
| | Second resist film | Resist composition 3-4 | — | |
| Comparative Example 5 | First resist film | Resist composition 1-2 | 18.5 | C |
| | Second resist film | Resist composition 3-5 | — | |
| Comparative Example 6 | First resist film | Resist composition 1-2 | 18.5 | C |
| | Second resist film | Resist composition 4-1 | — | |
| Comparative Example 7 | First resist film | Resist composition 1-2 | 18.5 | C |
| | Second resist film | Resist composition 4-2 | — | |
| Comparative Example 8 | First resist film | Resist composition 1-2 | 18.5 | C |
| | Second resist film | Resist composition 4-3 | — | |
| Comparative Example 9 | First resist film | Resist composition 1-2 | 18.5 | C |
| | Second resist film | Resist composition 4-4 | — | |
| Comparative Example 10 | First resist film | Resist composition 1-2 | 18.5 | C |
| | Second resist film | Resist composition 4-5 | — | |
| Comparative Example 11 | First resist film | Resist composition 1-2 | 18.5 | C |
| | Second resist film | Resist composition 5-1 | — | |
| Comparative Example 12 | First resist film | Resist composition 1-2 | 18.5 | C |
| | Second resist film | Resist composition 5-2 | — | |
| Comparative Example 13 | First resist film | Resist composition 1-2 | 18.5 | C |
| | Second resist film | Resist composition 5-3 | — | |
| Comparative Example 14 | First resist film | Resist composition 1-2 | 18.5 | C |
| | Second resist film | Resist composition 5-4 | — | |
| Comparative Example 15 | First resist film | Resist composition 1-2 | 18.5 | C |
| | Second resist film | Resist composition 5-5 | — | |

The results of the double patterning are shown in Table 5 and Table 6. In the tables, the symbol "A" denotes that there could be formed a pattern in which a line pattern with a line width of 120 nm coexists between lines of an L/S pattern with a line width of 120 nm and a pitch of 480 nm, while the symbol "C" denotes that there could not be formed a pattern. Namely, in Examples 1 to 22 using resist compositions 2-1 to 2-22 as the resist composition of the present invention as the positive resist composition capable of forming the second resist film, there could be formed a pattern in which a line pattern with a line width of 120 nm coexists between lines of an L/S pattern with a line width of 120 nm and a pitch of 480 nm. On the other hand, in Comparative Examples 1 to 15 using resist compositions 3-1 to 3-5, 4-1 to 4-5 and 5-1 to 5-5, a lower layer was dissolved and a pattern could not be formed.

As is apparent from these results, like the method for forming a resist pattern of the present invention, by using the positive resist composition of the present invention for formation of the second resist film, a resist pattern can be stably formed by double patterning without dissolving the first resist pattern formed on the substrate.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description but is only limited by the scope of the appended claims.

What is claimed is:

1. A method of forming a resist pattern, comprising: applying a first positive resist composition on a substrate to form a first resist film on the substrate;
   selectively exposing said first resist film and alkali-developing said first resist film to form a first resist pattern; applying a second positive resist composition on said substrate on which said first resist pattern is formed to form a second resist film; and
   selectively exposing said second resist film and alkali-developing said second resist film to form a resist pattern, wherein
   said second positive resist composition is a positive resist composition comprising a resin component (A) which exhibits increased solubility in an alkali developing solution under action of acid, an acid-generator component (B) which generates acid upon exposure, and an organic solvent (S), said resin component (A) and said acid-generator component (B) being dissolved in the organic solvent (S), and
   said organic solvent (S) is an organic solvent which does not dissolve said first resist film; and said resin component (A) has a structural unit (a0-1) represented by general formula (a0-1) shown below and a structural unit (a0-2) represented by general formula (a0-2) shown below:

[Chemical Formula 1]

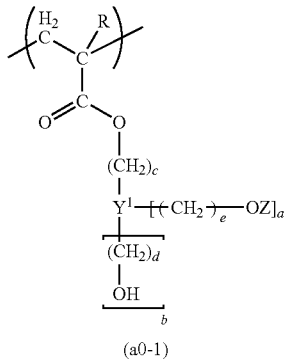
(a0-1)

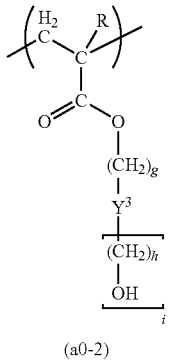
(a0-2)

wherein R represents a hydrogen atom, a lower alkyl group or a halogenated lower alkyl group; $Y^1$ represents an aliphatic cyclic group; Z represents a tertiary alkyl group-containing group or an alkoxyalkyl group; a represents an integer of 1 to 3; b represents an integer of 0 to 2 and a+b=1 to 3; c, d and e each independently represents an integer of 0 to 3; and
   wherein R represents a hydrogen atom, a lower alkyl group or a halogenated lower alkyl group;
   $Y^3$ represents an alkylene group or an aliphatic cyclic group; g and h each independently represents an integer of 0 to 3; and i represents an integer of 1 to 3.

2. The method of forming a resist pattern according to claim 1, wherein said organic solvent (S) is an alcohol-based organic solvent.

3. The method of forming a resist pattern according to claim 1, wherein the amount of the structural unit (a0-1) based on the combined total of all structural units constituting the resin component (A) is 1 to 40 mol %.

4. The method of forming a resist pattern according to claim 1, wherein said resin component (A) further includes a structural unit (a1) derived from an acrylate ester containing an acid dissociable, dissolution inhibiting group.

5. The method of forming a resist pattern according to claim 1, wherein said second positive resist composition further comprises a nitrogen-containing organic compound (D).

* * * * *

UNITED STATES PATENT AND TRADEMARK OFFICE
CERTIFICATE OF CORRECTION

| | |
|---|---|
| PATENT NO. | : 7,968,276 B2 |
| APPLICATION NO. | : 12/351759 |
| DATED | : June 28, 2011 |
| INVENTOR(S) | : Masaru Takeshita |

It is certified that error appears in the above-identified patent and that said Letters Patent is hereby corrected as shown below:

At Cover Page (Item 56), Column 1, Line 5, Under Other Publications, change "Lithograhy" to --Lithography--.

At Column 1, Line 25, Change "nanoinprinting" to --nanoimprinting--.

At Column 4, Line 48, After "aromaticity" insert --.--.

At Column 14, Line 20, Change "$R^{2'}$," to --$R^{2'}$--.

At Column 14, Line 25, Change "2 ," to --2,--.

At Column 14, Line 26, Change "$R^{1'}$," to --$R^{1'}$--.

At Column 14, Line 28, Change "$R^{1'}$," to --$R^{1'}$--.

At Column 14, Line 32, Change "$R^{1'}$, and $R^{2'}$," to --$R^{1'}$ and $R^{2'}$--.

At Column 17, Line 42, Change "$R^{1'}$, $R^2$," to --$R^{1'}$, $R^{2'}$,--.

At Column 17, Line 42, Change "$R^1$, $R^2$," to --$R^{1'}$, $R^{2'}$,--.

At Column 52, Line 52, Change "(a2-3-1 )," to --(a2-3-1),--.

At Column 53, Line 66, Change "1 to 5 ;" to --1 to 5;--.

At column 54, Line 6, Change "norbonyl" to --norbornyl--.

At Column 54, Line 9, Change "norbonyl" to --norbornyl--.

Signed and Sealed this
Fourteenth Day of February, 2012

David J. Kappos
*Director of the United States Patent and Trademark Office*

CERTIFICATE OF CORRECTION (continued)
U.S. Pat. No. 7,968,276 B2

At Column 54, Line 10, Change "norbonyl" to --norbornyl--.

At Column 54, Line 14, Change "norbonyl" to --norbornyl--.

At Column 55, Line 49, Change "fours" to --four--.

At Column 63, Line 37-38, Change "–$CF_2CF(CF_3)CF_2$–$CF(CF_3)CF(CF_3)$–," to -- –$CF_2CF(CF_3)CF_2$–$CF(CF_3)CF(CF_3)$–,--.

At Column 63, Line 40, Change "–$CH_2CH_2CF_2$–$CH_2CF_2CF_2$–" to -- –$CH_2CH_2CF_2$–, –$CH_2CF_2CF_2$–,--.

At Column 63, Line 41, Change "--CH $(CF_2CF_3)$ –," to -- –$CH(CF_2CF_3)$–,--.

At Column 63, Line 46, Change "--C $(CH_3)_2$–," to -- –$C(CH_3)_2$–,--.

At Column 67, Line 66, Change "2 ," to --2,--.

At Column 68, Line 3, Change "2 ," to --2,--.

At Column 69, Line 63, Change "phenantryl" to --phenanthryl--.

At Column 70, Line 39, Change "(benzenesulfonyloxyimino) -2" to --(benzenesulfonyloxyimino)-2--.

At Column 74, Line 9, Change "(s1'-l)," to --(sl'-l),--.

At Column 78, Line 44, Change "as long at" to --as long as--.

At Column 82, Line 49, Change "norbonyl" to --norbornyl--.

At Column 82, Line 52, Change "norbonyl" to --norbornyl--.

At Column 82, Line 53, Change "norbonyl" to --norbornyl--.

At Column 82, Line 56, Change "norbonyl" to --norbornyl--.

At Column 83, Line 62, Change "–$C(CF_3)$ 2–OH" to -- –$C(CF_3)_2$–OH--.

At Column 85, Line 65, Change "27-2and" to --27-2 and--.

At Column 86, Line 2, Change "27-2and" to --27-2 and--.

At Column 86, Line 5, Change "27-2and" to --27-2 and--.

At Column 95, Line 12, Before "in" insert --28-1--.

At Column 102, Line 45, Change "2-1 to" to --2-1 to--.